(12) United States Patent
Yamazaki et al.

(10) Patent No.: US 10,141,337 B2
(45) Date of Patent: *Nov. 27, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Tetsuhiro Tanaka, Isehara (JP); Yoshinori Ieda, Fuchu (JP); Toshiyuki Miyamoto, Kanuma (JP); Masafumi Nomura, Tochigi (JP); Takashi Hamochi, Shimotsuga (JP); Kenichi Okazaki, Tochigi (JP); Mitsuhiro Ichijo, Zama (JP); Toshiya Endo, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/723,227

(22) Filed: Oct. 3, 2017

(65) Prior Publication Data
US 2018/0047753 A1  Feb. 15, 2018

Related U.S. Application Data

(63) Continuation of application No. 15/251,375, filed on Aug. 30, 2016, now Pat. No. 9,793,295, which is a
(Continued)

(30) Foreign Application Priority Data

Jul. 27, 2012 (JP) .................................. 2012-167614
Jul. 27, 2012 (JP) .................................. 2012-167615

(51) Int. Cl.
H01L 27/12 (2006.01)
H01L 27/06 (2006.01)
H01L 27/088 (2006.01)

(52) U.S. Cl.
CPC ...... *H01L 27/1207* (2013.01); *H01L 27/0688* (2013.01); *H01L 27/088* (2013.01); *H01L 27/1225* (2013.01)

(58) Field of Classification Search
CPC ............. H01L 27/1251; H01L 27/1214; H01L 27/1225; H01L 27/1207; H01L 27/088; H01L 27/0688
See application file for complete search history.

(56) References Cited

U.S. PATENT DOCUMENTS 5,528,032 A   6/1996   Uchiyama
5,731,856 A   3/1998   Kim et al.
(Continued)

FOREIGN PATENT DOCUMENTS

EP   1737044 A   12/2006
EP   2226847 A   9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
(Continued)

*Primary Examiner* — Latanya N Crawford
(74) *Attorney, Agent, or Firm* — Robinson Intellectual Property Law Office; Eric J. Robinson

(57) ABSTRACT

A nitride insulating film which prevents diffusion of hydrogen into an oxide semiconductor film in a transistor including an oxide semiconductor is provided. Further, a semi-
(Continued)

conductor device which has favorable electrical characteristics by using a transistor including a silicon semiconductor and a transistor including an oxide semiconductor is provided. Two nitride insulating films having different functions are provided between the transistor including a silicon semiconductor and the transistor including an oxide semiconductor. Specifically, a first nitride insulating film which contains hydrogen is provided over the transistor including a silicon semiconductor, and a second nitride insulating film which has a lower hydrogen content than the first nitride insulating film and functions as a barrier film against hydrogen is provided between the first nitride insulating film and the transistor including an oxide semiconductor.

19 Claims, 26 Drawing Sheets

Related U.S. Application Data continuation of application No. 13/947,724, filed on Jul. 22, 2013, now Pat. No. 9,437,594.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,274,038 | B2 | 9/2007 | Maekawa et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,426,008 | B2 | 9/2008 | Yamazaki et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,638,806 | B2 | 12/2009 | Morita et al. |
| 7,674,650 | B2 | 3/2010 | Akimoto et al. |
| 7,732,819 | B2 | 6/2010 | Akimoto et al. |
| 7,948,062 | B2 | 5/2011 | Makiyama et al. |
| 8,227,805 | B2 | 7/2012 | Maekawa et al. |
| 8,415,731 | B2 | 4/2013 | Yamazaki et al. |
| 8,416,622 | B2 | 4/2013 | Kamata |
| 8,440,510 | B2 | 5/2013 | Yamazaki |
| 8,455,868 | B2 | 6/2013 | Yamazaki et al. |
| 8,535,965 | B2 | 9/2013 | Maekawa et al. |
| 8,634,050 | B2 | 1/2014 | Yamazaki et al. |
| 8,692,243 | B2 | 4/2014 | Kamata et al. |
| 9,349,735 | B2 | 5/2016 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2004/0233374 | A1 | 11/2004 | Yamazaki et al. |
| 2005/0017302 | A1 | 1/2005 | Hoffman |
| 2005/0199959 | A1 | 9/2005 | Chiang et al. |
| 2005/0263775 | A1 | 12/2005 | Ikeda et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0050941 | A1 | 2/2009 | Yamazaki et al. |
| 2009/0068773 | A1 | 3/2009 | Lai et al. |
| 2009/0073325 | A1 | 3/2009 | Kuwabara et al. |
| 2009/0079000 | A1 | 3/2009 | Yamazaki et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0044752 | A1 | 2/2010 | Marui |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0089417 | A1 | 4/2011 | Yamazaki et al. |
| 2011/0133180 | A1 | 6/2011 | Yamazaki |
| 2011/0140099 | A1 | 6/2011 | Yamazaki |
| 2011/0156022 | A1 | 6/2011 | Yamazaki et al. |
| 2011/0168993 | A1 | 7/2011 | Jeon et al. |
| 2011/0175087 | A1 | 7/2011 | Yamazaki et al. |
| 2012/0153442 | A1 | 6/2012 | Honda et al. |
| 2013/0203214 | A1 | 8/2013 | Isobe et al. |
| 2013/0207112 | A1 | 8/2013 | Isobe et al. |
| 2013/0334533 | A1 | 12/2013 | Yamazaki |
| 2014/0001468 | A1 | 1/2014 | Yamazaki et al. |
| 2014/0027764 | A1 | 1/2014 | Yamazaki et al. |
| 2014/0042436 | A1 | 2/2014 | Yamazaki |

(56) References Cited

U.S. PATENT DOCUMENTS

| | | | |
|---|---|---|---|
| 2014/0132908 | A1 | 5/2014 | Yamazaki et al. |
| 2014/0167041 | A1 | 6/2014 | Yamazaki et al. |
| 2014/0312342 | A1 | 10/2014 | Yamazaki |
| 2016/0260718 | A1 | 9/2016 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 02-109359 | A | 4/1990 |
| JP | 05-251705 | A | 9/1993 |
| JP | 06-275697 | A | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2004-295109 | A | 10/2004 |
| JP | 2005-039262 | A | 2/2005 |
| JP | 2007-096055 | A | 4/2007 |
| JP | 2007-123861 | A | 5/2007 |
| JP | 2008-085251 | A | 4/2008 |
| JP | 2009-135350 | A | 6/2009 |
| JP | 2009-164300 | A | 7/2009 |
| JP | 2010-050347 | A | 3/2010 |
| JP | 2011-109079 | A | 6/2011 |
| JP | 2011-151383 | A | 8/2011 |
| JP | 2011-210780 | A | 10/2011 |
| JP | 2011-243959 | A | 12/2011 |
| JP | 2011-258939 | A | 12/2011 |
| JP | 2012-003832 | A | 1/2012 |
| TW | 200500752 | | 1/2005 |
| TW | 200903088 | | 1/2009 |
| TW | 201030176 | | 8/2010 |
| TW | 201135914 | | 10/2011 |
| TW | 201143029 | | 12/2011 |
| WO | WO-2004/114391 | | 12/2004 |
| WO | WO-2011/048929 | | 4/2011 |
| WO | WO-2011/077967 | | 6/2011 |
| WO | WO-2011/090037 | | 7/2011 |
| WO | WO-2011/142467 | | 11/2011 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2)_3(ZnO)_m$ (m=7, 8, 9, and 16) in the $In_2O_3$—$ZnGa_2O_4$—$ZnO$ System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.

Tsuda,K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Lettes, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", Iow '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphouse In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", Iow '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B'(Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Benoit.D et al., "Hydrogen desorption and diffusion in PECVD silicon nitride, Application to passivation of CMOS active pixel seasons", Microelectronic Engineering, 2007, vol. 84, pp. 2169-2172, Elsevier.

Taiwanese Office Action (Application No. 102126104) dated Nov. 10, 2016.

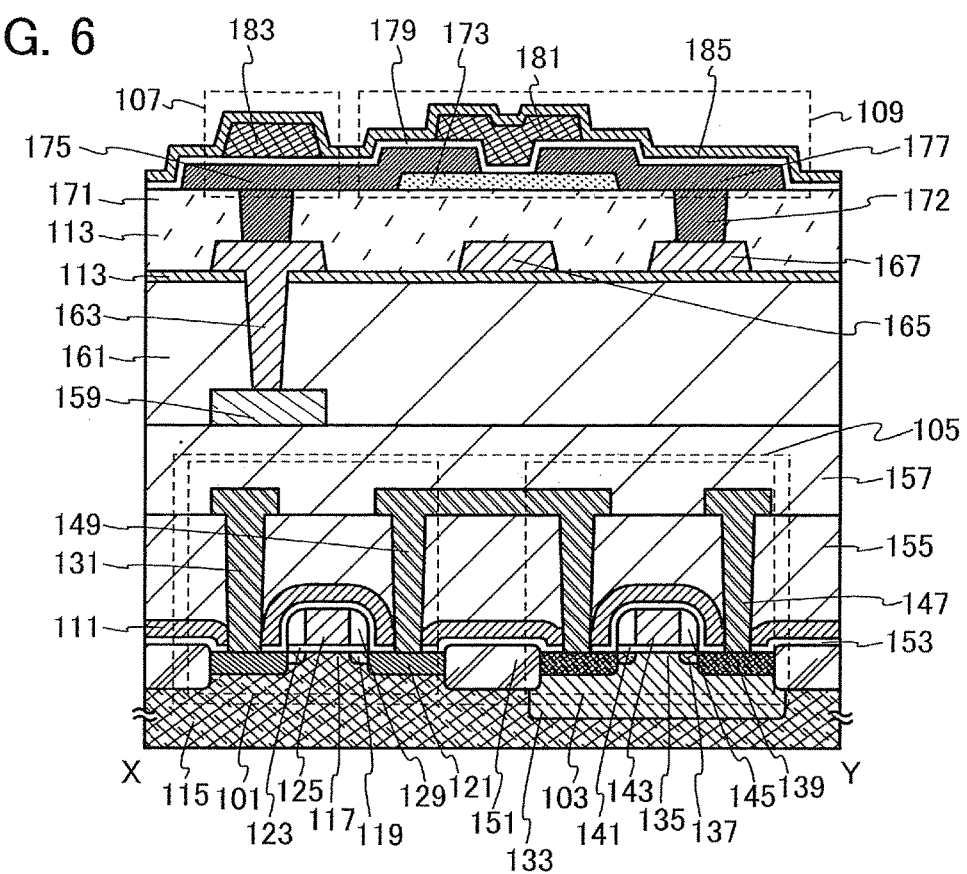

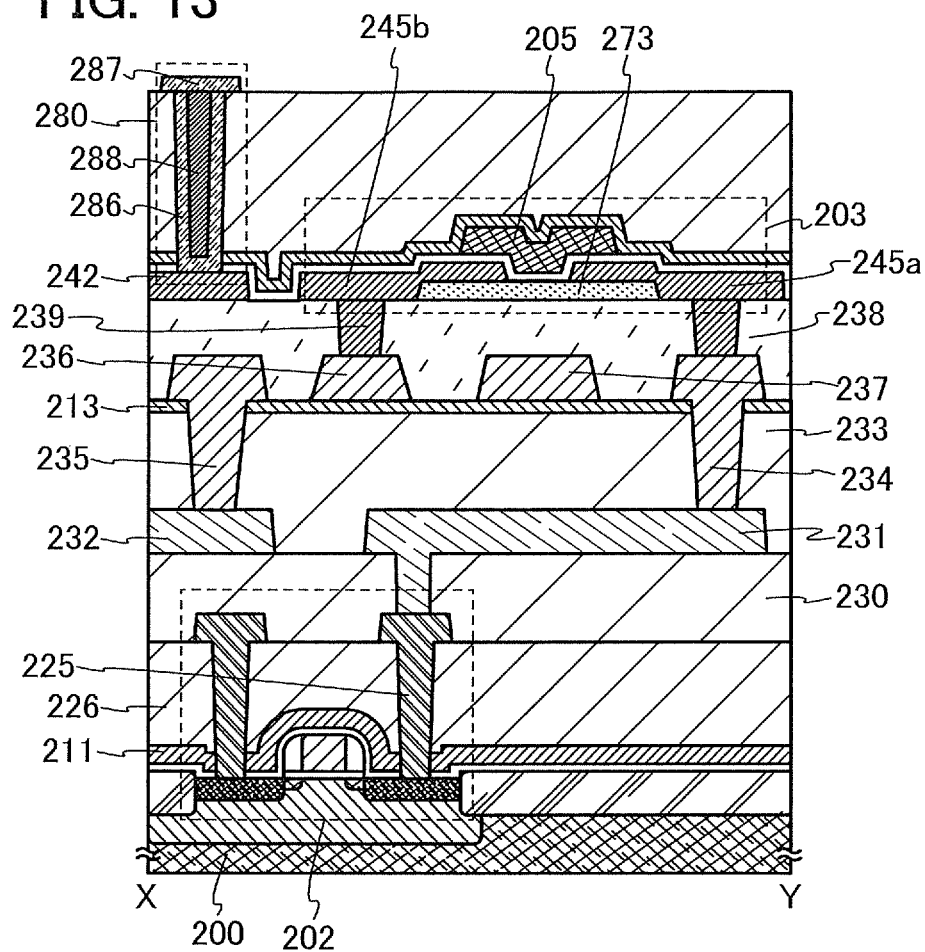

SEMICONDUCTOR DEVICE

BACKGROUND OF THE INVENTION

1. Field of the Invention

The invention disclosed in this specification and the like relates to a semiconductor device including transistors and further relates to a nitride insulating film included in the semiconductor device.

2. Description of the Related Art

In recent years, technical development on high-speed operation of semiconductor devices including central processing units (also referred to as CPUs) and the like has been actively conducted. CPUs include semiconductor integrated circuits including logic circuits. Semiconductor integrated circuits include transistors, memories, and electrodes serving as connection terminals, which are formed over semiconductor wafers.

As technical development on high-speed operation, semiconductor elements such as transistors are reduced in size to improve the operation speed and the degree of integration of CPUs.

By a reduction in size of a semiconductor element such a transistor, the degree of integration of a CPU is improved and the operation speed thereof is also improved; however, leakage current in the transistor is increased. As a result, the power consumption of the CPU is increased.

Semiconductor films which are applicable to transistors can be formed using not only widely known silicon semiconductors but also metal oxides exhibiting semiconductor characteristics (hereinafter referred to as oxide semiconductors).

For example, a technique for forming a transistor in which zinc oxide or an In—Ga—Zn-based oxide semiconductor is used as an oxide semiconductor in a channel formation region is disclosed (see Patent Documents 1 and 2).

In addition, a technique for manufacturing a highly integrated semiconductor device which consumes less power by being provided with a transistor using an oxide semiconductor over a transistor using a single crystal silicon semiconductor is disclosed (see Patent Document 3).

REFERENCE

Patent Documents

[Patent Document 1] Japanese Published Patent Application No. 2007-123861
[Patent Document 2] Japanese Published Patent Application No. 2007-096055
[Patent Document 3] Japanese Published Patent Application No. 2011-109079

In a transistor including an oxide semiconductor, when an element which has been released from an insulating film or the like included in the transistor diffuses as an impurity into an oxide semiconductor film including a channel formation region, the electrical characteristics (typically the threshold voltage) of the transistor are changed and thus the reliability of the semiconductor device might be reduced.

For example, in the case where hydrogen (including a hydrogen compound such as water) is contained in the insulating film included in the transistor, the hydrogen diffuses into the oxide semiconductor film, whereby the electrical characteristics of the transistor are changed and thus the reliability of the semiconductor device is reduced.

Hydrogen which has entered the oxide semiconductor film reacts with oxygen bonded to a metal atom to generate water, and a defect is formed in a lattice from which oxygen is released (or a portion from which oxygen is removed). In addition, a bond of part of hydrogen and oxygen causes generation of electrons serving as carrier. Accordingly, the transistor including the oxide semiconductor film which hydrogen has entered is likely to have normally-on characteristics.

Note that a transistor including an oxide semiconductor film is an n-channel transistor; therefore, in this specification, a transistor which can be regarded as having no drain current flowing therein when a gate voltage is 0 V is defined as a transistor having normally-off characteristics.

Thus, an object of one embodiment of the present invention is to provide a nitride insulating film which prevents diffusion of hydrogen into an oxide semiconductor film.

In order to obtain favorable electrical characteristics of a transistor including a silicon semiconductor region, it is known that the silicon semiconductor region including a channel formation region is subjected to hydrogenation treatment. Note that in this specification and the like, a silicon semiconductor refers to all semiconductor materials that include silicon, e.g., silicon, silicon carbide, and silicon germanium.

The hydrogenation treatment is performed by heat treatment in a hydrogen atmosphere, an ion implantation method, an ion doping method, or the like and has problems in view of treatment time, safety, cost, and the like. Therefore, it is very valuable to facilitate the hydrogenation treatment in terms of reliability, cost, and the like.

For example, even in the case where a semiconductor device including a logic circuit, a semiconductor integrated circuit, and the like is the one in which a transistor including an oxide semiconductor is provided over a transistor including single crystal silicon, hydrogenation treatment is necessary for the transistor including single crystal silicon to have favorable electrical characteristics.

Thus, another object of one embodiment of the present invention is to provide a semiconductor device which has favorable electrical characteristics by using a transistor including a silicon semiconductor and a transistor including an oxide semiconductor.

Further, another object of one embodiment of the present invention is to provide a semiconductor device which has favorable reliability by using a transistor including a silicon semiconductor and a transistor including an oxide semiconductor.

Furthermore, another object of one embodiment of the present invention is to achieve at least one of the objects.

SUMMARY OF THE INVENTION

In view of the objects, one embodiment of the present invention is a semiconductor device in which a plurality of transistors including a transistor including a silicon semiconductor and a transistor including an oxide semiconductor is provided. To increase the degree of integration in the semiconductor device, the transistor including an oxide semiconductor is provided to be stacked over the transistor including a silicon semiconductor and two nitride insulating films having different functions are provided therebetween. Specifically, a first nitride insulating film which contains hydrogen is provided over the transistor including a silicon semiconductor, and a second nitride insulating film which has a lower hydrogen content than the first nitride insulating film and functions as a barrier film against hydrogen is provided between the first nitride insulating film and the transistor including an oxide semiconductor. Note that the second nitride insulating film which has a lower hydrogen content than the first nitride insulating film and functions as a barrier film against hydrogen may be provided to be stacked over the first nitride insulating film.

One embodiment of the present invention is a semiconductor device in which a plurality of transistors is stacked. The semiconductor device includes a first transistor including a channel formation region in a silicon semiconductor region, a second transistor provided over the first transistor and including a channel formation region in an oxide semiconductor film, a first nitride insulating film provided between the first transistor and the second transistor, and a second nitride insulating film provided between the first nitride insulating film and the second transistor. The first nitride insulating film contains hydrogen, and the second nitride insulating film has a lower hydrogen content than the first nitride insulating film and serves as a barrier film against hydrogen. Note that the second nitride insulating film may be stacked over the first nitride insulating film.

One embodiment of the present invention has the above structure in which the number of hydrogen molecules released from the first nitride insulating film is greater than or equal to $5.0 \times 10^{23}$ molecules/cm$^3$ when measured by thermal desorption spectroscopy, the refractive index of the second nitride insulating film with respect to light having a wavelength of 633 nm is 1.95 or more when measured by spectroscopic ellipsometry, and the etching rate of the second nitride insulating film is less than or equal to 2.0 nm/minute under a condition where etching is performed at a temperature higher than or equal to 20° C. and lower than or equal to 25° C. with the use of 0.5 wt % of hydrofluoric acid. Further, the film density of the second nitride insulating film is greater than or equal to 2.75 g/cm$^3$ when measured by X-ray reflectometry.

In general, as a formed film becomes denser, the refractive index of the film is increased and the etching rate of the film is reduced. Accordingly, by forming the second nitride insulating film using a nitride insulating film having a refractive index and an etching rate in the above ranges, the second nitride insulating film can be a dense film, so that the second nitride insulating film can exhibit a barrier property against hydrogen. Further, as a formed film becomes denser, the density of the film is increased; therefore, in order that the second nitride insulating film can sufficiently exhibit a barrier property against hydrogen, the second nitride insulating film is preferably formed using a nitride insulating film having a density in the above range.

In addition, the number of hydrogen molecules released from the first nitride insulating film is greater than or equal to $5.0 \times 10^{23}$ molecules/cm$^3$ when measured by thermal desorption spectroscopy, and hydrogen is released from the first nitride insulating film by heating.

Further, the hydrogen concentration of the first nitride insulating film which releases hydrogen by heating is higher than or equal to 20 atomic % and lower than or equal to 25 atomic % when measured by Rutherford backscattering spectrometry. The hydrogen concentration of the second nitride insulating film which has a barrier property against hydrogen is higher than or equal to 10 atomic % and lower than or equal to 15 atomic % when measured by Rutherford backscattering spectrometry. In this manner, as the concentration of hydrogen contained in the nitride insulating film becomes lower, the nitride insulating film becomes less likely to release hydrogen, so that the nitride insulating film exhibits a barrier property against hydrogen. For example, the first nitride insulating film and the second nitride insulating film can be formed of nitride silicon films.

In the above structure, the first transistor and the second transistor each have a top-gate structure.

Further, one embodiment of the present invention is a semiconductor device in which a third nitride insulating film which has the same structure as the second nitride insulating film is provided over the second transistor.

The first nitride insulating film releases hydrogen by being heated; therefore, when the first nitride insulating film is provided, hydrogen which has been released by heat treatment or the like in the manufacturing process of the semiconductor device can move to the silicon semiconductor region of the first transistor, whereby the silicon semiconductor region of the first transistor can be subjected to hydrogenation treatment.

The second nitride insulating film is formed of an insulating film which is less likely to transmit hydrogen diffusing into the oxide semiconductor film and thus can be considered as having a barrier property against hydrogen. Further, the second nitride insulating film can also be referred to as an insulating film which prevents diffusion of hydrogen into the oxide semiconductor film, or an insulating film which protects the oxide semiconductor film from the hydrogen diffusing into the oxide semiconductor film.

In addition, one embodiment of the present invention is a semiconductor device which has the above structure and further includes an oxide insulating film provided between and in contact with the first nitride insulating film and the second nitride insulating film. The oxide insulating film can be a silicon oxide film or a silicon oxynitride film.

The second nitride insulating film has a lower hydrogen concentration than the first nitride insulating film and is formed of a dense nitride insulating film. Therefore, the second nitride insulating film functions as a barrier film against hydrogen. In the case where the first nitride insulating film which is formed of a nitride insulating film containing hydrogen is provided in contact with the second nitride insulating film, depending on the formation method of the second nitride insulating film, hydrogen which is contained in the first nitride insulating film might be mixed into the second nitride insulating film to increase the hydrogen concentration of the second nitride insulating film. Therefore, the oxide insulating film is provided between the first nitride insulating film and the second nitride insulating film as described above, whereby the hydrogen contained in the first nitride insulating film can be prevented from mixing into the second nitride insulating film at the time of forming the second nitride insulating film, and thus the second nitride insulating film can sufficiently function as a barrier film against hydrogen.

Furthermore, one embodiment of the present invention is a nitride insulating film which is applicable to the second nitride insulating film, in particular, a silicon nitride film which is applicable to the second nitride insulating film.

According to one embodiment of the present invention, a nitride insulating film which prevents diffusion of hydrogen into an oxide semiconductor film can be provided.

According to one embodiment of the present invention, hydrogenation treatment can be safely and easily performed in the transistor including a silicon semiconductor.

According to one embodiment of the present invention, a semiconductor device which has favorable electrical characteristics can be provided by using a transistor including a silicon semiconductor and a transistor including an oxide semiconductor.

According to one embodiment of the present invention, a semiconductor device which has favorable reliability by using a transistor including a silicon semiconductor and a transistor including an oxide semiconductor can be provided.

BRIEF DESCRIPTION OF THE DRAWINGS

FIG. 6 is a cross-sectional view illustrating a semiconductor device that is one embodiment of the present invention.

FIG. 13 is a cross-sectional view illustrating a semiconductor device that is one embodiment of the present invention.

DETAILED DESCRIPTION OF THE INVENTION

Figure 1A:
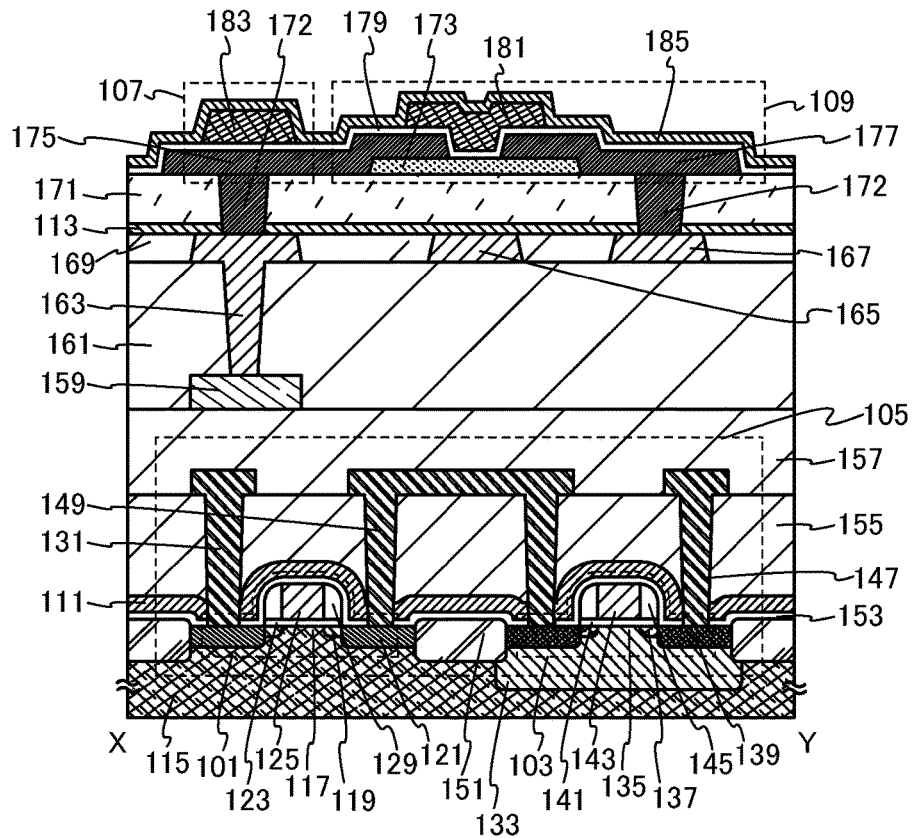
FIGS. 1A and 1B are a cross-sectional view and a circuit diagram illustrating a semiconductor device that is one embodiment of the present invention.

Hereinafter, embodiments and examples of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments and examples.

Note that in structures of the present invention described below, the same portions or portions having similar functions are denoted by the same reference numerals in different drawings, and description thereof is not repeated. Further, the same hatching pattern is applied to portions having similar functions, and the portions are not especially denoted by reference numerals in some cases.

Note that, in each drawing described in this specification, the size, the film thickness, or the region of each component is exaggerated for clarity in some cases. Therefore, the embodiments and examples of the present invention are not limited to such scales.

Note that ordinal numbers such as "first" and "second" in this specification and the like are used for convenience and do not denote the order of steps or the stacking order of layers. In addition, the ordinal numbers in this specification and the like do not denote particular names which specify the invention.

Functions of a "source" and a "drain" in the present invention are sometimes replaced with each other when the direction of a current flowing is changed in circuit operation, for example. Therefore, the terms "source" and "drain" can be replaced with each other in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where etching treatment is performed after photolithography treatment, a mask formed by the photolithography treatment is removed.

Embodiment 1

In the present embodiment, a semiconductor device that is one embodiment of the present invention is described with reference to drawings.

<Structure of Semiconductor Device>

FIG. 1A is a cross-sectional view illustrating a semiconductor device that is one embodiment of the present invention. The semiconductor device illustrated in FIG. 1A includes a plurality of transistors, and some of the transistors are stacked in the longitudinal direction in order to increase the degree of integration.

Specifically, a complementary metal oxide semiconductor (CMOS) circuit 105 in which a transistor 101 that is an n-channel transistor including a first semiconductor material and a transistor 103 that is a p-channel transistor are electrically connected to each other is provided in a lower portion; a capacitor 107 and a transistor 109 that is an n-channel transistor including a second semiconductor material are provided over the CMOS circuit 105; a first nitride insulating film 111 which contains hydrogen and releases hydrogen by heating is provided over the transistor 101 and the transistor 103; and a second nitride insulating film 113 which has a lower hydrogen content than the first nitride insulating film 111 and functions as a barrier film against hydrogen is provided between the first nitride insulating film 111 and the transistor 109.

Figure 1B:
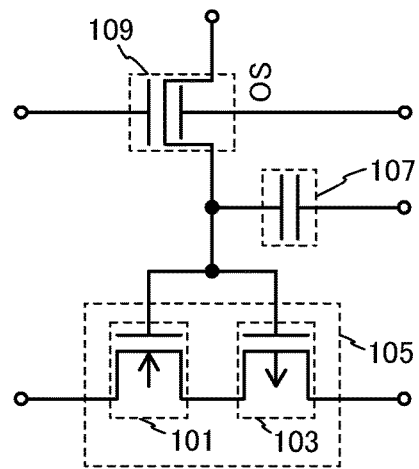

FIG. 1B is a circuit diagram corresponding to the semiconductor device in FIG. 1A. The connection relation in the circuit diagram in FIG. 1B is as follows. The capacitor 107 is electrically connected to the CMOS circuit 105 in which the transistor 101 and the transistor 103 are electrically connected to each other, and the transistor 109 including an oxide semiconductor is electrically connected to the CMOS circuit 105 and the capacitor 107. Note that another transistor may be electrically connected to the transistor 109.

A semiconductor material other than an oxide semiconductor, such as a silicon semiconductor, is used as the first semiconductor material, and an oxide semiconductor is used as the second semiconductor material. That is, the transistors 101 and 103 are each a transistor including a silicon semiconductor, and the transistor 109 is a transistor including an oxide semiconductor.

The transistors 101 and 103 are formed using a silicon semiconductor and thus transistors which operate at a high speed can be easily manufactured as the transistors 101 and 103 by using a single crystal substrate or a polycrystalline substrate.

Meanwhile, it is possible to easily manufacture, as the transistor including an oxide semiconductor, a transistor in which leakage current (also referred to as off-state leakage current or off-state current) is reduced by high purification by removal of impurities such as hydrogen from an oxide semiconductor film including a channel formation region. Thus, power consumption of the semiconductor device can be reduced.

The first nitride insulating film 111 is formed of a nitride insulating film which contains hydrogen and releases hydrogen by heating. Specifically, the number of hydrogen molecules released from the nitride insulating film is greater than or equal to $5.0 \times 10^{23}$ molecules/cm$^3$ when measured by thermal desorption spectroscopy (hereinafter referred to as TDS). Further, the hydrogen concentration of the nitride insulating film is higher than or equal to 20 atomic % and lower than or equal to 25 atomic % when measured by Rutherford backscattering spectrometry. As the nitride insulating film, for example, a silicon nitride film, a silicon nitride oxide film, or the like can be given.

To achieve favorable electrical characteristics of the transistors 101 and 103 including a silicon semiconductor, it is preferable that hydrogenation treatment be performed in the manufacturing processes of the transistors so that at least defects (dangling bonds) which are included in a silicon semiconductor region including the channel formation region are repaired (terminated with hydrogen). Thus, the first nitride insulating film 111 is provided over the transistor 101 and the transistor 103, whereby the hydrogenation treatment can be performed using hydrogen which is released from the first nitride insulating film 111. In this manner, hydrogenation treatment can be safely and easily performed, unlike in a conventional method. For example, the hydrogenation treatment can be performed by performing heat treatment after the first nitride insulating film 111 is provided in the manufacturing process of the semiconductor device, which results in a reduction in time necessary for manufacturing the semiconductor device and an improvement in productivity of the semiconductor device.

The second nitride insulating film 113 is an insulating film which has a lower hydrogen content than the first nitride insulating film 111 and functions as a barrier film against hydrogen. Further, the second nitride insulating film 113 is an insulating film which prevents at least hydrogen which is released from the first nitride insulating film 111 from diffusing into the oxide semiconductor film (specifically, a channel formation region) of the transistor 109, or an insulating film which protects the channel formation region from hydrogen which diffuses into the oxide semiconductor film of the transistor 109.

Thus, a dense nitride insulating film which has a low hydrogen content can be used as the second nitride insulating film 113. Specifically, characteristics of the nitride insulating film which can be used as the second nitride insulating film 113 are as follows: the refractive index is greater than or equal to 1.95 to light having a wavelength of 633 nm when measured by spectroscopic ellipsometry, and the etching rate is lower than or equal to 2.0 nm/min when the etching is performed at a temperature higher than or equal to 20° C. and lower than or equal to 25° C. with the use of a 0.5 weight % of hydrofluoric acid. Alternatively, characteristics of the nitride insulating film which can be used as the second nitride insulating film 113 are as follows: the refractive index that is greater than or equal to 1.95 to light having a wavelength of 633 nm when measured by spectroscopic ellipsometry, and the film density is greater than or equal to 2.75 g/cm$^3$ when measured by X-ray reflectometry. It is preferable that the hydrogen concentration of the second nitride insulating film 113 be higher than or equal to 10 atomic % and lower than or equal to 15 atomic % when measured by Rutherford backscattering spectrometry.

In general, as a formed film becomes denser, the refractive index of the film is increased and the etching rate of the film is reduced. Accordingly, by forming the second nitride insulating film 113 using a nitride insulating film having a refractive index and an etching rate in the above ranges, the second nitride insulating film 113 can be a dense film, so that the second nitride insulating film 113 can exhibit a barrier property against hydrogen. Further, as a formed film becomes denser, the density of the film is increased; therefore, in order that the second nitride insulating film 113 can sufficiently exhibit a barrier property against hydrogen, the second nitride insulating film 113 is preferably formed using a nitride insulating film having a density in the above range. In this manner, as the concentration of hydrogen contained in the nitride insulating film becomes lower, the nitride insulating film becomes less likely to release hydrogen, so that the nitride insulating film exhibits a barrier property against hydrogen. A silicon nitride film, a silicon nitride oxide film, and the like can be given as examples of the nitride insulating film.

Since the second nitride insulating film 113 is provided, hydrogen which exists in a portion located below the transistor 109 and including the first nitride insulating film 111 can be prevented from diffusing into the oxide semiconductor film (at least the channel formation) of the transistor 109 as an impurity; as a result, change in the electrical characteristics of the transistor 109 can be prevented. Accordingly, the electrical characteristics of the transistor 109 can be favorable and the reliability of the semiconductor device can be improved.

Next, more details of the semiconductor device that is one embodiment of the present invention are described.

In the semiconductor device illustrated in FIG. 1A, channel formation regions of the transistor 101 and the transistor 103 can be formed in a substrate 115 including a semiconductor material (in a bulk) or over the substrate 115 including a semiconductor material. Note that in this embodiment, a single crystal silicon substrate having p-type conductivity is used as the substrate 115, and the channel formation regions of the transistors 101 and 103 are formed in the substrate 115.

The transistor 101 includes a channel formation region 117 which is provided in the substrate 115; impurity regions 119 between which the channel formation region 117 is sandwiched and high-concentration impurity regions 121 which are electrically connected to the impurity regions 119 (these regions are also simply referred to as impurity regions collectively); a gate insulating film 123 which is provided over the channel formation region 117; a gate electrode 125 which is provided over the gate insulating film 123; sidewalls 129 which are provided on side surfaces of the gate electrode 125; and a source or drain electrode (hereinafter referred to an electrode 131) which is provided in contact with the high-concentration impurity region 121 provided on one side of the channel formation region 117.

The impurity regions 119 function as lightly doped drain (LDD) regions or extension regions. The high-concentration impurity regions 121 function as a source region and a drain region of the transistor 101.

The transistor 103 is provided on an n-well 133 which is formed by addition of an impurity element imparting n-type conductivity to the substrate 115. The transistor 103 includes a channel formation region 135 which is provided in the n-well 133; impurity regions 137 between which the channel formation region 135 is sandwiched and high-concentration impurity regions 139 which are electrically connected to the impurity regions 137 (these regions are also simply referred to as impurity regions collectively); a gate insulating film 141 which is provided over the channel formation region 135; a gate electrode 143 which is provided over the gate insulating film 141; sidewalls 145 which are provided on side surfaces of the gate electrode 143; and a source or drain electrode (hereinafter referred to an electrode 147) which is electrically connected to the impurity region 137 on one side of the channel formation region 135 and provided in contact with the high-concentration impurity region 139.

The impurity regions 137 function as lightly doped drain (LDD) regions or extension regions. The high-concentration impurity regions 139 function as a source region and a drain region of the transistor 103.

In the semiconductor device illustrated in FIG. 1A, an electrode 149 is provided in contact with the high-concentration impurity region 121 on the other side of the channel formation region 117 in the transistor 101 and the high-concentration impurity region 139 on the other side of the channel formation region 135 in the transistor 103. The electrode 149 functions as a source or drain electrode of the transistor 101 and functions as a source or drain electrode of the transistor 103. Further, the transistor 101 and the transistor 103 are electrically connected to each other with the electrode 149 to form the CMOS circuit 105.

Element isolation insulating films 151 are provided over the substrate 115 to surround each of the transistors 101 and 103. An insulating film 153 is provided to cover the transistors 101 and 103 and the element isolation insulating films 151, and the first nitride insulating film 111 is provided over the insulating film 153.

An interlayer insulating film 155 is provided over the first nitride insulating film 111. Note that the electrode 131, the electrode 147, and the electrode 149 are provided to penetrate the insulating film 153, the first nitride insulating film 111, and the interlayer insulating film 155 and each function as a wiring.

An interlayer insulating film 157 is provided over the interlayer insulating film 155. An electrode 159 is provided over the interlayer insulating film 157. The electrode 159 also functions as a wiring. The electrode 159 is electrically connected to a gate wiring (not illustrated) of the transistors 101 and 103 (the CMOS circuit 105) through an opening which is formed in the insulating film 153, the first nitride insulating film 111, the interlayer insulating film 155, and the interlayer insulating film 157. The gate wiring is provided over the gate insulating film 123 and the gate insulating film 141 and branches to be the gate electrode 125 of the transistor 101 and the gate electrode 143 of the transistor 103. Therefore, the CMOS circuit 105 and the capacitor 107 are electrically connected to each other, and the capacitor 107 and the transistor 109 are electrically connected to each other.

An interlayer insulating film 161 is provided over the electrode 159 and the interlayer insulating film 157. An electrode 163 is provided in contact with the electrode 159 through an opening formed in the interlayer insulating film 161. An electrode 165 and an electrode 167 are provided over the interlayer insulating film 161. The electrode 165 is provided over a region of the interlayer insulating film 161 which overlaps with an oxide semiconductor film 173 of the transistor 109. The electrode 167 is provided to overlap with a drain electrode 177 of the transistor 109. Note that the electrode 163, the electrode 165, and the electrode 167 each also function as a wiring.

An insulating film 169 is provided between the electrodes 163, 165, and 167. The electrodes 163, 165, and 167 and the insulating film 169 are planarized.

The second nitride insulating film 113 is provided over the electrodes 163, 165, and 167 and the insulating film 169. An insulating film 171 is provided over the second nitride insulating film 113.

The capacitor 107 and the transistor 109 are provided over the insulating film 171.

The transistor 109 includes at least the oxide semiconductor film 173 which is provided over the insulating film 171, a source electrode 175 and the drain electrode 177 which are provided in contact with the oxide semiconductor film 173, a gate insulating film 179 which is provided over the oxide semiconductor film 173, the source electrode 175, and the drain electrode 177, and a gate electrode 181 which is provided over the gate insulating film 179 to overlap with the oxide semiconductor film 173.

The source electrode 175 is in contact with the electrode 163 via a connection electrode 172 which is provided in an opening formed in the second nitride insulating film 113 and the insulating film 171. Therefore, the source electrode 175 is electrically connected to the gate electrode 125 of the transistor 101 and the gate electrode 143 of the transistor 103.

The drain electrode 177 is in contact with the electrode 167 via the connection electrode 172 provided in an opening formed in the second nitride insulating film 113 and the insulating film 171.

An electrode 183 is provided over a region of the gate insulating film 179 which overlaps with the source electrode 175. In the capacitor 107, the source electrode 175 serves as one electrode, the gate insulating film 179 serves as a dielectric, and the electrode 183 serves as the other electrode. Note that the electrode 183 also functions as a wiring.

When the source electrode 175 of the transistor 109 is used as one electrode of the capacitor 107, the degree of integration of the semiconductor device can be increased.

An insulating film 185 is provided over the gate insulating film 179, the gate electrode 181, and the electrode 183.

In the transistor 109, the oxide semiconductor film 173 is formed using an amorphous oxide semiconductor, a single crystal oxide semiconductor, or a polycrystalline oxide semiconductor.

It is preferable that impurities such as hydrogen be sufficiently removed from the oxide semiconductor film 173 so that the oxide semiconductor film 173 is highly purified. Specifically, the concentration of hydrogen of the oxide semiconductor film 173, which is measured by secondary ion mass spectrometry (SIMS), is lower than $5 \times 10^{18}$ atoms/cm$^3$, preferably lower than or equal to $1 \times 10^{18}$ atoms/cm$^3$, further preferably lower than or equal to $5 \times 10^{17}$ atoms/cm$^3$, still further preferably lower than or equal to $1 \times 10^{16}$ atoms/cm$^3$. Hydrogen contained in the oxide semiconductor film 173 reacts with oxygen bonded to a metal atom to generate water, and a defect is formed in a lattice from which oxygen is released (or a portion from which oxygen is removed). Bonding of part of hydrogen to oxygen might generate carriers, which might lead to an increase in off-state current of the transistor 109.

The concentration of an alkali metal or an alkaline earth metal of the oxide semiconductor film 173 is lower than or equal to $1 \times 10^{18}$ atoms/cm$^3$, preferably lower than or equal to $2 \times 10^{16}$ atoms/cm$^3$, when measured by secondary ion mass spectrometry. This is because bonding of an alkali metal and an alkaline to an oxide semiconductor might generate carriers, which might lead to an increase in off-state current of the transistor 109. The nitrogen concentration of the oxide semiconductor film 173 is preferably lower than or equal to $5 \times 10^{18}$ atoms/cm$^3$.

In this manner, when impurities in the oxide semiconductor film 173 are reduced as much as possible to highly purify the oxide semiconductor film 173, leakage current of the transistor 109 can be extremely reduced. Further, change in (negative shift of) the threshold voltage of the transistor 109 can be reduced. Accordingly, a semiconductor device having favorable electrical characteristics can be manufactured. Further, a semiconductor device with improved reliability can be manufactured.

Note that various examinations can prove low off-state current of a transistor including a highly purified oxide semiconductor film in which a channel formation region is formed. For example, even when an element has a channel width (W) of $1 \times 10^6$ lam and a channel length (L) of 10 mm, off-state current can be less than or equal to the measurement limit of a semiconductor parameter analyzer, i.e., less than or equal to $1 \times 10^{-13}$ A, at a voltage (drain voltage) between the source electrode and the drain electrode of from 1 V to 10 V. In this case, it can be found that the off-state current corresponding to a value obtained by dividing the off-state current by the channel width of the transistor is 100 zA/μm or lower. Further, the off-state current was measured with the use of a circuit in which a capacitor and a transistor are connected to each other and charge that flows in or out from the capacitor is controlled by the transistor. In the measurement, the off-state current of the transistor was measured from change in the amount of electrical charge of the capacitor per unit hour with the use of the transistor. As a result, it is found that in the case where the voltage between the source electrode and the drain electrode of the transistor is 3 V, lower off-state current of several tens of yoctoamperes per micrometer (yA/μm) can be obtained. Accordingly, a transistor including a highly purified oxide semiconductor film in which a channel formation region is formed has remarkably low off-state current.

Oxygen vacancies which are included in an oxide semiconductor might generate carriers, which might lower the electrical characteristics and reliability of the transistor. Thus, it is preferable that oxygen vacancies in the oxide semiconductor film 173 be reduced as much as possible. For example, the spin density of the oxide semiconductor film 173 (the density of oxygen vacancies in the oxide semiconductor film 173) at a g-value of 1.93 in electron spin resonance in which a magnetic field is applied in parallel to the film surface is preferably reduced to be lower than or equal to the lower limit of detection of the measurement instrument. By reducing the oxygen vacancies as much as possible, change in (negative shift of) the threshold voltage of the transistor 109 can be reduced, so that the electrical characteristics and reliability of the semiconductor device can be improved.

Figure 2:
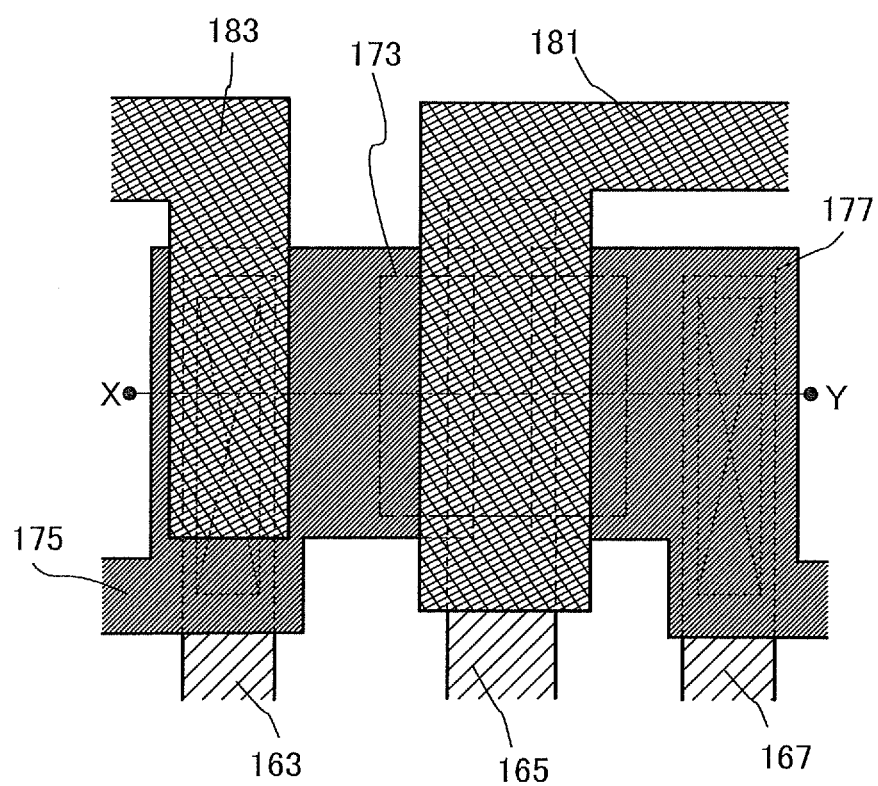
FIG. 2 is a top view illustrating a semiconductor device that is one embodiment of the present invention.

FIG. 2 illustrates a top view of part of the semiconductor device that is one embodiment of the present invention. The cross-sectional view in FIG. 1A corresponds to a cross-sectional view taken along a dashed dotted line X-Y in the top view in FIG. 2. In the top view in FIG. 2, some components (e.g., the CMOS circuit 105, the first nitride insulating film 111, the second nitride insulating film 113, and other gate insulating films and interlayer insulating films) are not illustrated for clarification of the drawing.

<Method for Manufacturing Semiconductor Device>

Next, the semiconductor device that is one embodiment of the present invention and a method for manufacturing the semiconductor device are described with reference to drawings. In the following description, first, a method for manufacturing the transistors included in the CMOS circuit in the lower portion is described, and then, a method for manufacturing the transistor including an oxide semiconductor in the upper portion is described.

The substrate 115 used for the semiconductor device is a substrate containing a silicon semiconductor.

First, the substrate 115 containing a semiconductor material is prepared. As the substrate 115, a single crystal semiconductor substrate or a polycrystalline semiconductor substrate made of silicon or silicon carbide, a compound semiconductor substrate made of silicon germanium or the like, a silicon on insulator (SOI) substrate, or the like can be used. The channel formation regions of the transistor 101 and the transistor 103 can be formed in the semiconductor substrate (in the bulk) or over the semiconductor substrate.

In the semiconductor device described in this embodiment, a single crystal silicon substrate is used as the substrate 115, and the transistor 101 and the transistor 103 are provided on the single crystal silicon substrate. In other words, in this embodiment, a silicon semiconductor used as the first semiconductor material is single crystal silicon, and the channel formation regions of the transistors 101 and 103 are formed using single crystal silicon. Note that this embodiment shows an example in which a single crystal silicon substrate having p-type conductivity is used as the substrate 115.

An impurity element imparting n-type conductivity is added to a region of the substrate 115 where the transistor 103 is to be formed, so that the n-well 133 is formed in the region. The channel formation region 135 of the transistor 103 is formed in the n-well 133. As the impurity element imparting n-type conductivity, phosphorus (P), arsenic (As), or the like can be used.

Note that an impurity element imparting p-type conductivity is not added to a formation region of the transistor 101 that is an n-channel transistor; however, a p-well may be formed by addition of an impurity element imparting p-type conductivity. As the impurity element imparting p-type conductivity, boron (B), aluminum (Al), gallium (Ga), or the like can be used.

In the case where a single crystal silicon substrate having n-type conductivity is used, a p-well may be formed by addition of an impurity element imparting p-type conductivity, and the channel formation region 135 of the transistor 101 can be formed in the p-well.

The n-well 133 or the p-well can be formed by addition of any of the above-described impurity elements by an ion doping method, an ion implantation method, or the like.

The element isolation insulating films 151 are formed over the substrate 115. The element isolation insulating films 151 can be formed by a known method. For example, a protective film is formed over the substrate 115 and etched using the protective film as a mask to remove portions of the substrate 115 that are regions which are not covered with the protective film (exposed regions), whereby recessed portions are formed. For the etching treatment, dry etching is preferably performed, but wet etching may be performed. An etching gas and an etchant can be selected as appropriate depending on a material of a layer to be etched. Then, an insulating film is formed to cover the substrate 115 and the insulating film which are formed in regions except the recessed portions are selectively removed, whereby the element isolation insulating films 151 can be formed. The insulating film is formed using a silicon oxide film, a silicon nitride film, a silicon nitride oxide film, or the like. Polishing treatment such as chemical mechanical polishing (CMP), etching treatment, and the like can be given as examples of a way to remove the insulating film, and any of them may be used. Note that the protective film is removed after the recessed portions are formed or after the element isolation insulating films 151 are formed. Further, after the polishing treatment such as CMP or the etching treatment, cleaning treatment is performed and heat treatment for removing moisture attached onto a surface of the processing substrate is performed.

Note that also in the subsequent process of the semiconductor device after the formation of the element isolation insulating films 151, the cleaning treatment and the heat treatment are performed after polishing treatment such as CMP or etching treatment is performed.

Note that the element isolation insulating films 151 can also be formed using an element isolation technique such as local oxidation of silicon (LOCOS).

Next, an insulating film to be processed into the gate insulating film 123 and the gate insulating film 141 later is formed over the substrate 115 where the element isolation insulating films 151 are formed. Then a film containing a conductive material (conductive film) is formed over the insulating film and processed, so that the gate electrode 125 and the gate electrode 143 are formed. The insulating film processed into the gate insulating films 123 and 141 is formed with a single-layer structure or a stacked-layer structure including one or more of the following films and the like formed by a CVD method, a sputtering method, or the like: a silicon oxide film, a hafnium oxide film, an aluminum oxide film, a tantalum oxide film, a silicon nitride film, and a silicon nitride oxide film. Alternatively, the insulating film processed into the gate insulating films 123 and 141 may be formed in such a manner that the surface of the substrate 115 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, nitrogen, or hydrogen. Although there is no particular limitation on the thickness of the insulating film, the insulating film can have a thickness greater than or equal to 1 nm and less than or equal to 100 nm, for example.

There is no particular limitation on the conductive film processed into the gate electrodes 125 and 143, and a variety of conductive films are applicable thereto. For example, a metal material such as aluminum, copper, titanium, tantalum, or tungsten can be used. Alternatively, the film containing a conductive material may be formed using a semiconductor material such as polycrystalline silicon containing a conductive material. There is no particular limitation on the method for forming the film containing a conductive material, and a variety of formation methods such as an evaporation method, a CVD method, a sputtering method, or a spin coating method can be employed. Note that the conductive film is formed using a metal material in this embodiment. The insulating film and the conductive film can be processed by dry etching or wet etching. Note that there is no particular limitation on the thickness of the conductive film, and the thickness of the conductive film can be determined in consideration of time needed for the formation, desired resistivity, or the like.

Next, a protective film is formed over a region where the transistor 101 is to be formed, and an impurity element imparting p-type conductivity is added to a region where the transistor 103 is to be formed, using the gate electrode 143 as a mask, so that impurity regions are formed. Further, a protective film is formed over the region where the transistor 103 is to be formed, and an impurity element imparting n-type conductivity is added to the region where the transistor 101 is to be formed, using the gate electrode 125 as a mask, so that impurity regions are formed. Note that by the formation of the impurity regions, a region of the substrate 115 which is located below the gate electrode 125 serves as the channel formation region 117 of the transistor 101 (see FIG. 3A). The concentration of the added impurity can be set as appropriate; the concentration is preferably raised in accordance with the degree of miniaturization of the semiconductor element. Alternatively, an insulating film may be formed to cover the gate electrode 125 and the gate electrode 143 and the impurity element may be added through the insulating film.

Next, the sidewalls 129 and 145 are formed. An insulating film is formed so as to cover the gate electrode 125 and the gate electrode 143 and then subjected to highly anisotropic etching, whereby the sidewalls 129 and 145 can be formed in a self-aligned manner. Note that the gate insulating films 123 and 141 are formed at the same time as the formation of the sidewalls 129 and 145.

Next, the insulating film 153 is formed to cover the gate electrodes 125 and 143, the impurity regions, the sidewalls 129 and 145, and the like. Then, a protective film is formed over a region of the insulating film 153 where the transistor 103 is to be formed, and an impurity element imparting n-type conductivity is added to the impurity regions using the gate electrode 125 and the sidewalls 129 as masks, whereby the impurity regions 119 and the high-concentration impurity regions 121 are formed. Further, a protective film is formed over a region of the insulating film 153 where the transistor 101 is to be formed, and an impurity element imparting p-type conductivity is added using the gate electrode 143 and the sidewalls 145 as masks, whereby the impurity regions 137 and the high-concentration impurity regions 139 are formed. Note that the impurity element may be added before the insulating film 153 is formed, and then the insulating film 153 may be formed.

Note that the semiconductor device that is one embodiment of the present invention is not limited to the one illustrated in FIGS. 1A and 1B. For example, transistors including silicide or transistors without sidewalls may be used as the transistors 101 and 103. When a structure that contains silicide is used, the resistance of a source region and a drain region can be further lowered and the operation speed of the semiconductor device can be increased. Further, the semiconductor device can be operated at low voltage; thus, power consumption of the semiconductor device can be reduced. Examples of a metal material with which silicide can be formed include titanium, tantalum, tungsten, nickel, cobalt, platinum, and the like.

Figure 3A:
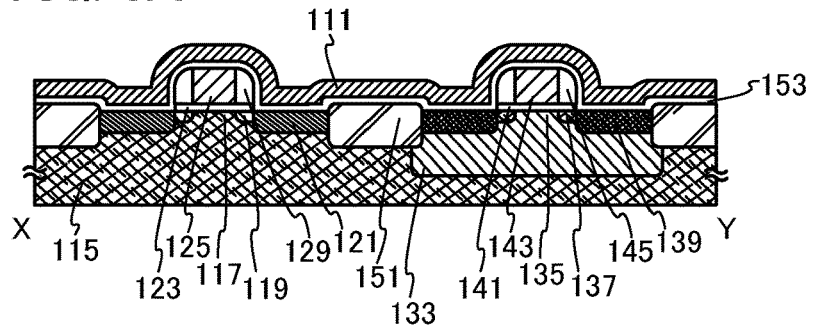
FIGS. 3A to 3C are cross-sectional views illustrating a method for manufacturing a semiconductor device that is one embodiment of the present invention.

Next, the first nitride insulating film 111 is formed over the insulating film 153. It is preferable that the first nitride insulating film 111 have such a thickness that the first nitride insulating film 111 contains hydrogen enough to sufficiently perform hydrogenation treatment on at least the channel formation regions 117 and 135 of the transistors 101 and 103. For example, the thickness of the first nitride insulating film 111 is greater than or equal to 50 nm and less than or equal to 1000 nm, preferably greater than or equal to 100 nm and less than or equal to 500 nm. The structure obtained through the above steps is illustrated in FIG. 3A.

Here, a method for forming the first nitride insulating film 111 is described. The first nitride insulating film 111 is formed of an insulating nitride film which contains hydrogen and releases hydrogen by heating. A silicon nitride film or a silicon nitride oxide film which is applicable to the first nitride insulating film 111 can be formed on the following conditions. The substrate placed in a treatment chamber of a plasma CVD apparatus, which is vacuum-evacuated, is held at a temperature higher than or equal to 300° C. and lower than or equal to 400° C., preferably higher than or equal to 320° C. and lower than or equal to 370° C., the pressure in the treatment chamber is set greater than or equal to 40 Pa and less than or equal to 600 Pa, preferably greater than or equal to 100 Pa and less than or equal to 500 Pa by introduction of a source gas into the treatment chamber, and high-frequency power is supplied to an electrode provided in the treatment chamber. Nitrogen and a deposition gas containing silicon are used as the source gas. Alternatively, ammonia may be used as the source gas. Typical examples of the deposition gas containing silicon include silane, disilane, trisilane, silane fluoride, and the like. In order that hydrogen is contained in the nitride insulating film formed as the first nitride insulating film 111, ammonia, which contains hydrogen as a composition element, is preferably used for the source gas. For example, in the case where the first nitride insulating film 111 is formed using a plasma CVD apparatus, the flow rate of the nitrogen supplied to the treatment chamber which is vacuum-evacuated is set to greater than or equal to 20 times and less than or equal to 1000 times, preferably greater than or equal to 150 times and less than or equal to 750 times, that of the deposition gas containing silicon supplied to the treatment chamber. In the case where ammonia is used for the source gas, the flow rate of the ammonia is set to greater than or equal to 1 time and less than or equal to 100 times, preferably greater than or equal to 1 time and less than or equal to 50 times, that of the deposition gas containing silicon.

Heat treatment is performed after the first nitride insulating film 111 is formed, whereby defects included in at least the channel formation regions 117 and 135 of the transistors 101 and 103 are repaired (terminated with hydrogen). By the heat treatment, defects in the gate insulating film 123 and the gate insulating film 141, defects at an interface between the gate insulating film 123 and the silicon, and the like can be repaired. In other words, it is possible to subject the semiconductor device that is this embodiment to hydrogenation treatment by forming the first nitride insulating film 111 and performing the heat treatment.

The heat treatment apparatus in the heat treatment is not limited to an electric furnace; the heat treatment apparatus can be an apparatus that heats an object using thermal conduction or thermal radiation given by a medium such as a heated gas or the like. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. In the heat treatment, treatment time and a treatment atmosphere can be selected as appropriate. Note that the heat treatment may be performed any time after the first nitride insulating film 111 is formed, and the timing of the heat treatment can be selected as appropriate. Further, for example, the heat treatment may also serves as other heat treatment, like heat treatment which is to be performed for forming an interlayer insulating film or the transistor 109.

Figure 3B:
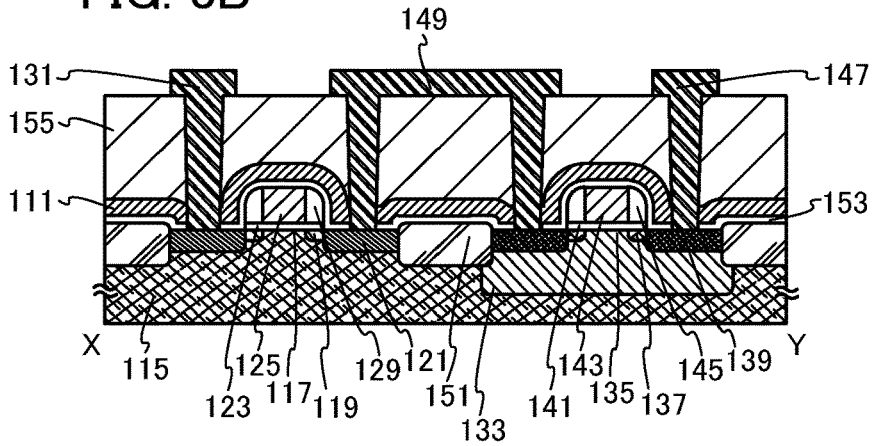

Next, the interlayer insulating film 155 is formed over the first nitride insulating film 111, and then the electrode 131, the electrode 147, and the electrode 149 are formed (see FIG. 3B). The electrode 131, the electrode 147, and the electrode 149 can be formed in such a manner that the insulating film 153, the first nitride insulating film 111, and the interlayer insulating film 155 are processed to form openings reaching the high-concentration impurity regions 121 and the high-concentration impurity regions 139, and then a conductive film is formed in and over the openings and processed by etching treatment or the like. Note that the surface of the interlayer insulating film 155 is preferably planarized by polishing treatment such as CMP or etching treatment before the openings are formed.

The interlayer insulating film 155 can be formed in such a manner that an inorganic insulating film or an organic insulating film is formed and processed. Examples of the inorganic insulating film include a silicon oxide film, a silicon oxynitride film, an aluminum oxide film, and the like. Examples of the organic insulating film include films of an acrylic resin, polyimide, a benzocyclobutene-based resin, polyamide, an epoxy resin, a siloxane-based resin, and the like. Note that the interlayer insulating film 155 may be a stack of two or more of these insulating films. There is no particular limitation on the method for forming the inorganic insulating film or the organic insulating film and the method may be selected as appropriate in accordance with the material to be used. For example, a CVD method, a sputtering method, spin coating, dipping, spray coating, a droplet discharge method (such as an inkjet method), screen printing, offset printing, or the like can be employed.

In the case where miniaturization of a semiconductor element such as a transistor included in a semiconductor device is advanced, parasitic capacitance between wirings is significant and thus signal delay is increased. Therefore, the dielectric constant of silicon oxide (k=4.0 to 4.5) is too high and thus a material with k=3.0 or less is preferably used for forming the interlayer insulating film 155. Further, mechanical strength is required for the interlayer insulating film 155 because planarization is to be performed thereon. The insulating film 155 can be made porous to have a lower dielectric constant as long as the mechanical strength can be secured.

The electrode 131, the electrode 147, and the electrode 149 preferably have a structure in which part of the electrodes is embedded in the interlayer insulating film 155, the first nitride insulating film 111, and the insulating film 153, like a damascene structure. There is no particular limitation on the material of the electrode 131, the electrode 147, and the electrode 149 and a variety of conductive materials can be used. For example, a metal material such as molybdenum, titanium, chromium, tantalum, tungsten, aluminum, copper, neodymium, or scandium can be used.

Note that in the case where the electrodes 131, 147, and 149 are formed, the process is preferably performed so that the surfaces thereof are planarized. For example, when a thin titanium film or a thin titanium nitride film is formed in a region including the openings and then a tungsten film is formed so as to be embedded in the openings, an excess tungsten film, an excess titanium film, an excess titanium nitride film, or the like is removed and the planarity of the surface can be improved by the subsequent CMP.

Figure 3C:
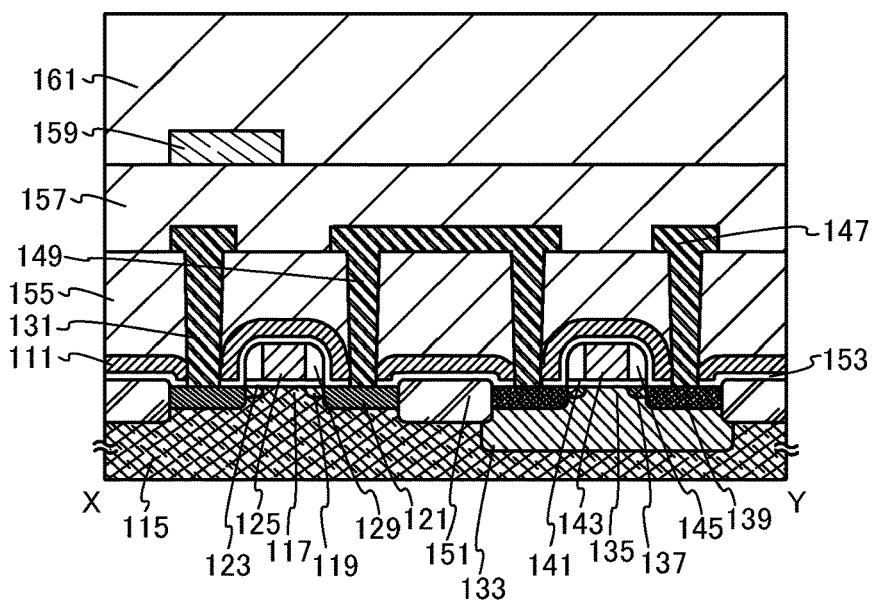

Next, the interlayer insulating film 157 is formed over the interlayer insulating film 155, the electrode 131, the electrode 147, and the electrode 149. An opening reaching the gate electrode 125 and the gate electrode 143 is formed in the interlayer insulating film 157 (not illustrated), and the electrode 159 is formed in and over the opening. Then, the interlayer insulating film 161 is formed over the interlayer insulating film 157 and the electrode 159 (see FIG. 3C).

The interlayer insulating film 157 and the interlayer insulating film 161 can be formed using a material which is applicable to the interlayer insulating film 155 in a manner similar to that of the interlayer insulating film 155. The electrode 159 can be formed using a material which is applicable to the electrode 131 or the like in a manner similar to that of the electrode 131 or the like.

Figure 4A:
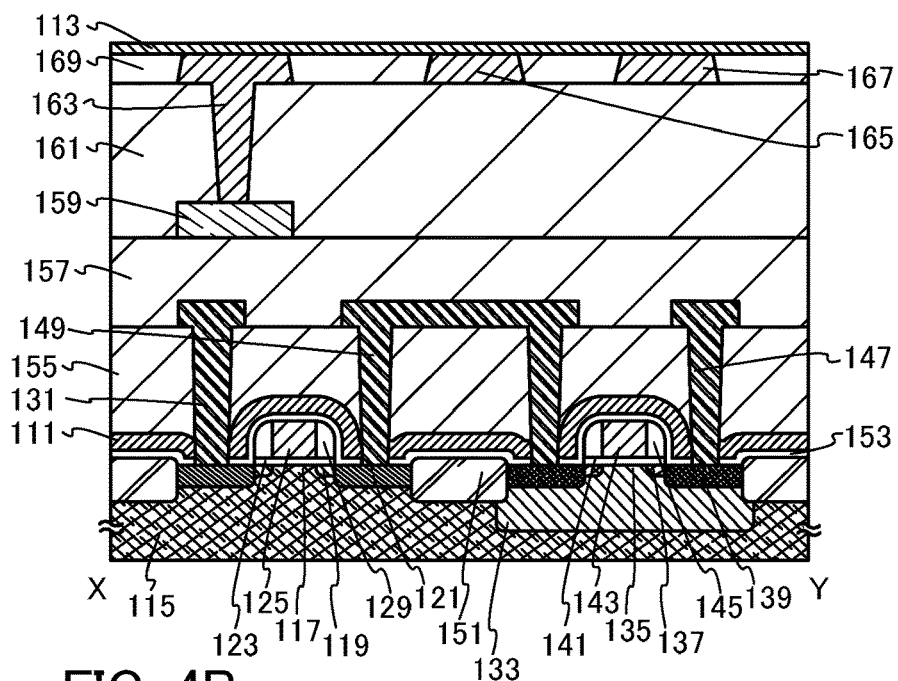
FIGS. 4A and 4B are cross-sectional views illustrating a method for manufacturing a semiconductor device that is one embodiment of the present invention.

Next, an opening reaching the electrode 159 is formed in the interlayer insulating film 161 and the electrode 163 is formed in and over the opening. The electrode 165 and the electrode 167 can be formed at the same time as the formation of the electrode 163. Then, the insulating film 169 which fills spaces between the electrode 163, the electrode 165, and the electrode 167 is formed. After that, the second nitride insulating film 113 is formed over the electrodes 163, 165, and 167 and the insulating film 169 (see FIG. 4A).

The electrode 163, the electrode 165, and the electrode 167 can be formed using a material which is applicable to the electrode 131 or the like in a manner similar to that of the electrode 131 or the like. The insulating film 169 can be formed using a material which is applicable to the interlayer insulating film 155. Further, the insulating film 169 can be formed through a process similar to that of the interlayer insulating film 155 and through polishing treatment such as CMP or etching treatment. The polishing treatment such as CMP or etching treatment is performed until surfaces of the electrode 163, the electrode 165, and the electrode 167 are exposed.

A method for forming the second nitride insulating film of one embodiment of the present invention is described below. The second nitride insulating film 113 is formed of a dense nitride insulating film which has a low hydrogen content. A silicon nitride film or a silicon nitride oxide film which is applicable to the second nitride insulating film 113 can be formed on the following conditions. The substrate placed in a treatment chamber of a plasma CVD apparatus, which is vacuum-evacuated, is held at a temperature higher than or equal to 300° C. and lower than or equal to 400° C., preferably higher than or equal to 320° C. and lower than or equal to 370° C., the pressure in the treatment chamber is set greater than or equal to 20 Pa and less than or equal to 200 Pa, preferably greater than or equal to 30 Pa and less than or equal to 100 Pa by introduction of a source gas into the treatment chamber, and high-frequency power is supplied to an electrode provided in the treatment chamber. At least nitrogen and a deposition gas containing silicon are preferably used as the source gases of the second nitride insulating film 113. Typical examples of the deposition gas containing silicon include silane, disilane, trisilane, and silane fluoride. In order that hydrogen is contained as little as possible in the nitride insulating film formed as the second nitride insulating film 113, ammonia, which contains hydrogen as a composition element, is not used for the source gas or a small amount of ammonia is used. For example, in the case where the second nitride insulating film 113 is formed using a plasma CVD apparatus, the flow rate of the nitrogen supplied to the treatment chamber which is vacuum-evacuated is set to greater than or equal to 10 times and less than or equal to 100 times, preferably greater than or equal to 15 times and less than or equal to 40 times, that of the deposition gas containing silicon supplied to the treatment chamber. The flow rate of the ammonia is greater than or equal to 0.1 times and less than 1 time, preferably greater than or equal to 0.2 times and less than or equal to 0.75 times, that of the deposition gas containing silicon.

The use of ammonia as the source gas promotes decomposition of the deposition gas containing silicon and nitrogen. This is because ammonia is dissociated by plasma energy or heat energy, and energy generated by the dissociation contributes to decomposition of a bond of the deposition gas molecules containing silicon and a bond of nitrogen molecules. Accordingly, a silicon nitride film which is less likely transmit hydrogen and functions as a bather film against hydrogen can be formed.

The second nitride insulating film 113 preferably has a thickness enough to exhibit a sufficient barrier property against hydrogen which is diffused from a portion below the transistor 109 into the oxide semiconductor film 173 of the transistor 109. For example, the second nitride insulating film 113 has a thickness greater than or equal to 5 nm and less than or equal to 100 nm, preferably greater than or equal to 15 nm and less than or equal to 50 nm.

In the case where the second nitride insulating film 113 is formed of a silicon nitride film which is formed using silane, nitrogen, and ammonia as source gases, an increase in thickness of the second nitride insulating film 113 can lead to an improvement in resistance against ESD. For example, the withstand voltage can be 300 V or more when the thickness of the second nitride insulating film 113 is greater than or equal to 300 nm and less than or equal to 400 nm.

An improving in resistance against ESD leads to an improvement in yield of the semiconductor device.

When tungsten is used for the electrodes 163, 165, and 167 in the semiconductor device, oxygen which is contained in the insulating film 171 to be formed later diffuses into the electrodes 163, 165, and 167, and thus there is a possibility that oxygen vacancies of the oxide semiconductor film 173 to be formed later are not reduced adequately. Since the second nitride insulating film 113 functions as a barrier film against hydrogen, the second nitride insulating film 113 is less likely to transmit hydrogen. Further, the second nitride insulating film 113 is also less likely to transmit oxygen, which has a larger atomic radius than hydrogen. Therefore, the second nitride insulating film 113 can prevent oxygen contained in the insulating film 171 from diffusing into the electrodes 163, 165, and 167; thus, oxygen vacancies of the oxide semiconductor film 173 can be sufficiently reduced.

The electrode 165 can also function as a back gate electrode by application of voltage. For example, when the potential is set to GND (or a fixed potential), the electrical characteristics of the transistor 109 to be formed later can be controlled. The electrode 165 has a function of preventing static electricity. Note that in the case where the threshold voltage of the transistor 109 is not required to be controlled by the electrode 165 in order to make the transistor 109 be a normally-off transistor, the electrode 165 is not necessarily provided. In the case where the transistor 109 is used for part of a particular circuit and a problem might be caused by providing the electrode 165, the electrode 165 is not necessarily provided in the circuit.

Figure 4B:
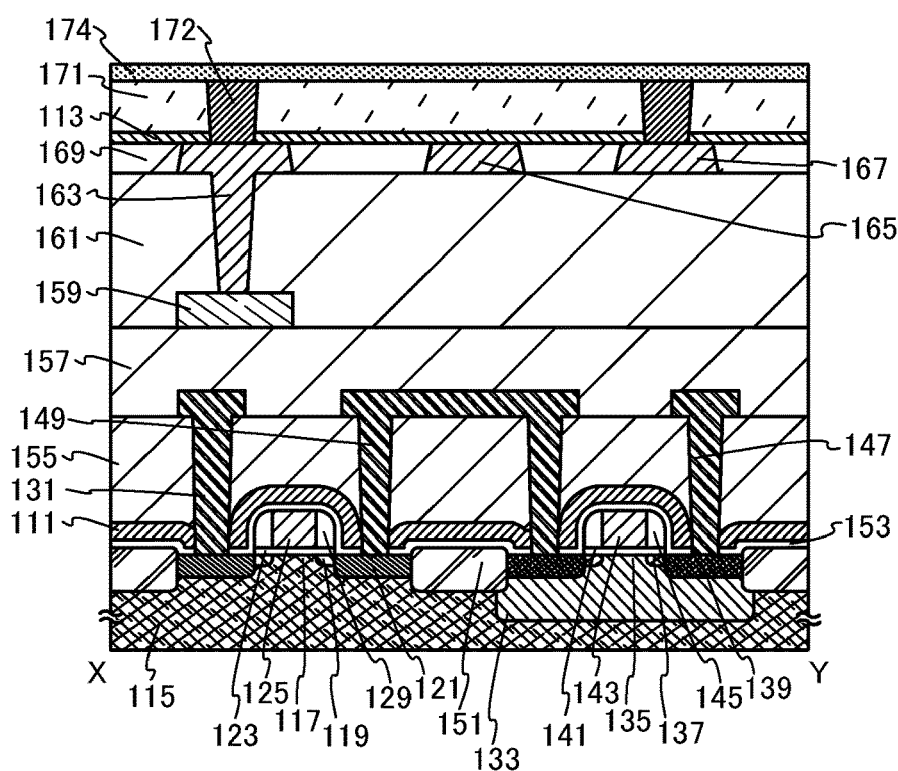

Subsequently, the insulating film 171 and the connection electrode 172 are formed over the second nitride insulating film 113. Then, an oxide semiconductor film 174 is formed over the insulating film 171 and the connection electrode 172 (see FIG. 4B).

In order that the insulating film 171 functions as a base insulating film of the transistor 109 and reduces oxygen vacancies contained in the oxide semiconductor film 173 to be formed later, an insulating film containing oxygen is preferably formed as the insulating film 171. For example, the insulating film 171 is formed by a CVD method or a sputtering method using one insulating film or a stack of insulating films selected from the following: an oxide insulating film such as a silicon oxide film, a gallium oxide film, a hafnium oxide film, an yttrium oxide film, or an aluminum oxide; an oxynitride insulating film such as a silicon oxynitride film or an aluminum oxynitride film; and a nitride oxide insulating film such as a silicon nitride oxide film.

The connection electrode 172 can be formed using a material which is applicable to the electrode 131 in a manner similar to the electrode 131. Note that in the case where the insulating film 171 is formed by performing polishing treatment such as CMP or etching treatment on a formed interlayer insulating film, the polishing treatment or the etching treatment is performed until a surface of the connection electrode 172 is exposed.

In particular, the insulating film 171 preferably includes a region containing oxygen in excess of that in the stoichiometric composition (the region is referred to as an oxygen excess region). This is because by including the oxygen-excess region at least in a region in contact with the oxide semiconductor film 173 to be formed later, the insulating film 171 can supply oxygen to the oxide semiconductor film 174 (or the oxide semiconductor film 173); thus, it is possible that oxygen contained in the insulating film 171 moves to the oxide semiconductor film 174 and the oxygen vacancies are filled. To provide the oxygen-excess region in the insulating film 171, the insulating film 171 may be formed in such a manner that an oxide insulating film is formed in an oxygen atmosphere by a CVD method or a sputtering method. Alternatively, the oxygen-excess region may be formed in such a manner that oxygen is introduced after the insulating film 171 is formed.

The insulating film 171 may be an oxide insulating film which contains oxygen in excess of that in the stoichiometric composition. For example, in the case where the number of oxygen molecules released from an oxide insulating film which is used as the insulating film 171 is greater than or equal to $1.0 \times 10^{18}$ molecules/cm$^3$ when measured by TDS, at least some of the oxygen vacancies contained in the oxide semiconductor film 174 can be filled.

The oxide semiconductor film 174 preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide; tin oxide; zinc oxide; an oxide containing two kinds of metals, such as an In—Zn-based oxide, an Sn—Zn-based oxide, an Al—Zn-based oxide, a Zn—Mg-based oxide, an Sn—Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, an Sn—Ga—Zn-based oxide, an Al—Ga—Zn-based oxide, an Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; an oxide containing four kinds of metals, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by InMO$_3$(ZnO)$_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, In$_2$SnO$_5$(ZnO)$_n$ (n>0, n is a natural number) may be used.

For example, an In—Ga—Zn-based oxide having an atomic ratio where In:Ga:Zn=1:1:1, In:Ga:Zn=1:3:2, In:Ga:Zn=3:1:2, or In:Ga:Zn=2:1:3, or an oxide whose composition is in the neighborhood of the above compositions is preferably used as a target.

The oxide semiconductor film 174 can be formed by a sputtering method, a coating method, a printing method, a pulsed laser deposition method, a laser ablation method, or the like. Alternatively, by using a printing method for forming the oxide semiconductor film 174, the oxide semiconductor film subjected to element isolation can be formed directly. In the case where the oxide semiconductor film is formed by a sputtering method, a power supply device for generating plasma can be an RF power supply device, an AC power supply device, a DC power supply device, or the like as appropriate. As a sputtering gas, a rare gas (typically argon), an oxygen gas, or a mixed gas of a rare gas and oxygen is used as appropriate. In the case of using the mixed gas of a rare gas and oxygen, the proportion of oxygen is preferably higher than that of a rare gas.

Figure 5A:
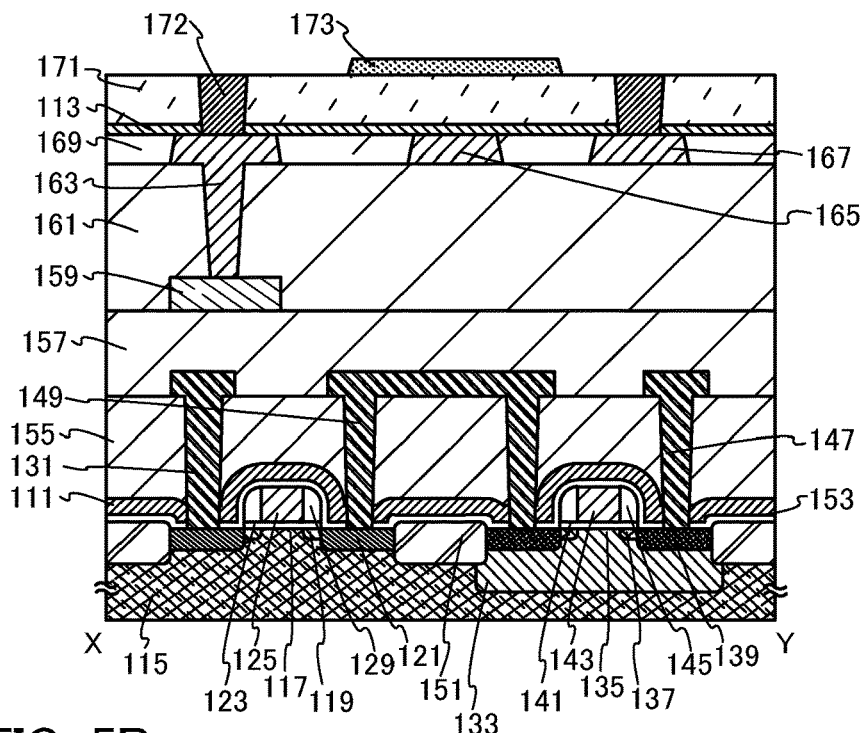
FIGS. 5A and 5B are cross-sectional views illustrating a method for manufacturing a semiconductor device that is one embodiment of the present invention.

Next, a mask is formed over the oxide semiconductor film 174 and etching treatment is performed using the mask to form the oxide semiconductor film 173 (see FIG. 5A). Note that the etching treatment may be either wet etching or dry etching. Alternatively, the etching treatment may be a combination of dry etching and wet etching. The etching conditions (e.g., an etching gas or an etching solution, etching time, and temperature) are set as appropriate depending on the material so that the oxide semiconductor film can be etched to have a desired shape.

The thickness of the oxide semiconductor film 173 is greater than or equal to 1 nm and less than or equal to 100 nm, preferably greater than or equal to 1 nm and less than or equal to 30 nm, further preferably greater than or equal to 1 nm and less than or equal to 50 nm, still further preferably greater than or equal to 3 nm and less than or equal to 20 nm.

It is preferable that the oxide semiconductor film 173 (or the oxide semiconductor film 174) be dehydrogenated or dehydrated by performing heat treatment before the oxide semiconductor film 173 is formed (i.e., after the oxide semiconductor film 174 is formed) and/or after the oxide semiconductor film 173 is formed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like. Alternatively, the heat treatment may be performed in an inert gas atmosphere first, and then in an oxygen atmosphere. The treatment time is 3 minutes to 24 hours.

As a heating apparatus used for the heat treatment, the heating apparatus applicable in the heat treatment performed after the formation of the first nitride insulating film 111 can be used. With the use of an RTA apparatus, the heat treatment can be performed at a temperature of higher than or equal to the strain point of the substrate if the heating time is short. Therefore, the heat treatment time can be shortened.

The heat treatment enables not only the dehydrogenation or dehydration of the oxide semiconductor film 173 (or the oxide semiconductor film 174) but also a reduction of oxygen vacancies of the oxide semiconductor film 173 (or the oxide semiconductor film 174) by moving oxygen which is contained in the insulating film 171 to the oxide semiconductor film 173 (or the oxide semiconductor film 174).

As a way to reduce the oxygen vacancies in the oxide semiconductor film 173, the oxide semiconductor film 173 (or the oxide semiconductor film 174) may be exposed to plasma which is generated in an oxidizing atmosphere before the oxide semiconductor film 173 is formed (i.e., after the oxide semiconductor film 174 is formed) and/or after the oxide semiconductor film 173 is formed. Examples of the oxidizing atmosphere include atmospheres of oxygen, ozone, dinitrogen monoxide, and nitrogen dioxide. Further, in the plasma treatment, the oxide semiconductor film 173 is preferably exposed to plasma which is generated with no bias applied to the substrate 115 side. As a result, the oxide semiconductor film 173 can be supplied with oxygen without being damaged; accordingly, oxygen vacancies in the oxide semiconductor film 173 can be reduced. Moreover, impurities remaining on the surface of the oxide semiconductor film 173 due to the etching treatment, for example, a halogen such as fluorine or chlorine, can be removed. Further, the gate insulating film 179 to be formed later may be exposed to the plasma when the gate insulating film 179 is located over the oxide semiconductor film 173.

For example, the oxide semiconductor film 173 is exposed to oxygen plasma generated in the following manner: dinitrogen monoxide is introduced into a reaction chamber of a plasma CVD apparatus; and a high-frequency power of $2.5 \times 10^{-2}$ W/cm$^2$ is supplied to an upper electrode provided in the reaction chamber with a high-frequency power supply of 27.12 MHz.

Figure 5B:
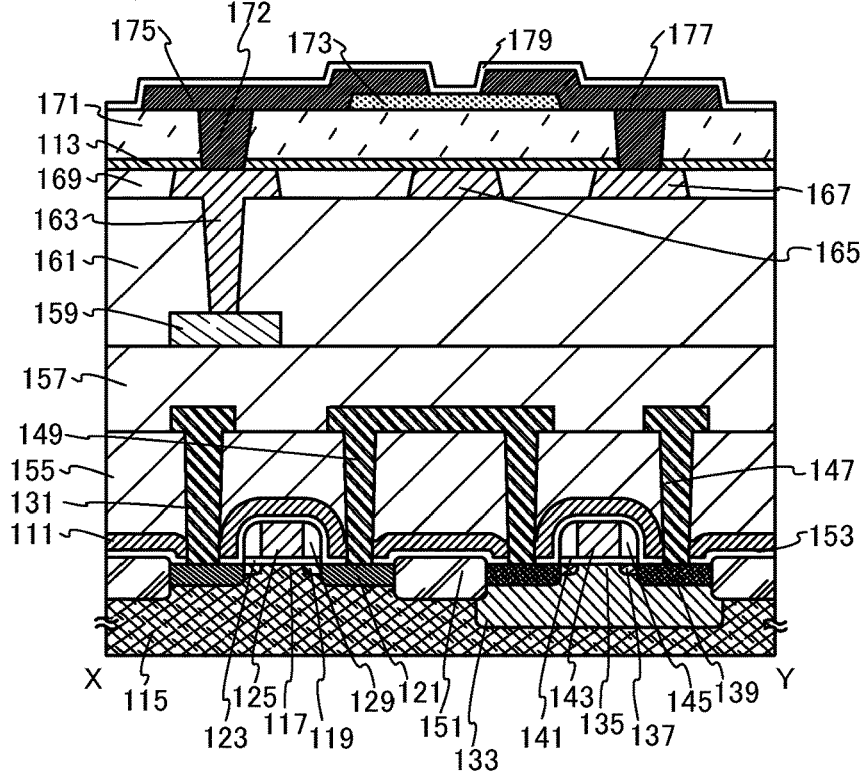

Next, a conductive film is formed to be in contact with at least the oxide semiconductor film 173 and the connection electrode 172. Then, a mask is formed over the conductive film and etching treatment is performed using the mask, whereby the source electrode 175 and the drain electrode 177 are formed. Then, the gate insulating film 179 is formed to be in contact with at least the oxide semiconductor film 173, the source electrode 175, and the drain electrode 177 (see FIG. 5B).

The source electrode 175 and the drain electrode 177 are each formed with a single-layer structure or a stacked-layer structure including any of metals such as aluminum, titanium, chromium, nickel, copper, yttrium, zirconium, molybdenum, silver, tantalum, and tungsten and an alloy containing any of these metals as a main component. A single-layer structure of an aluminum film containing silicon; a two-layer structure in which a titanium film is stacked over an aluminum film; a two-layer structure in which a titanium film is stacked over a tungsten film; a two-layer structure in which a copper film is formed over a copper-magnesium-aluminum alloy film; a three-layer structure in which a titanium film or a titanium nitride film, an aluminum film or a copper film, and a titanium film or a titanium nitride film are stacked in this order; and a three-layer structure in which a molybdenum film or a molybdenum nitride film, an aluminum film or a copper film, and a molybdenum film or a molybdenum nitride film are stacked in this order can be given as examples. Note that a transparent conductive material containing indium oxide, tin oxide, or zinc oxide may be used. A semiconductor film which is doped with an impurity element such as phosphorus and is typified by a polycrystalline silicon film, or a silicide film of nickel silicide or the like can also be used. The conductive film can be formed by a sputtering method, a CVD method, an evaporation method, an electrolytic plating method, a printing method, an ink jet method, or the like. Note that there is no particular limitation on the thickness of the conductive film, and the thickness of the conductive film can be determined in consideration of time needed for the formation, desired resistivity, or the like.

A distance between the source electrode 175 and the drain electrode 177 corresponds to a channel length L of the transistor 109. In the case where the channel length L of the transistor 109 is less than 50 nm, for example, about 30 nm, a developed mask which is obtained by exposing a resist with use of an electron beam is preferably used as a mask for etching the conductive film. At a higher acceleration voltage, an electron beam can provide a more precise pattern. The use of multiple electron beams can shorten the process time per substrate. Here, in an electron beam writing apparatus capable of electron beam irradiation, the acceleration voltage is preferably in the range from 5 kV to 50 kV, for example. The current intensity is preferably in the range from $5 \times 10^{-12}$ A to $1 \times 10^{-11}$ A. The minimum beam size is preferably 2 nm or less. The minimum possible pattern line width is preferably 8 nm or less. Under the above conditions, a pattern with a width of, for example, 30 nm or less, preferably 20 nm or less, more preferably 8 nm or less, can be obtained.

The gate insulating film 179 can be formed with a single-layer structure or a stacked-layer structure using one or more of the following films: a silicon oxide film, a gallium oxide film, a gallium oxide zinc film, a $Ga_2O_3$ $(Gd_2O_3)$ film, a zinc oxide film, an aluminum oxide film, a silicon nitride film, a silicon oxynitride film, an aluminum oxynitride film, and a silicon nitride oxide film. As another material of the gate insulating film 179, an In—Ga—Zn-based oxide film having an insulating property can be given. For example, the In—Ga—Zn-based oxide film having an insulating property may be formed under the following conditions: an oxide target having an atomic ratio of In:Ga:Zn=1:3:2 is used, the substrate temperature is room temperature, and an argon gas or a mixed gas of argon and oxygen is used as the sputtering gas. The gate insulating film 179 preferably includes a region containing oxygen in excess of that in the stoichiometric composition (the region is referred to as an oxygen excess region). Like the insulating film 171, the gate insulating film 179 may be formed using an oxide insulating film which contains oxygen in excess of that in the stoichiometric composition. Alternatively, the gate insulating film 179 may be formed using a nitride insulating film applicable to the second nitride insulating film 113. Moreover, in the case where the gate insulating film 179 is formed using a gallium oxide film, a metal organic chemical vapor deposition (MOCVD) method can be used.

The gate insulating film 179 may be formed using an insulating film of a high-k material, such as a hafnium silicate $(HfSiO_x)$ film, a hafnium silicate film to which nitrogen is added $(HfSi_xO_yN_z)$, a hafnium aluminate film to which nitrogen is added $(HfAl_xO_yN_z)$, a hafnium oxide film, or an yttrium oxide film, so that gate leakage current of the transistor 109 can be reduced.

The gate insulating film 179 can be formed by a sputtering method, a CVD method, an evaporation method, or the like. The thickness of the gate insulating film 179 is greater than or equal to 5 nm and less than or equal to 400 nm, preferably greater than or equal to 10 nm and less than or equal to 300 nm, further preferably greater than or equal to 50 nm and less than or equal to 250 nm.

After the gate insulating film 179 is formed, heat treatment may be performed. The heat treatment can be performed in a manner similar to that of the heat treatment for dehydrogenating or dehydrating the oxide semiconductor film 173. The heat treatment allows oxygen contained in the gate insulating film 179 to move to the oxide semiconductor film 173, thereby reducing the oxygen vacancies included in the oxide semiconductor film 173.

After the source electrode 175 and the drain electrode 177 are formed, cleaning treatment is preferably performed to remove an etching residue. The cleaning treatment can prevent a short circuit between the source electrode 175 and the drain electrode 177. The cleaning treatment can be performed using an alkaline solution such as a tetramethylammonium hydroxide (TMAH) solution, an acidic solution such as a diluted hydrofluoric acid solution or an oxalic acid solution, or water.

Next, the gate electrode 181 is formed over a region of the gate insulating film 179 which overlaps with the oxide semiconductor film 173, and the electrode 183 is formed over a region of the gate insulating film 179 which overlaps with the source electrode 175. The gate electrode 181 and the electrode 183 can be formed in such a manner that a conductive film is formed over the gate insulating film 179, a mask is formed over the conductive film, and etching treatment is performed using the mask (see FIG. 1A).

The gate electrode 181 and the electrode 183 can be formed using a conductive material applicable to the source electrode 175 and the drain electrode 177 in a manner similar to the source electrode 175 and the drain electrode 177.

In order to obtain a normally-off switching element, it is preferable that the threshold voltage of the transistor be made positive by providing a film which is formed of a material having a work function of 5 eV (electron volts) or higher, preferably 5.5 eV or higher, between the gate electrode 181 and the gate insulating film 179. Specifically, a film formed of a material which has an In—N bond and a specific resistivity of $1 \times 10^{-1}$ Ω·cm to $1 \times 10^{-4}$ Ω·cm, preferably $5 \times 10^{-2}$ Ω·cm to $1 \times 10^{-4}$ Ω·cm, is provided between the gate electrode 181 and the gate insulating film 179. Examples of the material include an In—Ga—Zn-based oxide film containing nitrogen, an In—Sn—O film containing nitrogen, an In—Ga—O film containing nitrogen, an In—Zn—O film containing nitrogen, an In—O film containing nitrogen, and a metal nitride film (e.g., an InN film).

In the semiconductor device that is one embodiment of the present invention, the insulating film 185 may be formed over the gate insulating film 179, the gate electrode 181, and the electrode 183. In the case where the transistor 109 is provided in the uppermost part in the semiconductor device, the insulating film 185 is preferably formed using a nitride insulating film which is applicable to the second nitride insulating film 113. Such a structure can prevent hydrogen contained in the air (including a hydrogen compound such as water) from entering the semiconductor device; thus, favorable electrical characteristic of the semiconductor device can be obtained. Further, the reliability of the semiconductor device can be improved.

After the gate insulating film 185 is formed, heat treatment may be performed. The heat treatment can be performed in a manner similar to that of the heat treatment for dehydrogenating or dehydrating the oxide semiconductor film 173. The oxygen vacancies included in the oxide semiconductor film 173 can be reduced by the heat treatment.

Through the above process, the semiconductor device that is one embodiment of the present invention can be manufactured. In the transistor 109 of the semiconductor device, the electrode 165 can function as a back gate electrode; therefore, the transistor 109 can be referred to as a dual-gate transistor. Note that the second nitride insulating film 113 and the insulating film 171 serve as gate insulating films for the back gate electrode.

When the electrode 165 is not provided, the transistor 109 can be a top-gate transistor. Therefore, a dual-gate transistor and a top-gate transistor both can be manufactured over the same substrate by changing the layout without change in the number of steps.

As in the transistor 101 and the transistor 103, sidewalls may be provided in the transistor 109 included in the semiconductor device that is one embodiment of the present invention. Further, a region which has higher conductivity than the channel formation region may be provided in the oxide semiconductor film 173. For example, by addition of an impurity, a region having high conductivity may be formed in each of regions where the oxide semiconductor film 173 is in contact with the source and drain electrode 175 and 177. Examples of the impurity include boron, nitrogen, fluorine, aluminum, phosphorus, arsenic, indium, tin, antimony, helium, neon, argon, krypton, xenon, and the like. Note that in the region having high conductivity, a region which functions as an LDD region may be formed.

The source electrode 175 and the drain electrode 177 are in contact with the top surface of the oxide semiconductor film 173 in the transistor 109 included in the semiconductor device described in this embodiment; alternatively, the source electrode 175 and the drain electrode 177 may be in contact with the bottom surface of the oxide semiconductor film 173.

The positional relation (planar layout) of the transistors included in the semiconductor device that is one embodiment of the present invention can be determined as appropriate. For example, the transistors 101, 103, and 109 can be disposed so that the channel formation regions of the transistors 101 and 103 are orthogonal to the channel formation region of the transistor 109.

All of the interlayer insulating films that are included in the semiconductor device of one embodiment of the present invention are not necessarily planarized. That is, whether or not polishing treatment such as CMP or etching treatment is performed on an interlayer insulating film can be determined as appropriate.

Note that any of the transistors included in the semiconductor device that is one embodiment of the present invention may be a fin-type transistor. In a fin-type structure, part of a semiconductor substrate is processed into a plate-shaped protrusion, and a gate electrode is provided to cross the protrusion in the longitudinal direction. The gate electrode covers top and side surfaces of the protrusion with a gate insulating film positioned between the gate electrode and the protrusion. When the transistor included in the semiconductor device that is one embodiment of the present invention has a fin-type structure, the channel width W can be reduced to achieve higher integration of transistors. Further, on-state current can be increased. Furthermore, control efficiency can be improved; thus, the off-state current and change in the threshold voltage of the transistor can be reduced.

The transistor 101 and the transistor 103 are electrically connected to the transistor 109 via the electrodes 159 and 163 in the semiconductor device that is one embodiment of the present invention; alternatively, the gate electrode 125 of the transistor 101 and the gate electrode 143 of the transistor 103 may be in direct contact with the source electrode 175 of the transistor 109. In such a structure, the interlayer insulating film(s) can be removed as appropriate.

In the semiconductor device that is one embodiment of the present invention, a semiconductor element such as a transistor may be further provided over the transistor 109. In such a case, the semiconductor element may be electrically connected to the transistor 101, the transistor 103, or the transistor 109 as appropriate in such a manner that an interlayer insulating film is provided, an opening is formed in the interlayer insulating film so as to correspond to the connection relation in the circuit, and an electrode is formed in the opening.

The semiconductor device that is one embodiment of the present invention is not limited to the one corresponding to the circuit diagram in FIG. 1B. The semiconductor device may have a structure which corresponds to a circuit which includes at least a transistor including a silicon semiconductor and a transistor including an oxide semiconductor and may have a stacked-layer structure in which a first nitride insulating film and a second nitride insulating film are provided between the transistor including a silicon semiconductor and the transistor including an oxide semiconductor.

As described above, the semiconductor device that is one embodiment of the present invention is the one in which the first nitride insulating film which contains hydrogen and releases hydrogen by heating is provided over the transistors including a silicon semiconductor, and the second nitride insulating film which has a lower hydrogen content than the first nitride insulating film and functions as a barrier film against hydrogen is provided between the first nitride insulating film and the transistor including an oxide semiconductor. Since the first nitride insulating film is provided, hydrogenation treatment can be safely and easily performed on the silicon semiconductor by heat treatment in the manufacturing process of the semiconductor device. Further, since the second nitride insulating film is provided, hydrogen which is released by heat treatment in the manufacturing process of the semiconductor device can be prevented from diffusing into the oxide semiconductor. Thus, according to one embodiment of the present invention, a semiconductor device having favorable electrical characteristics can be manufactured, and a semiconductor device having favorable reliability can be manufactured.

Modification Example 1 of Semiconductor Device

A modification example of the semiconductor device described in Embodiment 1 is described using FIG. 6. When the electrode 163, the electrode 165, and the electrode 167 are formed using a conductive film which is less likely to transmit oxygen or formed by stacking oxide films having a barrier property against oxygen (e.g., a ruthenium oxide film), the second nitride insulating film 113 can be provided between the interlayer insulating film 161 and each of the electrode 163, the electrode 165, and the electrode 167 (see FIG. 6).

Modification Example 2 of Semiconductor Device

Figure 7:
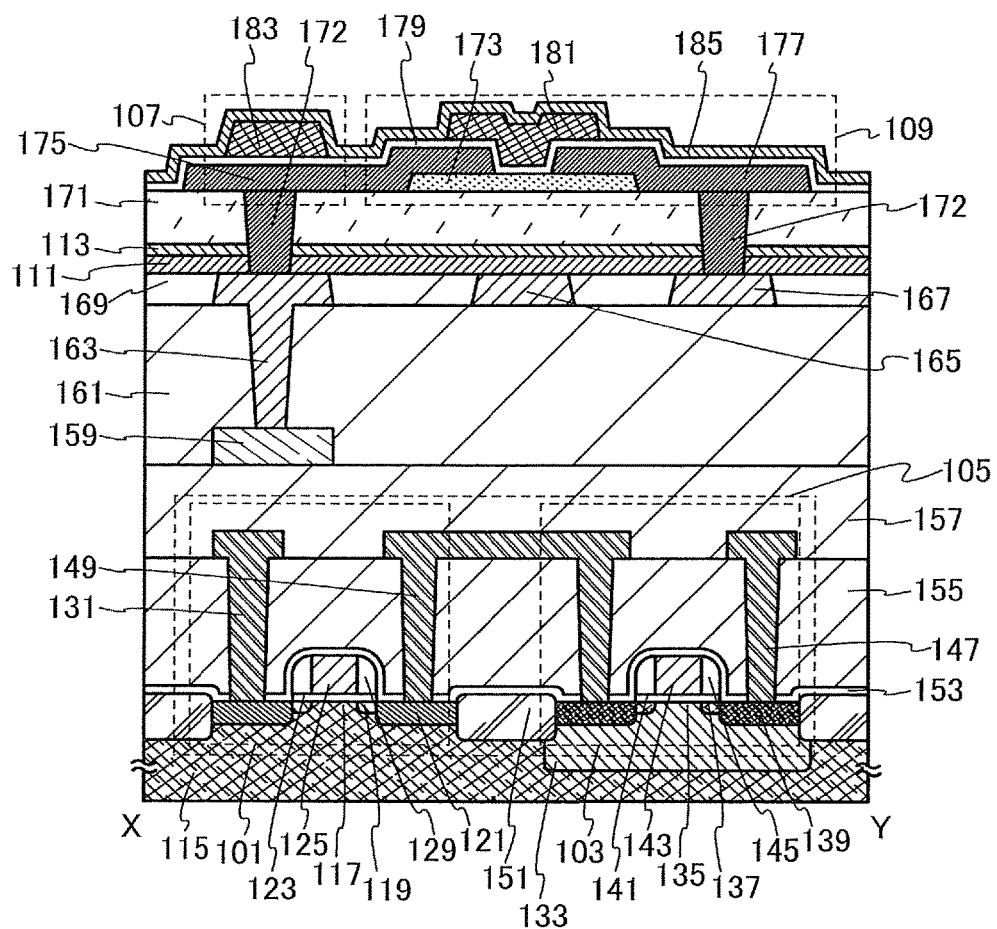
FIG. 7 is a cross-sectional view illustrating a semiconductor device that is one embodiment of the present invention.

A modification example of the semiconductor device described in Embodiment 1 is described using FIG. 7. A semiconductor device described in FIG. 7 is different from the semiconductor device in FIGS. 1A and 1B in that the first nitride insulating film 111 is in contact with the second nitride insulating film 113.

Specifically, the complementary metal oxide semiconductor (CMOS) circuit 105 in which the transistor 101 that is an n-channel transistor including the first semiconductor material and the transistor 103 that is a p-channel transistor are electrically connected to each other is provided in a lower portion; the capacitor 107 and the transistor 109 that is an n-channel transistor including the second semiconductor material are provided over the CMOS circuit 105; the first nitride insulating film 111 which contains hydrogen and releases hydrogen by heating is provided between the transistor 109 and each of the transistor 101 and the transistor 103; and the second nitride insulating film 113 which has a lower hydrogen content than the first nitride insulating film 111 and functions as a barrier film against hydrogen is provided to be stacked over the first nitride insulating film 111.

The element isolation insulating films 151 are provided over the substrate 115 to surround the transistor 101 and the transistor 103. Further, the insulating film 153 is provided to cover the transistors 101 and 103 and the element isolation insulating films 151.

The interlayer insulating film 155 is provided over the insulating film 153.

The first nitride insulating film 111 is provided over the electrodes 163, 165, and 167 and the insulating film 169. The second nitride insulating film 113 is provided in contact with the first nitride insulating film 111, and the insulating film 171 is provided over the second nitride insulating film 113.

The source electrode 175 is connected to the electrode 163 via the connection electrode 172 which is provided in an opening formed in the first nitride insulating film 111, the second nitride insulating film 113, and the insulating film 171. The source electrode 175 is electrically connected to the gate electrode 125 of the transistor 101 and the gate electrode 143 of the transistor 103.

The drain electrode 177 is connected to the electrode 167 via the connection electrode 172 which is provided in an opening formed in the first nitride insulating film 111, the second nitride insulating film 113, and the insulating film 171.

The other structure is the same as that shown in Embodiment 1.

Method for Manufacturing Modification Example 2 of Semiconductor Device

Next, a method for manufacturing the modification example of the semiconductor device is described with reference to FIGS. 4A and 4B to FIG. 6, FIGS. 8A to 8C, and FIG. 9.

Figure 8A:
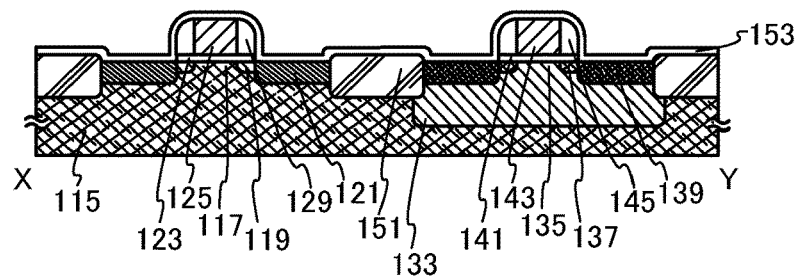
FIGS. 8A to 8C are cross-sectional views illustrating a method for manufacturing a semiconductor device that is one embodiment of the present invention.
Figure 8B:
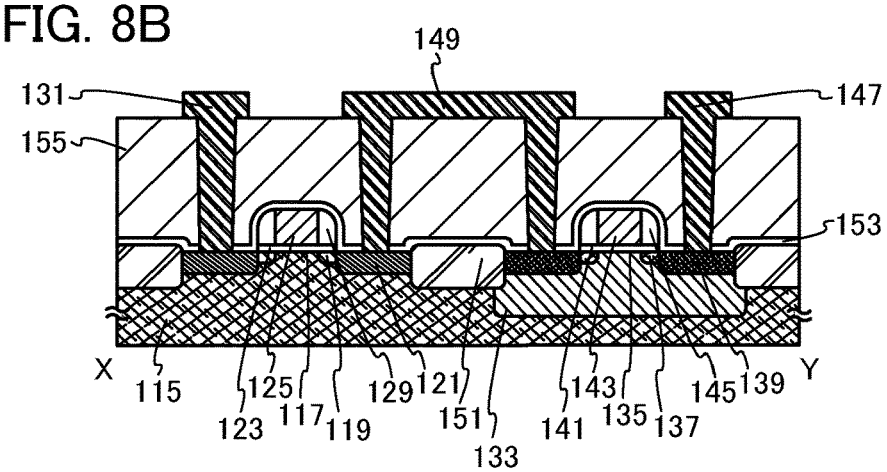
Figure 8C:
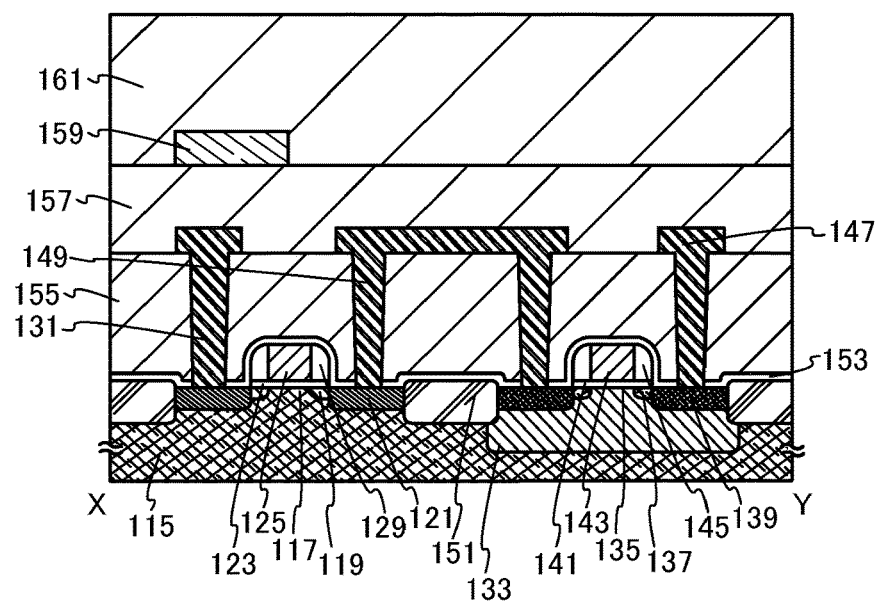
Figure 9:
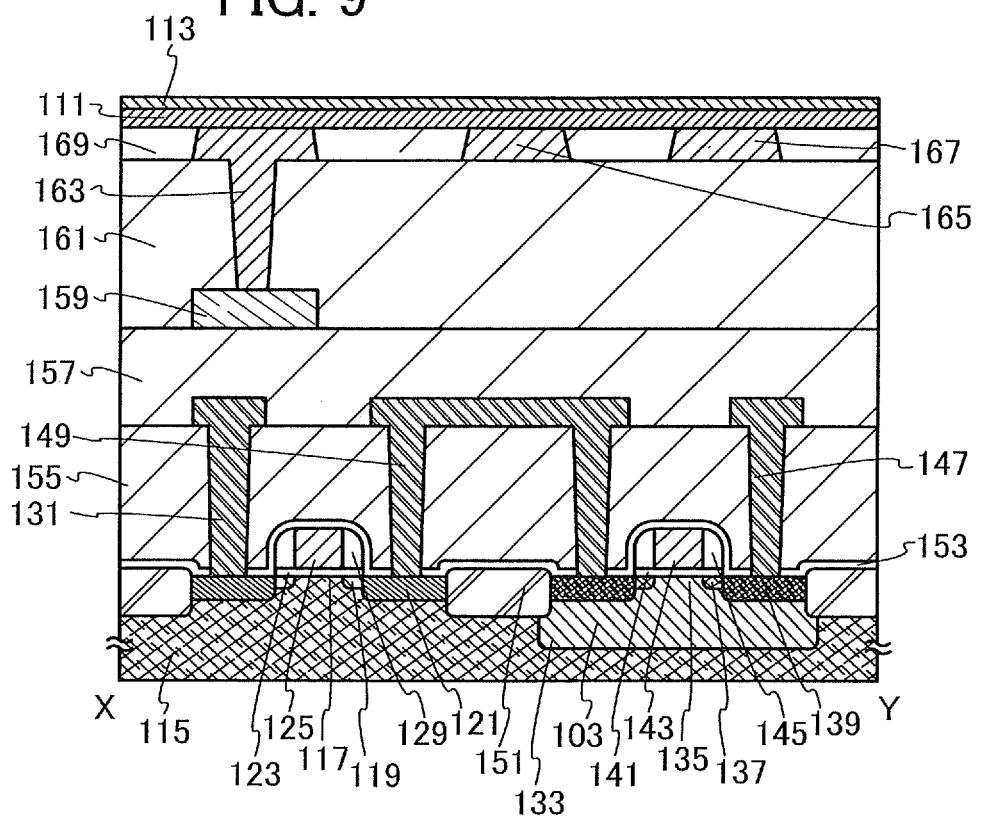
FIG. 9 is a cross-sectional view illustrating a method for manufacturing a semiconductor device that is one embodiment of the present invention.

Through a process which is the same as that in Embodiment 1, the transistor 101 and the transistor 103 are manufactured as illustrated in FIG. 8A. Then, the insulating film 153 is formed over the transistor 101 and the transistor 103.

Next, the interlayer insulating film 155 is formed over the insulating film 153. After that, the electrode 131, the electrode 147, and the electrode 149 are formed (see FIG. 8B).

Next, the interlayer insulating film 157 is formed over the interlayer insulating film 155, the electrode 131, the electrode 147, and the electrode 149. An opening reaching the gate electrode 125 and the gate electrode 143 is formed in the interlayer insulating film 157 (not illustrated), and the electrode 159 is formed in and over the opening. Then, the interlayer insulating film 161 is formed over the interlayer insulating film 157 and the electrode 159 (see FIG. 8C).

Next, an opening reaching the electrode 159 is formed in the interlayer insulating film 161 and the electrode 163 is formed in and over the opening. The electrode 165 and the electrode 167 can be formed at the same time as the formation of the electrode 163. Then, the insulating film 169 which fills spaces between the electrode 163, the electrode 165, and the electrode 167 is formed. The first nitride insulating film 111 is formed over the electrodes 163, 165, and the electrode 167 and the insulating film 169, and the second nitride insulating film 113 is formed over the first nitride insulating film 111 (see FIG. 9).

It is preferable that the first nitride insulating film 111 have such a thickness that the first nitride insulating film 111 contains hydrogen enough to sufficiently perform hydrogenation treatment on at least the channel formation regions 117 and 135 of the transistors 101 and 103. For example, the thickness of the first nitride insulating film 111 is greater than or equal to 50 nm and less than or equal to 1000 nm, preferably greater than or equal to 100 nm and less than or equal to 500 nm.

The first nitride insulating film 111 can be formed using a formation method which is similar to that of the nitride insulating film 111 described in Embodiment 1 as appropriate.

The second nitride insulating film 113 preferably has a thickness enough to exhibit a sufficient barrier property against hydrogen which is diffused from a portion below the transistor 109 into the oxide semiconductor film 173 of the transistor 109. For example, the second nitride insulating film 113 has a thickness greater than or equal to 5 nm and less than or equal to 100 nm, preferably greater than or equal to 15 nm and less than or equal to 50 nm.

The second nitride insulating film 113 can be formed using a formation method which is similar to that of the nitride insulating film 113 described in Embodiment 1 as appropriate.

After that, the steps of FIG. 4B to FIG. 6 are performed in a manner similar to those in Embodiment 1, so that the insulating film 171, the connection electrode 172, the transistor 109, the capacitor 107, and the insulating film 185 can be formed.

Modification Example 3 of Semiconductor Device

The semiconductor device that is one embodiment of the present invention may have the structure of the modification example 2 of the semiconductor device in which an oxide insulating film is provided between the first nitride insulating film 111 and the second nitride insulating film 113 so as to be in contact with the first nitride insulating film 111 and the second nitride insulating film 113. The oxide insulating film can be a silicon oxide film or a silicon oxynitride film.

In the semiconductor device that is one embodiment of the present invention, the second nitride insulating film 113 has a lower hydrogen concentration than the first nitride insulating film 111 and is formed of a dense nitride insulating film. Therefore, the second nitride insulating film 113 functions as a barrier film against hydrogen. In the case where the first nitride insulating film 111 which is formed of a nitride insulating film containing hydrogen is provided in contact with the second nitride insulating film 113, depending on the formation method of the second nitride insulating film 113, hydrogen which is contained in the first nitride insulating film 111 might be mixed into the second nitride insulating film 113 to increase the hydrogen concentration of the second nitride insulating film 113. Therefore, the oxide insulating film is provided between the first nitride insulating film 111 and the second nitride insulating film 113 as described above, whereby the hydrogen contained in the first nitride insulating film 111 can be prevented from mixing into the second nitride insulating film 113 at the time of forming the second nitride insulating film 113, and thus the second nitride insulating film 113 can sufficiently function as a barrier film against hydrogen.

Modification Example 4 of Semiconductor Device

Figure 10A:
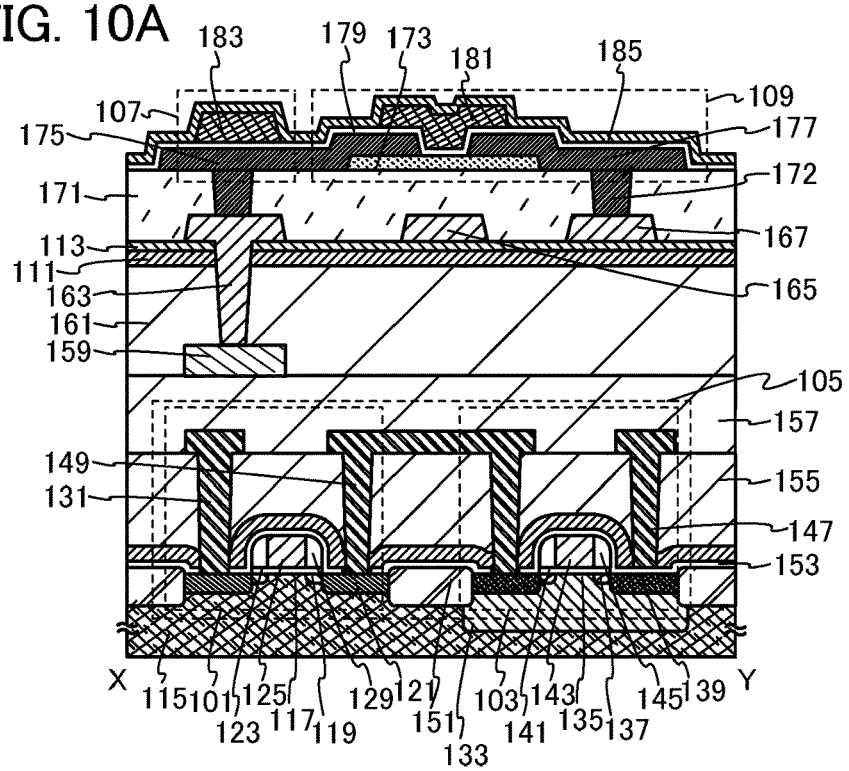
FIGS. 10A and 10B are each a cross-sectional view illustrating a semiconductor device that is one embodiment of the present invention.
Figure 10B:
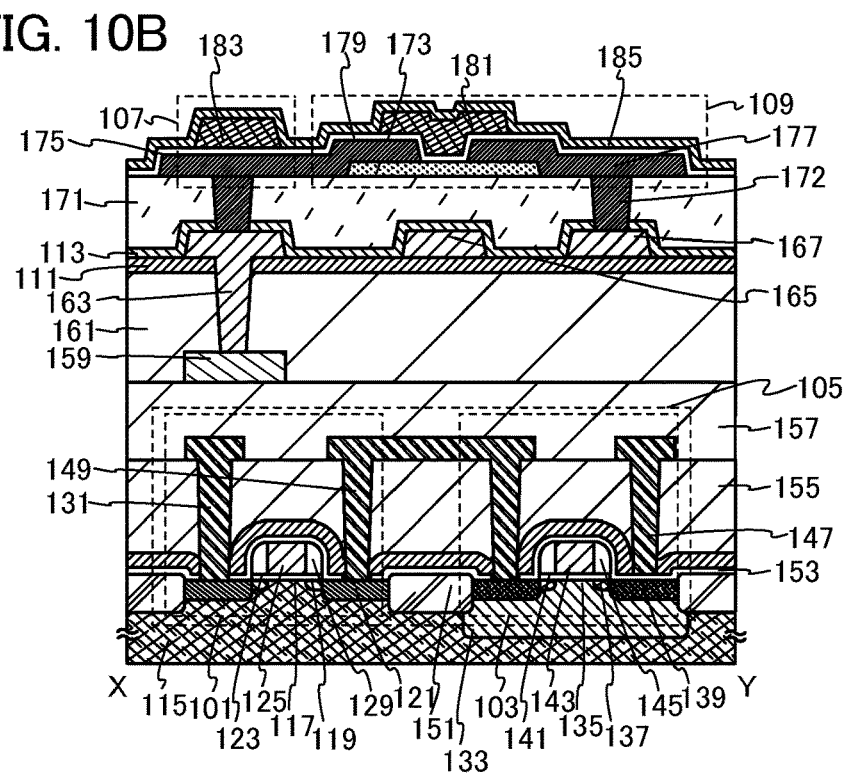

The structures of Modification Examples 2 and 3 of the semiconductor device are not limited to the structure illustrated in FIG. 7. For example, when the electrode 163, the electrode 165, and the electrode 167 are formed using a conductive film which is less likely to transmit oxygen or formed by stacking oxide films having a barrier property against oxygen (e.g., a ruthenium oxide film), the first nitride insulating film 111 and the second nitride insulating film 113 can be provided between the interlayer insulating film 161 and each of the electrode 163, the electrode 165, and the electrode 167 (see FIG. 10A). Alternatively, the electrodes 163, 165, and 167 may be provided between the first nitride insulating film 111 and the second nitride insulating film 113 (see FIG. 10B). Any of such structures enables prevention of oxidation of the electrodes 163, 165, and 167, thereby preventing an increase in resistance values of the electrodes 163, 165, and 167.

Note that the structures, methods, and the like described in this embodiment can be used as appropriate in combination with any of the structures, methods, and the like described in the other embodiments and examples.

Embodiment 2

Figure 11A:
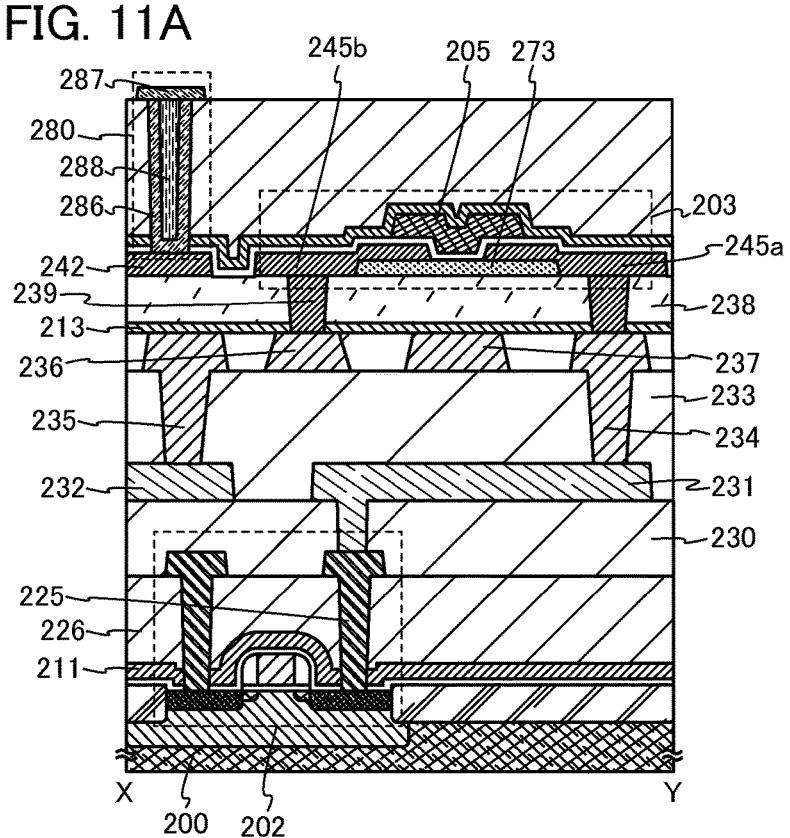
FIGS. 11A to 11C are a cross-sectional view and circuit diagrams illustrating a semiconductor device that is one embodiment of the present invention.
Figure 11B:
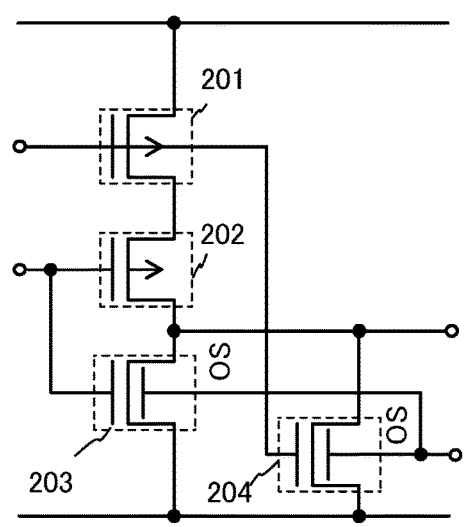
Figure 11C:
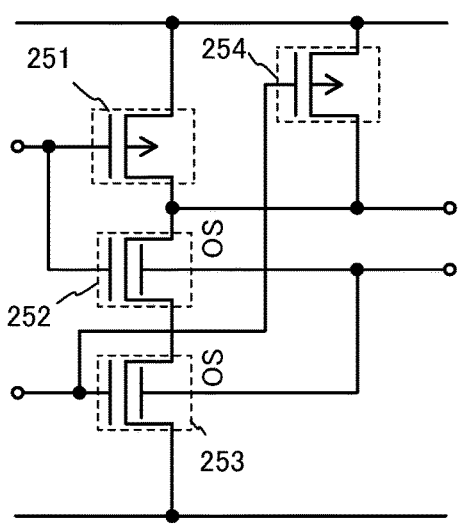

As another example of the semiconductor device that is one embodiment of the present invention, an example of a cross-sectional view of a NOR circuit, which is a logic circuit, is illustrated in FIG. 11A. FIG. 11B is a circuit diagram of the NOR circuit in FIG. 11A, and FIG. 11C is a circuit diagram of a NAND circuit.

Figure 12:
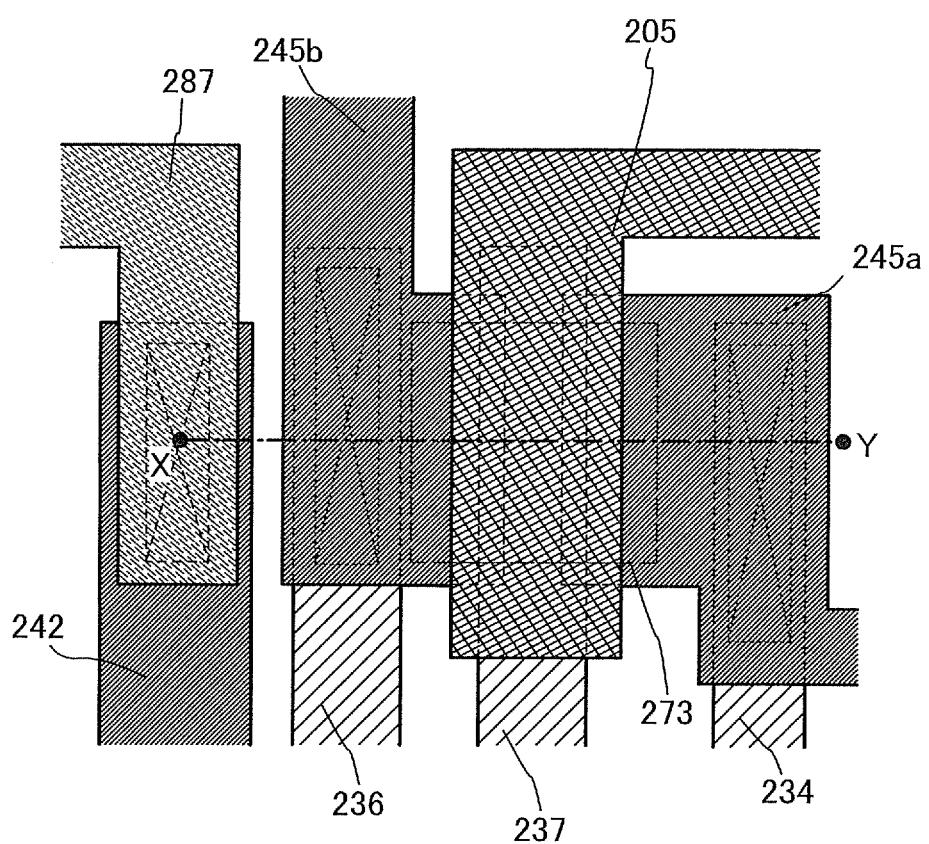
FIG. 12 is a top view illustrating a semiconductor device that is one embodiment of the present invention.

FIG. 11A is a cross-sectional view of part of the NOR circuit, specifically, a cross-sectional view of transistors 202 and 203 which are a p-channel transistor and an n-channel transistor, respectively. FIG. 12 is a top view of the part of the NOR circuit. The cross-sectional view illustrated in FIG. 11A corresponds to a cross section taken along a dashed dotted line X-Y in the top view in FIG. 12. In the top view in FIG. 12, some components (the transistor 202, a first nitride insulating film 211, a second nitride insulating film 213, other gate insulating films and interlayer insulating films, and the like) are not illustrated for clarification of the drawing.

The structure of the semiconductor device of this embodiment is partly different from that of the semiconductor device described in Embodiment 1 and can be manufactured as appropriate using the method for manufacturing the semiconductor device described in Embodiment 1.

In other words, the semiconductor of this embodiment includes a plurality of transistors, and some of the transistors are stacked in the longitudinal direction in order to increase the degree of integration. In the semiconductor device in FIG. 11A which corresponds to the NOR circuit diagram in FIG. 11B, the first nitride insulating film 211 which contains hydrogen and releases hydrogen by heating is provided over transistors 201 and 202 which are p-channel transistors, and the second nitride insulating film 213 which has a lower hydrogen content than the first nitride insulating film 211 and functions as a barrier film against hydrogen is provided between the first nitride insulating film 211 and each of the transistor 203 and a transistor 204.

In the semiconductor device illustrated in FIG. 11A, a single crystal silicon substrate is used as a substrate 200, the transistor 202 is provided on the single crystal silicon substrate, and the transistor 203 including an oxide semiconductor is stacked over the transistor 202. Although not illustrated, the transistor 201 can be provided on the substrate 200 on which the transistor 202 is provided. Further, although not illustrated, the transistor 204 including an oxide semiconductor can be provided over the transistor 202.

The first nitride insulating film 211 provided over the transistor 202 has the same structure as the first nitride insulating film 111 of the semiconductor device described in Embodiment 1. Therefore, also in the semiconductor device described in this embodiment, at least defects (dangling bonds) included in the single crystal silicon substrate where channel formation regions of the transistors 201 and 202 are formed can be repaired by heat treatment.

The second nitride insulating film 213 provided between the first nitride insulating film 211 and the transistor 203 has the same structure as the second nitride insulating film 113 of the semiconductor device described in Embodiment 1. Therefore, also in the semiconductor device described in this embodiment, hydrogen which exists in a portion located below the transistor 203 and including the first nitride insulating film 211 can be prevented from diffusing into the oxide semiconductor film (at least the channel formation region) of the transistor 203 as an impurity.

In FIG. 11A, the transistor 202 has the same structure as the transistor 103 of the semiconductor device described in Embodiment 1. Further, the transistor 203 has the same structure as the transistor 109 of the semiconductor device described in Embodiment 1. Therefore, Embodiment 1 can be referred to for details of the transistor 202 and the transistor 203. Here, different structures from those of the semiconductor device described in Embodiment 1 are described. Note that the transistor 201 and the transistor 204 have the same structures as the transistor 103 and the transistor 109 of the semiconductor device described in Embodiment 1, respectively.

An electrode 225 of the transistor 202 is electrically connected to a source electrode 245a of the transistor 203 via an electrode 231, an electrode 234, and a connection electrode 239. The electrode 231 is provided in and over an opening formed in an interlayer insulating film 230. The electrode 234 is formed in and over an opening formed in an interlayer insulating film 233. Note that a drain electrode 245b of the transistor 203 is electrically connected to an electrode 236 via the connection electrode 239.

An electrode 232 is formed in an opening (not illustrated) formed in the interlayer insulating film 230. An electrode 235 is formed in and over an opening formed in the interlayer insulating film 233.

A gate electrode 205 of the transistor 203 is electrically connected to the electrode 232 via the electrode 235, and electrically connected to a gate electrode of the transistor 202 via the electrode 235 and the electrode 232. Further, the gate electrode 205 of the transistor 203 is electrically connected to an electrode 280. The electrode 280 is electrically connected to an electrode 242. Note that the electrode 280 includes a first barrier metal film 286, a second barrier metal film 287, and a low-resistance conductive film 288 which is surrounded by the first bather metal film 286 and the second barrier metal film 287.

The electrode 280 can be formed in the following manner. First, an interlayer insulating film 285 is formed, an opening reaching the electrode 242 is formed in the interlayer insulating film 285, the first barrier metal film 286 is formed, and the low-resistance conductive film 288 is formed there-over. After that, polishing for planarization is performed to expose at least a surface of the low-resistance conductive film 288. To protect the exposed low-resistance conductive film 288, the second barrier metal film 287 is formed.

As the low-resistance conductive film 288, a copper film or a copper alloy film can be used. Each of the first barrier metal film 286 and the second barrier metal film 287 can be formed using a conductive material which prevents diffusion of copper contained in the low-resistance conductive film 288. Examples of the conductive material include a tantalum nitride film, a molybdenum nitride film, and a tungsten nitride film.

Further, when voltage can be applied to an electrode 237 which is provided over the interlayer insulating film 233 and can be formed in the same process as the electrodes 234, 235, and 236, the electrode 237 can also function as a back gate electrode of the transistor 203.

In the case where an insulating film containing oxygen is used as an interlayer insulating film 238 to reduce oxygen vacancies in an oxide semiconductor film 273 of the transistor 203, oxygen which is contained in the interlayer insulating film 238 can be prevented from diffusing downward from the interlayer insulating film 238 (e.g., to the electrodes 234, 235, 236, and 237) because the second nitride insulating film 213 is less likely to transmit oxygen as well as hydrogen; accordingly, the oxygen vacancies in the oxide semiconductor film 273 can be reduced sufficiently. Thus, the transistor 203 having favorable electrical characteristics and favorable reliability can be obtained. Further, a semiconductor device having favorable electrical characteristics and favorable reliability can be obtained.

Since the transistor which includes the channel formation region in the silicon semiconductor region and operates at a high speed and the transistor which includes the channel formation region in the oxide semiconductor film and has a small off-state current are provided in the semiconductor device in FIG. 11A, the operation speed of the semiconductor device can be high and power consumption thereof can be sufficiently reduced.

In a manner similar to that of the semiconductor device described in Embodiment 1, the semiconductor device illustrated in FIGS. 11A to 11C and FIG. 12 does not necessarily have the structure in FIGS. 11A to 11C and FIG. 12. For example, when the electrode 234, the electrode 235, the electrode 236, and the electrode 237 are formed using a conductive film from which is less likely to transmit oxygen or formed by stacking oxide films having a bather property against oxygen (e.g., a ruthenium oxide film), the second nitride insulating film 213 can be provided between the interlayer insulating film 233 and each of the electrode 234, the electrode 235, the electrode 236, and the electrode 237 (see FIG. 13).

In the NAND circuit illustrated in FIG. 11C, transistors 251 and 254 which are p-channel transistors each have the same structure as the transistor 103 illustrated in FIG. 1A, in which a channel formation region is formed in a silicon semiconductor region. Transistors 252 and 253 which are n-channel transistors each have the same structure as the transistor 109 illustrated in FIG. 1A, in which a channel formation region is formed in an oxide semiconductor film. Embodiment 1 can be referred to for details of the transistors 103 and 109. Note that the NAND circuit illustrated in FIG. 11C differs in the connection relation from the NOR circuit in FIG. 11B; therefore, the above description can be referred to for a cross-sectional structure of the NAND circuit and a stacked-layer structure of the transistors in the NAND circuit.

Modification Example 1 of Semiconductor Device

Figure 14A:
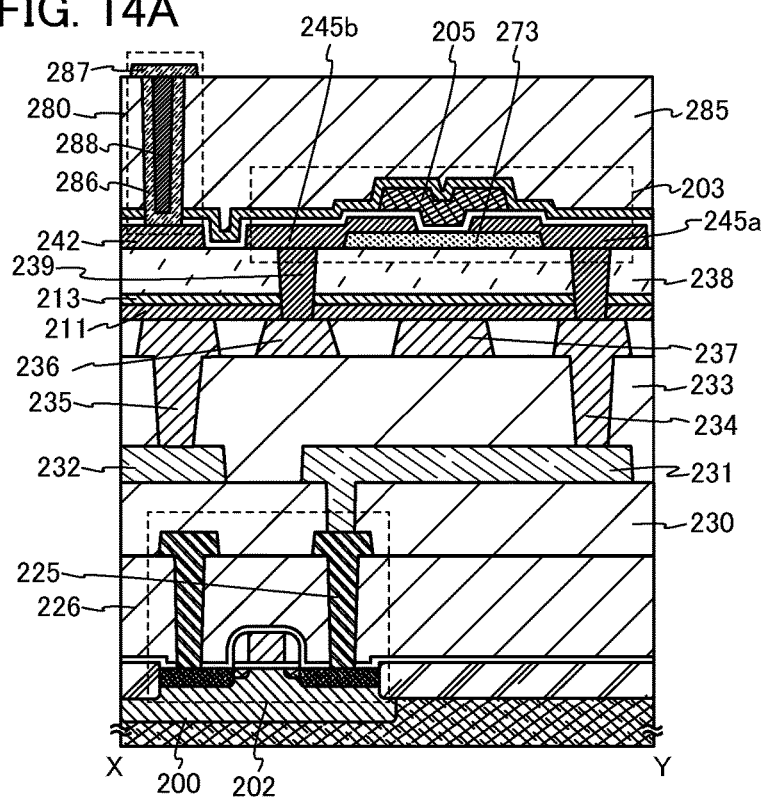
FIGS. 14A to 14C are a cross-sectional view and circuit diagrams illustrating a semiconductor device that is one embodiment of the present invention.
Figure 14B:
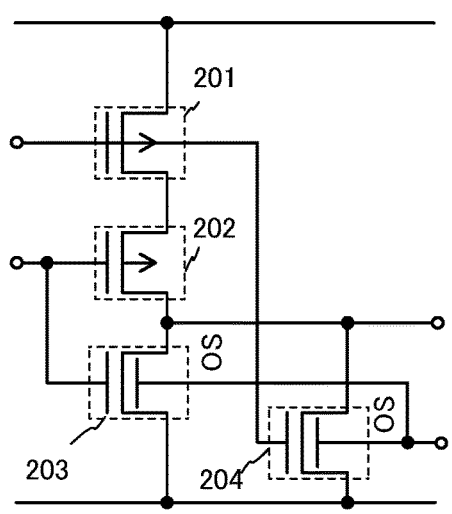
Figure 14C:
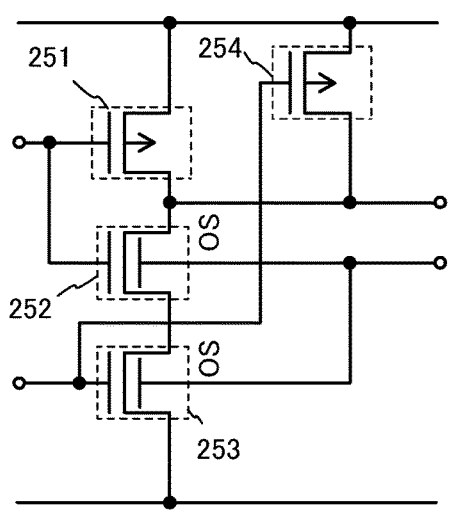

A modification example of the semiconductor device described in this embodiment is illustrated in FIGS. 14A to 14C. In the semiconductor device corresponds to the NOR circuit in FIG. 14A, the first nitride insulating film 211 which contains hydrogen and releases hydrogen by heating is provided between the transistors 201 and 202 which are p-channel transistors and the transistors 203 and 204, and the second nitride insulating film 213 which has a lower hydrogen content than the first nitride insulating film 211 and functions as a barrier film against hydrogen is provided over the first nitride insulating film 211.

Figure 15A:
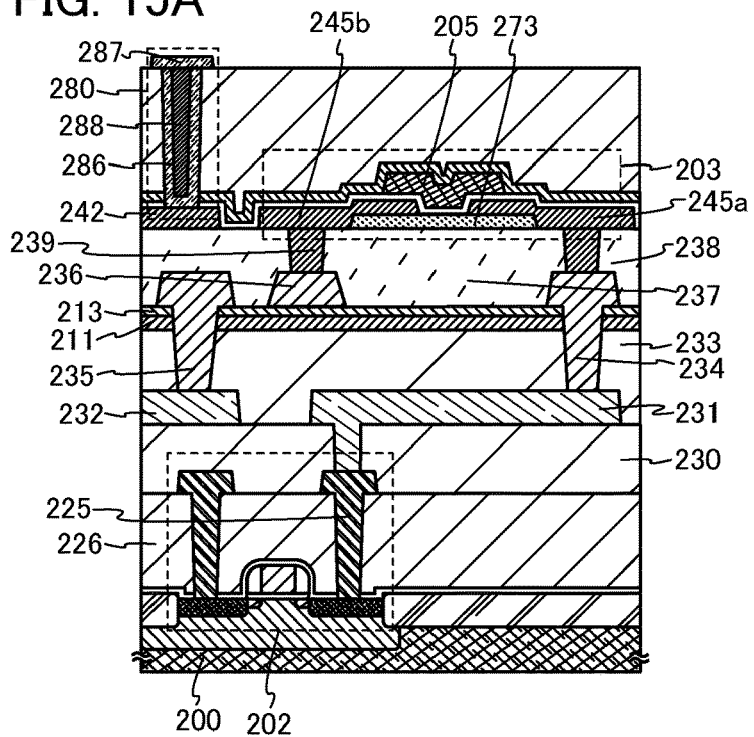
FIGS. 15A and 15B are each a cross-sectional view illustrating a semiconductor device that is one embodiment of the present invention.
Figure 15B:
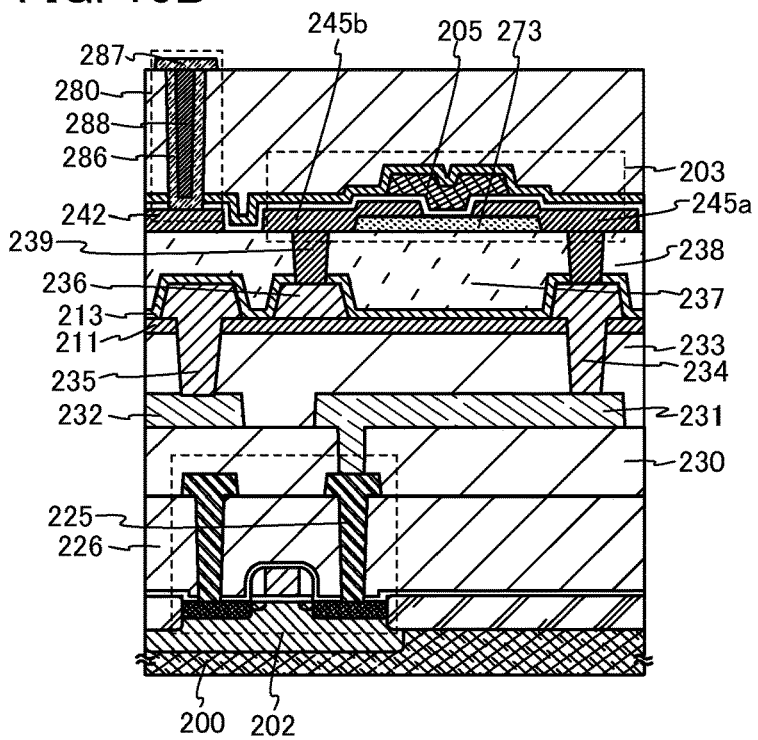

When the electrode 234, the electrode 235, the electrode 236, and the electrode 237 are formed using a conductive film which is less likely to transmit oxygen or formed by stacking conductive films having a barrier property against oxygen in the semiconductor device illustrated in FIGS. 14A to 14C, the second nitride insulating film 213 can be provided between the interlayer insulating film 233 and each of the electrode 234, the electrode 235, the electrode 236, and the electrode 237 (see FIG. 15A). Alternatively, the electrode 234, the electrode 235, and the electrode 236 may be provided between the first nitride insulating film 211 and the second nitride insulating film 213 (see FIG. 15B).

Modification Example 2 of Semiconductor Device

Although the NOR circuit and the NAND circuit are described as examples in this embodiment, this embodiment is not particularly limited thereto. An AND circuit, an OR circuit, or the like can be formed using a transistor including a silicon semiconductor and a transistor including an oxide semiconductor. For example, a semiconductor device (memory device) which can hold data even when not being supplied with power and can perform writing operation any number of times without limitation can be manufactured using a transistor including a silicon semiconductor and a transistor including an oxide semiconductor.

Figure 16:
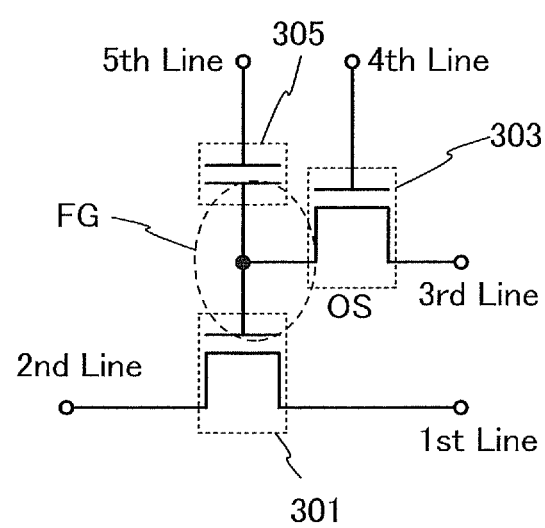
FIG. 16 is a circuit diagram illustrating a semiconductor device that is one embodiment of the present invention.

FIG. 16 illustrates a circuit diagram of the semiconductor device (also referred to as a memory element or a memory cell).

In FIG. 16, a first wiring (1st Line) is electrically connected to a source electrode of a transistor 301 which is an n-channel transistor. A second wiring (2nd Line) is electrically connected to a drain electrode of the transistor 301. As the transistor 301, the transistor 101 or the transistor 103 described in Embodiment 1 can be used.

A third wiring (3rd Line) is electrically connected to one of a source electrode and a drain electrode of a transistor 303, and a fourth wiring (4th Line) is electrically connected to a gate electrode of the transistor 303. A gate electrode of the transistor 301 and one of a source electrode and a drain electrode of the transistor 303 are electrically connected to one electrode of a capacitor 305. A fifth wiring (5th line) is electrically connected to the other electrode of the capacitor 305.

The transistor 109 described in Embodiment 1 can be used as the transistor 303. Note that the capacitor 107 described in Embodiment 1 can be used as the capacitor 305.

The semiconductor device having the circuit configuration in FIG. 16 utilizes a characteristic in which the potential of the gate electrode of the transistor 301 can be held, and thus enables data writing, holding, and reading as follows.

Writing and holding of data are described. First, the potential of the fourth wiring is set to potential at which the transistor 303 is turned on, so that the transistor 303 is turned on. Accordingly, the potential of the third wiring is supplied to the gate electrode of the transistor 301 and to the capacitor 305. In other words, a predetermined charge is supplied to the gate electrode of the transistor 301 (writing). Here, charge for supplying either of two different potential levels (hereinafter referred to as low-level charge and high-level charge) is given. After that, the potential of the fourth wiring is set to a potential at which the transistor 303 is off, so that the transistor 303 is turned off. Thus, the charge supplied to the gate electrode of the transistor 301 is held (holding).

Since the off-state current of the transistor 303 is extremely low, the charge of the gate electrode of the transistor 301 is held for a long time.

Next, reading of data is described. By supplying an appropriate potential (reading potential) to the fifth wiring with a predetermined potential (constant potential) supplied to the first wiring, the potential of the second wiring varies depending on the amount of charge held in the gate electrode of the transistor 301. This is because in general, when the transistor 301 is an n-channel transistor, an apparent threshold voltage $V_{th\_H}$ in the case where the high-level charge is given to the gate electrode of the transistor 301 is lower than an apparent threshold voltage $V_{th\_L}$ in the case where the low-level charge is given to the gate electrode of the transistor 301. Here, the apparent threshold voltage refers to the potential of the fifth wiring, which is needed to turn on the transistor 301. Thus, the potential of the fifth wiring is set to a potential $V_0$ that is between $V_{th\_H}$ and $V_{th\_L}$, whereby charge applied to the gate electrode of the transistor 301 can be determined. For example, in the case where the high-level charge is given in writing, when the potential of the fifth wiring is set to $V_0$ ($>V_{th\_H}$), the transistor 301 is turned on. In the case where the low-level charge is given in writing, even when the potential of the fifth wiring is set to $V_0$ ($<V_{th\_L}$), the transistor 301 remains in an off state. Therefore, the stored data can be read by the potential of the second wiring.

Note that in the case where memory cells are arrayed to be used, only data of desired memory cells needs to be read. In the case where reading is not performed in this manner, a potential at which the transistor 301 is turned off regardless of the state of the gate electrode of the transistor 301, that is, a potential smaller than $V_{th\_H}$ may be supplied to the fifth wiring. Alternatively, a potential at which the transistor 301 is turned on regardless of the state of the gate electrode of the transistor 301, that is, a potential higher than $V_{th\_L}$ may be supplied to the fifth wiring.

Figure 17:
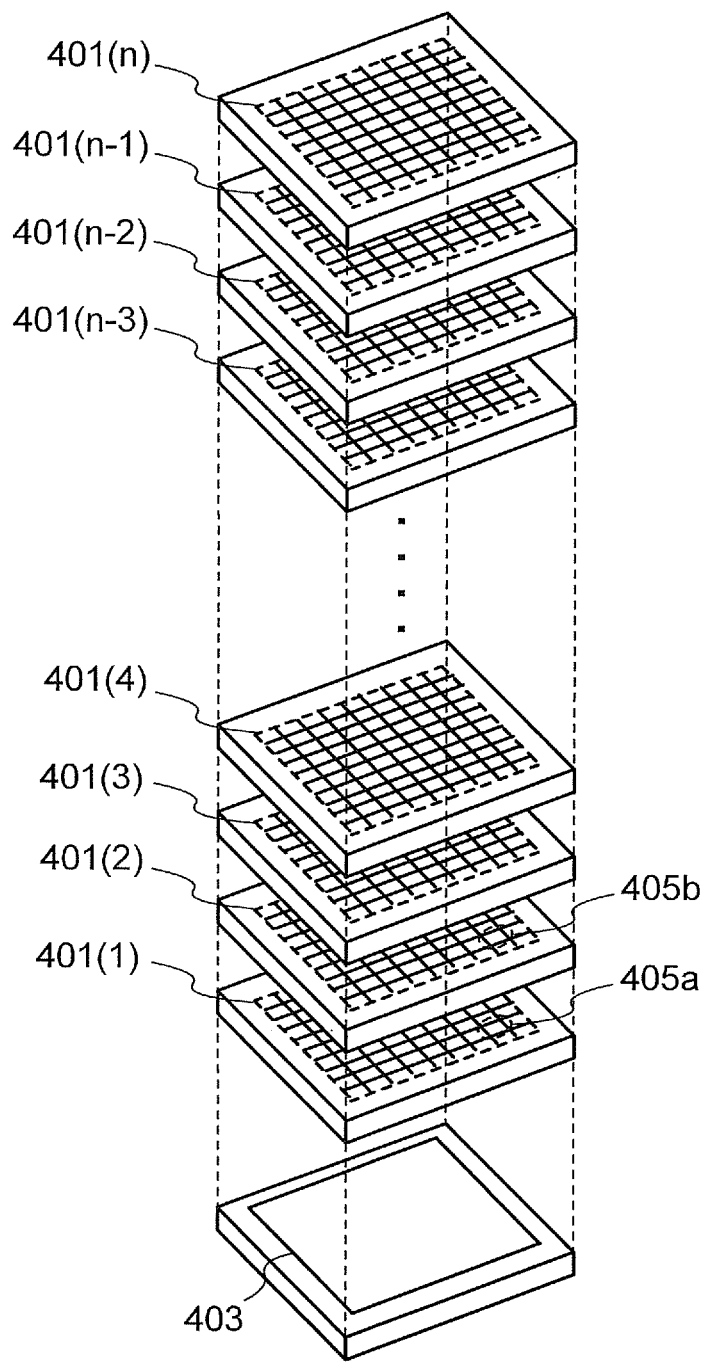
FIG. 17 is a perspective view illustrating a semiconductor device that is one embodiment of the present invention.

FIG. 17 illustrates an example of one mode of a semiconductor device which is different from the semiconductor device illustrated in FIG. 16.

FIG. 17 is a perspective view of the semiconductor device. The semiconductor device illustrated in FIG. 17 includes a plurality of layers of memory cell arrays (memory cell arrays 401(1) to 401(n) (n is an integer greater than or equal to 2)) each including a plurality of memory cells as memory circuits in an upper portion, and a logic circuit 403 in the lower portion which is necessary for operating the memory cell arrays 401(1) to 401(n).

FIG. 17 illustrates the logic circuit 403, the memory cell array 401(1), and the memory cell array 401(2), and illustrates a memory cell 405a and a memory cell 405b as typical examples among the plurality of memory cells included in the memory cell array 401(1) and the memory cell array 401(2). The memory cell 405a and the memory cell 405b can have a configuration similar to the circuit configuration described in this embodiment with reference to FIG. 16, for example.

A transistor in which a channel formation region is formed in an oxide semiconductor film is used as each transistor included in the memory cells 405a and 405b. The transistor in which a channel formation region is formed in an oxide semiconductor film has a structure similar to that described in Embodiment 1.

The logic circuit 403 includes a transistor in which a semiconductor material other than an oxide semiconductor is used for a channel formation region. For example, the transistor including a silicon semiconductor described in Embodiment 1 (the transistor 101 or the transistor 103) can be used.

The memory cell arrays 401(1) to 401(n) and the logic circuit 403 are stacked with interlayer insulating films provided therebetween, and are electrically connected as appropriate by an electrode (including a wiring) penetrating the interlayer insulating films.

When the transistor having extremely small off-state current in which a channel formation region is formed in an oxide semiconductor film is applied to the semiconductor device in this embodiment, the semiconductor device can hold data for an extremely long time. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, since the transistor which includes the channel formation region in the silicon semiconductor region and operates at a high speed and the transistor which includes the channel formation region in the oxide semiconductor film and has an extremely small off-state current are provided in the semiconductor device described in this embodiment, the operation speed of the semiconductor device can be high and power consumption thereof can be sufficiently reduced. Further, by including the first nitride insulating film which contains hydrogen and releases hydrogen by heating and the second nitride insulating film which has a lower hydrogen content than the first nitride insulating film and functions as a barrier film against hydrogen, the semiconductor device can have favorable electrical characteristics and favorable reliability.

Note that the structures, methods, and the like described in this embodiment can be used as appropriate in combination with any of the structures, methods, and the like described in the other embodiments and examples.

Embodiment 3

In this embodiment, an example of an oxide semiconductor film which is applicable to an oxide semiconductor film in a transistor including an oxide semiconductor which is applicable to the semiconductor device described in any of the semiconductor devices in the above embodiments is described.

Besides an amorphous oxide semiconductor, a single crystal oxide semiconductor, and a polycrystalline oxide semiconductor, an oxide semiconductor including crystal parts (c-axis aligned oxide semiconductor: CAAC-OS) is preferably used for an oxide semiconductor film in the transistor including an oxide semiconductor.

The CAAC-OS is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when θ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depends on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

There are three methods for forming a CAAC-OS.

The first method is to form an oxide semiconductor film at a temperature higher than or equal to 100° C. and lower than or equal to 450° C. to form, in the oxide semiconductor film, crystal parts in which the c-axes are aligned in the direction parallel to a normal vector of a surface where the oxide semiconductor film is formed or a normal vector of a surface of the oxide semiconductor film.

The second method is to form an oxide semiconductor film with a small thickness and then heat it at a temperature higher than or equal to 200° C. and lower than or equal to 700° C. to form, in the oxide semiconductor film, crystal parts in which the c-axes are aligned in the direction parallel to a normal vector of the surface where the oxide semiconductor film is formed or to a normal vector of the top surface of the oxide semiconductor film.

The third method is to form a first oxide semiconductor film with a small thickness, then heat it at a temperature higher than or equal to 200° C. and lower than or equal to 700° C., and form a second oxide semiconductor film to form, in the second oxide semiconductor, crystal parts in which the c-axes are aligned in the direction parallel to a normal vector of the surface where the second oxide semiconductor film is formed or to a normal vector of the top surface of the second oxide semiconductor film.

In a transistor in which a CAAC-OS is used for an oxide semiconductor film, change in electric characteristics due to irradiation with visible light or ultraviolet light is small. Accordingly, the transistor including a CAAC-OS film as an oxide semiconductor film has favorable reliability.

Further, it is preferable that the CAAC-OS film be deposited by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In this case, the flat-plate-like sputtered particle or the pellet-like sputtered particle reaches a surface where the CAAC-OS film is to be deposited while maintaining its crystal state, whereby the CAAC-OS film can be deposited.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Specifically, the heating temperature of the surface where the CAAC-OS film is formed during the deposition is higher than or equal to 100° C. and lower than or equal to 740° C., preferably higher than or equal to 200° C. and lower than or equal to 500° C. By increasing the temperature of the surface where the CAAC-OS film is formed during the deposition, when the flat-plate-like or pellet-like sputtered particle reaches the surface where the CAAC-OS film is formed, migration occurs on the surface where the CAAC-OS film is formed, so that a flat plane of the sputtered particle is attached to the surface where the CAAC-OS film is formed.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably higher than or equal to 100 vol %.

As an example of the sputtering target, an In—Ga—Zn—O compound target is described below.

The In—Ga—Zn-based metal oxide target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. Note that x, y, and z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

In the case where a single crystal oxide semiconductor is applied to an oxide semiconductor film in the transistor including an oxide semiconductor, the single crystal oxide semiconductor may be formed in such a manner that a CAAC-OS is formed and subjected to heating by laser irradiation treatment. A gas laser or a solid-state laser of continuous oscillation or a pulsed oscillation can be used for the laser irradiation. The following laser can be used as the gas laser: an excimer laser, a YAG laser, a $YVO_4$ laser, a YLF laser, $YAlO_3$ laser, a glass laser, a ruby laser, a Ti:sapphire laser, or the like. As a solid-state laser, a laser using crystals such as YAG, $YVO_4$, YLF, and $YAlO_3$ doped with Cr, Nd, Er, Ho, Ce, Co, Ti, or Tm can be used.

In the transistor including an oxide semiconductor, the oxide semiconductor film may be a stack of oxide semiconductor films. For example, the oxide semiconductor film may have a stacked-layer structure of a first oxide semiconductor film and a second oxide semiconductor film which are formed using metal oxides with different compositions. For example, the oxide semiconductor film can have a stacked-layer structure of a first oxide semiconductor film and a second oxide semiconductor film which differ in atomic ratio of metal elements. Alternatively, the oxide semiconductor film can have a stacked-layer structure of a first oxide semiconductor film and a second oxide semiconductor film which have different metal elements. Note that an oxide containing two kinds of metals, an oxide containing three kinds of metals, or an oxide containing four kinds of metals can be used as appropriate for each of the first oxide semiconductor film and the second oxide semiconductor film.

Further, it is possible that the constituent elements of the first oxide semiconductor film and the second oxide semiconductor film are the same and the compositions of the constituent elements of the first oxide semiconductor film and the second oxide semiconductor film are different. For example, the first oxide semiconductor film may have an atomic ratio of In:Ga:Zn=1:1:1, and the second oxide semiconductor film may have an atomic ratio of In:Ga:Zn=3:1:2. Alternatively, the first oxide semiconductor film may have an atomic ratio of In:Ga:Zn=1:3:2, and the second oxide semiconductor film may have an atomic ratio of In:Ga:Zn=2:1:3. Note that a proportion of each atom in the atomic ratio of the oxide semiconductor varies within a range of ±20% as an error.

At this time, one of the first oxide semiconductor film and the second oxide semiconductor film which is closer to the gate electrode (on a channel side) preferably contains In and Ga at a proportion of In>Ga. The other which is farther from the gate electrode (on a back channel side) preferably contains In and Ga at a proportion of In≤Ga.

Further, the oxide semiconductor film included in the transistor including an oxide semiconductor may have a three-layer structure of a first oxide semiconductor film, a second oxide semiconductor film, and a third oxide semiconductor film, in which the constituent elements thereof are made the same but the compositions of the first oxide semiconductor film, the second oxide semiconductor film, and the third oxide semiconductor film are made different from each other. For example, the first oxide semiconductor film may have an atomic ratio of In:Ga:Zn=1:3:2, the second oxide semiconductor film may have an atomic ratio of In:Ga:Zn=3:1:2, and the third oxide semiconductor film may have an atomic ratio of In:Ga:Zn=1:1:1.

In an oxide semiconductor film which contains less In than Ga and Zn at an atomic ratio, typically, the first oxide semiconductor film containing In, Ga, and Zn at an atomic ratio of 1:3:2, generation of oxygen vacancies can be more inhibited than in an oxide semiconductor film containing more In than Ga and Zn at an atomic ratio, typically, the second oxide semiconductor film, and an oxide semiconductor film containing Ga, Zn, and In at the same atomic ratio, typically, the third oxide semiconductor film, and accordingly, an increase in carrier density can be suppressed. Further, when the first oxide semiconductor film containing In, Ga, and Zn at an atomic ratio of 1:3:2 has an amorphous structure, the second oxide semiconductor film is likely to be a CAAC-OS film.

Since the constituent elements of the first oxide semiconductor film, the second oxide semiconductor film, and the third oxide semiconductor film are the same, the first oxide semiconductor film has fewer defect levels (trap levels) at the interface with the second oxide semiconductor film. Accordingly, when an oxide semiconductor film has the above structure, changes over time or variation in threshold voltage of a transistor due to a BT stress test under light can be reduced.

In an oxide semiconductor, the s orbital of heavy metal mainly contributes to carrier transfer, and when the In content in the oxide semiconductor is increased, overlap of the s orbitals is likely to be increased. Therefore, an oxide having a composition of In>Ga has higher carrier mobility than an oxide having a composition of In≤Ga. Further, in Ga, the formation energy of oxygen vacancy is larger and thus oxygen vacancy is less likely to occur, than in In; therefore, the oxide having a composition of In≤Ga has more stable characteristics than the oxide having a composition of In>Ga.

In the case of a transistor in which oxide semiconductor films are stacked, an oxide semiconductor film containing In and Ga at a composition of In>Ga is used on the channel side, and an oxide semiconductor film containing In and Ga at a proportion of In≤Ga is used on the back channel side, so that the field-effect mobility and reliability of the transistor can be further improved.

Further, the first oxide semiconductor film, the second oxide semiconductor film, and the third oxide semiconductor film may be formed using oxide semiconductor films having different crystallinity. That is, the first oxide semiconductor film and the second oxide semiconductor film may be formed using a combination of any of a single crystal oxide semiconductor, a polycrystalline oxide semiconductor, a microcrystalline oxide semiconductor, an amorphous oxide semiconductor, and a CAAC-OS as appropriate. When an amorphous oxide semiconductor film is applied to any of the first oxide semiconductor film, the second oxide semiconductor film, and the third oxide semiconductor film, internal stress or external stress of the oxide semiconductor film is relieved, variation in characteristics of a transistor is reduced, and the reliability of the transistor can be further improved.

Note that the structures, methods, and the like described in this embodiment can be used as appropriate in combination with any of the structures, methods, and the like described in the other embodiments and examples.

Embodiment 4

In this embodiment, an example which is applicable to a transistor including an oxide semiconductor which is included in a semiconductor device that is one embodiment of the present invention is described.

Figure 18:
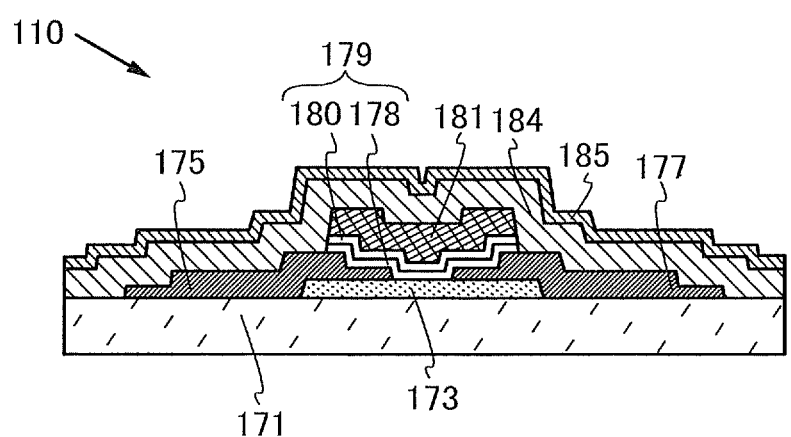
FIG. 18 is a cross-sectional view of a transistor which is applicable to a semiconductor device that is one embodiment of the present invention.

FIG. 18 illustrates a transistor 110 with a structure which is partly different from that of the transistor including an oxide semiconductor which is described in the above embodiment. Note that only the transistor 110 including an oxide semiconductor is illustrated and a transistor including a silicon semiconductor, a capacitor, and the like are not illustrated in FIG. 18. The reference numerals, which are used for describing the semiconductor device in FIG. 1A, are used for the transistor 110 in this embodiment.

The transistor 110 includes the insulating film 171 which also functions as a base insulating film, the oxide semiconductor film 173, the source electrode 175 and the drain electrode 177 which are in contact with the oxide semiconductor film 173, the gate insulating film 179 in which an oxide insulating film 178 and a nitride insulating film 180 are stacked, the gate electrode 181 which is provided over the gate insulating film 179, and an insulating film 184 and the insulating film 185 which cover the insulating film 171, the source electrode 175, the drain electrode 177, the gate insulating film 179, and the gate electrode 181.

The transistor 110 differs from the transistor 109 in the following structure. The source electrode 175 and the drain electrode 177 each have a step in its end portion. In the gate insulating film 179, the oxide insulating film 178 is provided on a side in contact with the oxide semiconductor film 173, and the nitride insulating film 180 is stacked over the oxide insulating film 178. Further, the gate insulating film 179 is processed by etching treatment so that part of the source electrode 175 and part of the drain electrode 177 are exposed. In addition, the insulating film 184 and the insulating film 185 are stacked.

Since only part of the structure of the transistor 110 is different from that of the transistor 109, the transistor 110 can be manufactured using the method for manufacturing the transistor 109 as appropriate. For example, heat treatment can be performed at the same timing as that in the method for manufacturing the transistor 109.

In the transistor 110, the insulating film 171 and the oxide semiconductor film 173 can be formed in a manner similar to the insulating film and the oxide semiconductor film in the transistor 109.

In the transistor 110, the source electrode 175 and the drain electrode 177 can be formed using a conductive film applicable to the source electrode 175 and the drain electrode 177 of the transistor 109 in the following manner. The conductive film is formed; a mask is formed over the conductive film; the conductive film is processed using the mask so that a desired channel length L is obtained; the mask is reduced in size by ashing or the like; and the conductive film is processed using the mask which has been reduced in size, whereby the conductive film has steps in its end portion. In this manner, coverage of the end portions of the source and drain electrodes 175 and 177 with the insulating film can be increased.

The gate insulating film 179 in the transistor 110 is a stack of the oxide insulating film 178 and the nitride insulating film 180. The oxide insulating film 178 in contact with the oxide semiconductor film 173 preferably includes a region which contains oxygen in excess of that in the stoichiometric composition (oxygen-excess region), and for example, can be formed of a silicon oxide film or a silicon oxynitride film including a region which contains oxygen in excess of that in the stoichiometric composition (oxygen-excess region). In addition, the nitride insulating film 180 is preferably formed using a nitride insulating film applicable to the second nitride insulating film 113.

The silicon oxide film or the silicon oxynitride film applicable to the oxide insulating film 178 can be formed on the following conditions. The formation conditions are as follows: the substrate placed in a treatment chamber of a plasma CVD apparatus which is vacuum-evacuated is held at a temperature higher than or equal to 180° C. and lower than or equal to 250° C., preferably higher than or equal to 180° C. and lower than or equal to 230° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$, is supplied to an electrode provided in the treatment chamber. Note that a deposition gas containing silicon and an oxidation gas are used as source gases.

Since the nitride insulating film 180 can be formed in a manner similar to that of the second nitride insulating film 113, the above embodiment can be referred to.

A conductive film to be processed into the gate electrode 181 is formed over the oxide insulating film and the nitride insulating film formed by the above methods, a mask is formed over the conductive film, and the oxide insulating film, the nitride insulating film, and the conductive film are collectively processed by dry etching or the like using the mask, whereby the gate insulating film 179 and the gate electrode 181 of the transistor 110 can be formed.

By forming the nitride insulating film 180 of the gate insulating film 179 using a nitride silicon film, the following effect can be obtained. The silicon nitride film has a higher relative permittivity than a silicon oxide film and needs a larger thickness for an equivalent capacitance. Thus, the physical thickness of the gate insulating film can be increased. Accordingly, a reduction in withstand voltage of the transistor 110 is prevented and further the withstand voltage is improved, so that ESD resistance of the semiconductor device can be enhanced. Accordingly, the yield of the transistor 110 can be improved; as a result, the yield of the semiconductor device can be improved.

The insulating film 184 can be formed in a manner similar to that of the oxide insulating film 178 and, in particular, is preferably an oxide insulating film including a region which contains oxygen in excess of that in the stoichiometric composition (oxygen-excess region); for example, a silicon oxide film or a silicon oxynitride film which includes a region which contains oxygen in excess of that in the stoichiometric composition (oxygen-excess region) can be used.

When the oxide insulating film 178 and the insulating film 184 each include a region which contains oxygen in excess of that in the stoichiometric composition (oxygen-excess region) in the transistor 110, oxygen vacancies in the oxide semiconductor film 173 can be reduced by heat treatment in the manufacturing process of the transistor 110. For example, when the transistor 110 described in this embodiment is manufactured, heat treatment is preferably performed after the formation of the insulating film 185. By reducing the oxygen vacancies, it is possible to improve the electrical characteristics and reliability of the transistor 110. Accordingly, the electrical characteristics and reliability of the semiconductor device can be improved.

The insulating film 185 can be formed in a manner similar to that of the second nitride insulating film 113, and thus the above embodiment can be referred to. The nitride silicon film applicable to the insulating film 185 is less likely to transmit hydrogen; therefore, the insulating film 185 can prevent the entry of hydrogen from the outside, so that the electrical characteristics and reliability of the transistor 110 can be improved. Accordingly, the electrical characteristics and reliability of the semiconductor device can be improved.

Note that the transistor 110 described in this embodiment can be replaced with not only any of the transistors which are included in the semiconductor devices described in Embodiment 1 and the modification examples thereof but also any of the transistors including an oxide semiconductor which are included in the semiconductor devices described in Embodiment 2 and the modification examples thereof. Further, in the case where the transistor 110 is electrically connected to an electrode which is provided over a transistor including a silicon semiconductor and also functions as a wiring, the shapes of the source electrode 175 and the drain electrode 177 of the transistor 110 can be changed as appropriate.

Note that the structures, methods, and the like described in this embodiment can be used as appropriate in combination with any of the structures, methods, and the like described in the other embodiments and examples.

Embodiment 5

In this embodiment, a central processing unit (CPU) at least part of which includes the semiconductor device described in the above embodiment is described as an example of a semiconductor device that is one embodiment of the present invention.

Figure 19A:
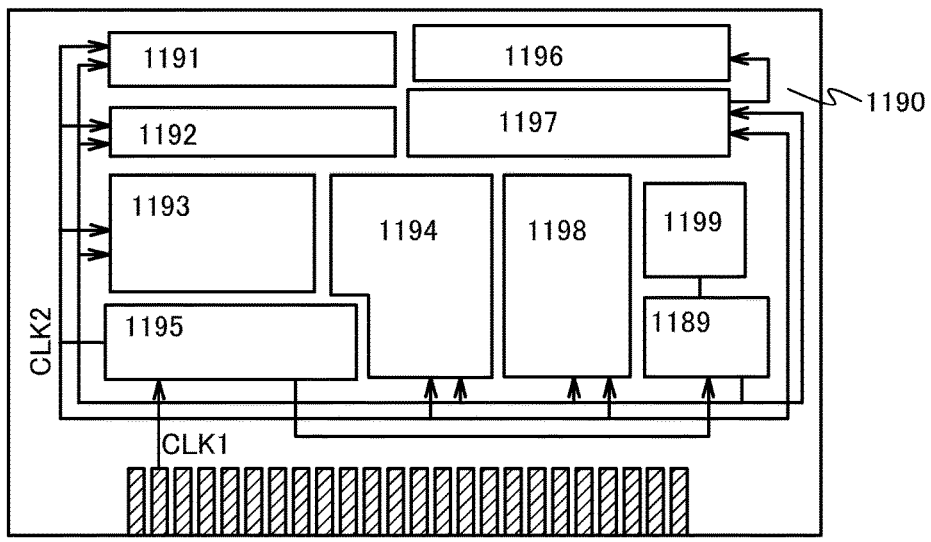
FIGS. 19A to 19C are block diagrams illustrating a semiconductor device that is one embodiment of the present invention.

FIG. 19A is a block diagram illustrating a specific structure of the CPU. The CPU illustrated in FIG. 19A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may each be provided over a separate chip. Needless to say, the CPU in FIG. 19A is just an example in which the configuration has been simplified, and an actual CPU may have various configurations depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 19A, a memory cell is provided in the register 1196. As the memory cell of the register 1196, the memory cell described in the above embodiment can be used.

In the CPU illustrated in FIG. 19A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 19B:
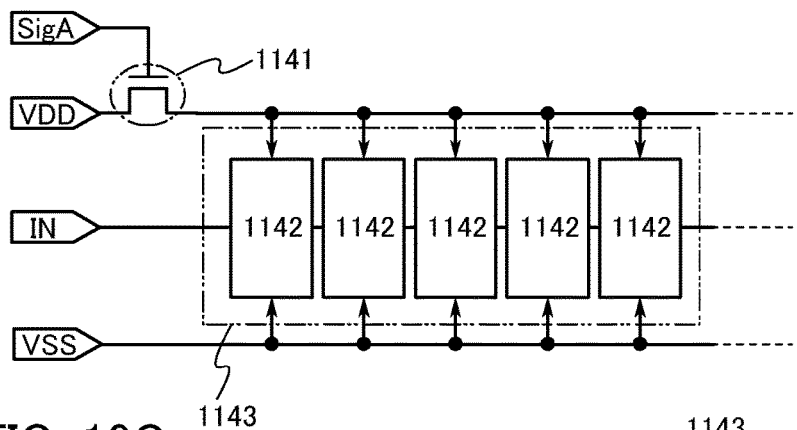
Figure 19C:
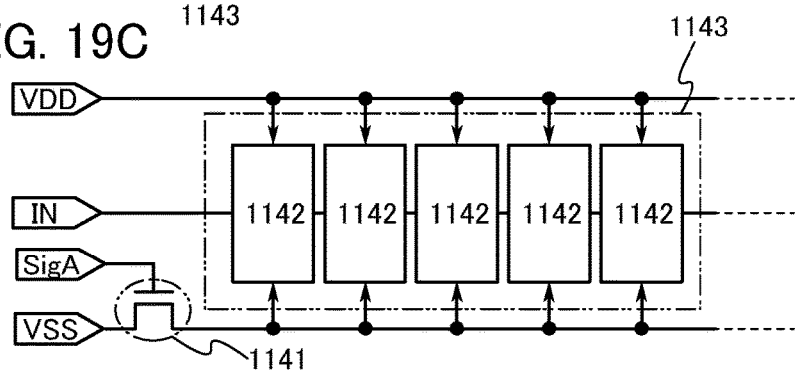

The power supply can be stopped by providing a switching element between a memory cell group and a node to which a power supply potential VDD or a power supply potential VSS is supplied, as illustrated in FIG. 19B or FIG. 19C. Circuits illustrated in FIGS. 19B and 19C are described below.

FIGS. 19B and 19C illustrate examples of a configuration in which the transistor including an oxide semiconductor which is included in the semiconductor device described in the above embodiment is applied to a switching element for controlling supply of power supply potential to memory cells.

The storage device illustrated in FIG. 19B includes a switching element 1141 and a memory cell group 1143 including a plurality of memory cells 1142. Specifically, as each of the memory cells 1142, the memory cell disclosed in the above embodiment can be used. Each of the memory cells 1142 included in the memory cell group 1143 is supplied with the high-level power supply potential VDD via the switching element 1141. Further, each of the memory cells 1142 included in the memory cell group 1143 is supplied with a potential of a signal IN and the low-level power supply potential VSS.

In FIG. 19B, the transistor including an oxide semiconductor included in the semiconductor device described in the above embodiment is applicable to the switching element 1141, and the switching of the transistor is controlled by a signal Sig A supplied to a gate electrode thereof.

Note that FIG. 19B illustrates the structure in which the switching element 1141 includes only one transistor; however, without particular limitation thereon, the switching element 1141 may include a plurality of transistors. In the case where the switching element 1141 includes a plurality of transistors which function as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 19B, the switching element 1141 may control the supply of the low-level power supply potential VSS.

In FIG. 19C, an example of a storage device in which each of the memory cells 1142 included in the memory cell group 1143 is supplied with the low-level power supply potential VSS via the switching element 1141 is illustrated. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Note that the structures, methods, and the like described in this embodiment can be used as appropriate in combination with any of the structures, methods, and the like described in the other embodiments and examples.

Embodiment 6

In this embodiment, examples of an electronic appliance provided with the semiconductor device described in the above embodiment are described with reference to FIGS. 20A to 20C. The semiconductor device described in the above embodiment includes a transistor including an oxide semiconductor with good switching characteristics, and thus enables a reduction in the power consumption of the electronic appliance. In addition, a semiconductor device with a new structure using the characteristics of oxide semiconductors (e.g. a storage device such as a memory element or a memory cell) allows for achievement of an electronic appliance with a new structure. Note that the semiconductor device described in the above embodiment can be mounted on a circuit substrate or the like alone or integrated with other components, and thus built into the electronic appliance.

In many cases, an integrated circuit into which the semiconductor device described in the above embodiment is integrated includes a variety of circuit elements such as a resistor, a capacitor, and a coil in addition to the structure of the semiconductor device described in the above embodiment. An example of the integrated circuit is a circuit into which an arithmetic circuit, a converter circuit, an amplifier circuit, a memory circuit, and circuits relating to any of these circuits are highly integrated.

The semiconductor device is applicable to a switching element or the like in a display device such as a television or a monitor. In this case, the semiconductor device and a driver circuit are preferably provided over the same substrate. Naturally it is also possible to use the semiconductor device only for a driver circuit of the display device.

Examples of the electronic appliances include display devices such as televisions and monitors, lighting devices, desktop or laptop personal computers, word processors, image reproduction devices which reproduce still images or moving images stored in recording media such as Blu-ray Discs and digital versatile discs (DVDs), portable compact disc (CD) players, radio receivers, tape recorders, headphone stereos, stereos, cordless phone handsets, transceivers, portable wireless devices, mobile phones, car phones, portable game machines, calculators, portable information terminals, electronic notebooks, e-book readers, electronic translators, audio input devices, cameras such as still cameras and video cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, medical equipment such as dialyzers, and the like. Further, the examples include industrial equipment such as guide lights, traffic lights, belt conveyors, elevators, escalators, industrial robots, and power storage systems. In addition, oil engines, moving objects driven by electric motors using power from the non-aqueous secondary batteries, and the like are also included in the category of electronic appliances. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic appliances are shown in FIGS. 20A to 20C.

Figure 20A:
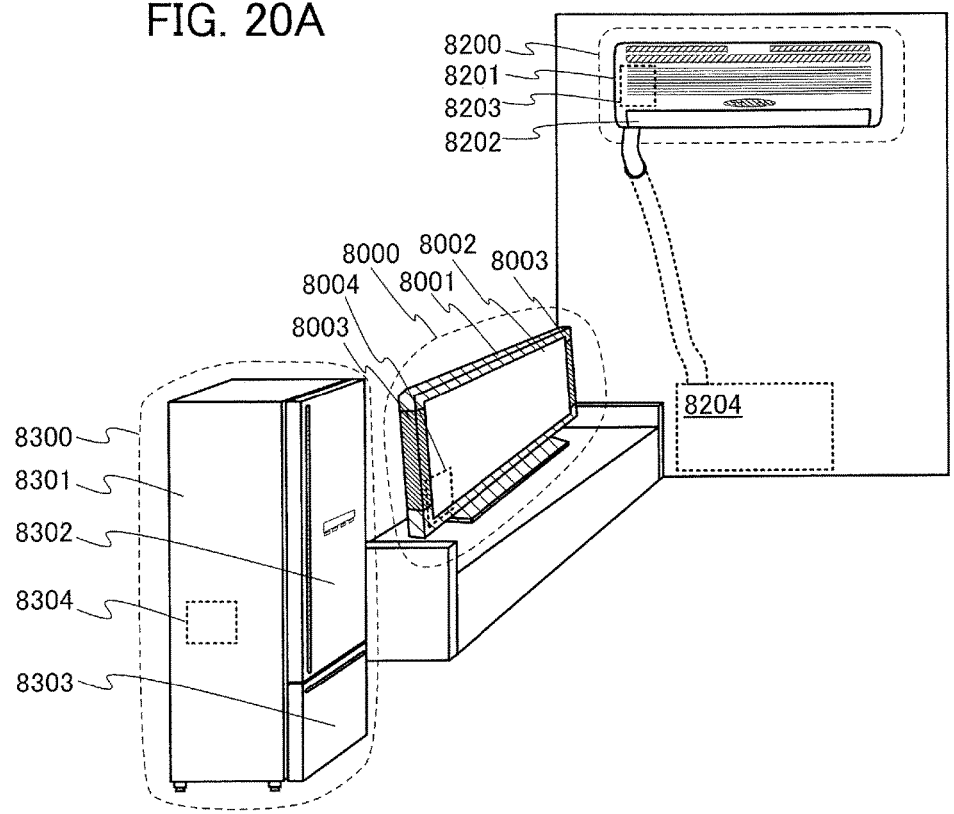
FIGS. 20A to 20C illustrate electronic appliances.

In a television set 8000 in FIG. 20A, a display portion 8002 is incorporated in a housing 8001. The display portion 8002 displays an image and a speaker portion 8003 can output sound.

A semiconductor display device such as a liquid crystal display device, a light-emitting device in which a light-emitting element such as an organic EL element is provided in each pixel, an electrophoretic display device, a digital micromirror device (DMD), a plasma display panel (PDP), or the like can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The memory or the CPU described in the above embodiment can be used for the television set 8000.

In FIG. 20A, an air conditioner which includes an indoor unit 8200 and an outdoor unit 8204 is an example of an electronic appliance which is provided with the CPU of the above embodiment. Specifically, the indoor unit 8200 includes a housing 8201, an air outlet 8202, a CPU 8203, and the like. Although the CPU 8203 is provided in the indoor unit 8200 in FIG. 20A, the CPU 8203 may be provided in the outdoor unit 8204. Alternatively, the CPU 8203 may be provided in both the indoor unit 8200 and the outdoor unit 8204. By using the CPU described in the above embodiment as the CPU in the air conditioner, power consumption can be reduced.

In FIG. 20A, an electric refrigerator-freezer 8300 is an example of an electronic appliance which is provided with the CPU described in the above embodiment. Specifically, the electric refrigerator-freezer 8300 includes a housing 8301, a door for a refrigerator 8302, a door for a freezer 8303, a CPU 8304, and the like. In FIG. 20A, the CPU 8304 is provided in the housing 8301. When the CPU described in the above embodiment is used as the CPU 8304 of the electric refrigerator-freezer 8300, power consumption of the electric refrigerator-freezer 8300 can be reduced.

Figure 20B:
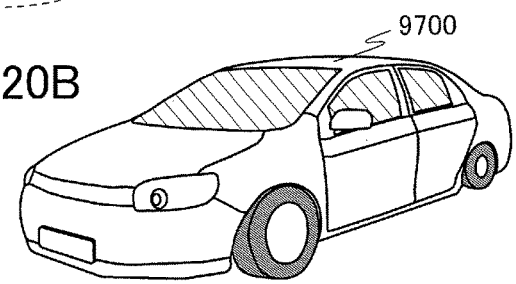
Figure 20C:
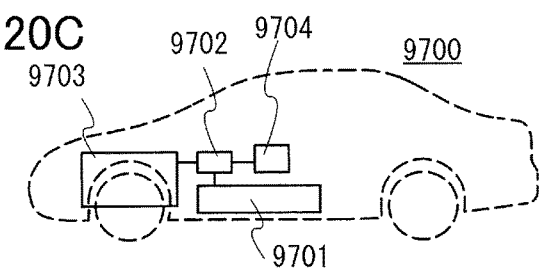

FIGS. 20B and 20C illustrate an example of an electric vehicle which is an example of an electronic appliance. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like (not illustrated). When the CPU described in the above embodiment is used as the CPU in the electric vehicle 9700, power consumption of the electric vehicle 9700 can be reduced.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

Note that the structures, methods, and the like described in this embodiment can be used as appropriate in combination with any of the structures, methods, and the like described in the other embodiments and examples.

Example 1

In this example, evaluation results of a nitride insulating film which is applicable to the first nitride insulating film containing hydrogen which is included in the semiconductor device that is one embodiment of the present invention are described. Here, a nitride insulating film which contains hydrogen and releases hydrogen is described as the nitride insulating film applicable to the first nitride insulating film.

First, a method for forming samples for evaluation is described. A structure of each sample formed in this example is referred to as Structure 1. A silicon nitride film 993 is provided over a silicon wafer 991 in Structure 1 (see FIG. 21A).

The silicon nitride film 993 was formed by a plasma CVD method using four conditions, Conditions 1 to 4. Samples formed under Conditions 1 to 4 were Samples A1 to A4, respectively. Note that in each of Samples A1 to A4, the silicon nitride film 993 had a thickness of 50 nm.

Condition 1 was as follows: a temperature at which the silicon wafer 991 was held was 350° C.; silane with a flow rate of 10 sccm and nitrogen with a flow rate of 5000 sccm were used as source gases; a pressure in a treatment chamber was 260 Pa; and a high-frequency power of 100 W (1.8 W/cm$^2$ as a power density) at 27.12 MHz was supplied to parallel plate electrodes. Note that the flow rate of nitrogen is 500 times that of silane.

Condition 2 was as follows: a temperature at which the silicon wafer 991 was held was 350° C.; silane with a flow rate of 20 sccm and nitrogen with a flow rate of 500 sccm were used as source gases; a pressure in a treatment chamber was 40 Pa; and a high-frequency power of 900 W (1.8 W/cm$^2$ as a power density) at 27.12 MHz was supplied to parallel plate electrodes. Note that the flow rate of nitrogen is 25 times that of silane.

Condition 3 is the same as Condition 2 except that ammonia was used as a source gas. A temperature at which the silicon wafer 991 was held was 350° C.; silane with a flow rate of 20 sccm, nitrogen with a flow rate of 500 sccm, and ammonia with a flow rate of 10 sccm were used as source gases; a pressure in a treatment chamber was 40 Pa; and a high-frequency power of 900 W (1.93 W/cm$^2$ as a power density) at 27.12 MHz was supplied to parallel plate electrodes. Note that the flow rate of nitrogen is 25 times that of silane, and the flow rate of ammonia is 0.5 times that of silane.

Condition 4 is the same as Condition 3 except for the flow rate of ammonia. Under Condition 4, the flow rate of ammonia was 15 sccm and the other conditions are the same as those of Condition 3. Note that the flow rate of nitrogen is 25 times that of silane, and the flow rate of ammonia is 0.75 times that of silane.

Samples A1 to A4 were subjected to TDS analysis.

Here, a method to measure the number of released hydrogen molecules using the TDS analysis is described.

The released amount of gas in the TDS analysis is proportional to an integral value of spectrum. Therefore, the amount of released gas can be calculated from the ratio between the integral value of a spectrum of an insulating film and the reference value of a standard sample. The reference value of a standard sample refers to the ratio of the density of a predetermined atom contained in a sample to the integral value of a spectrum.

For example, the number of hydrogen molecules ($N_{H2}$) released from an insulating film can be obtained according to Equation 1 with the TDS analysis results of a silicon wafer containing hydrogen at a predetermined density which is the standard sample and the TDS analysis results of the insulating film. Here, all spectra having a mass number of 2 which are obtained by TDS analysis are assumed to originate from a hydrogen molecule. Further, an isotope of a hydrogen atom having a mass number other than 1 is not taken into consideration because the proportion of such a molecule in the natural world is minimal.

[Equation 1]

$$N_{H2} = \frac{N_{H2(S)}}{S_{H2(S)}} \times S_{H2} \times \alpha \quad (1)$$

Note that $N_{H2}$ is the number of the released hydrogen molecules. $N_{H2(s)}$ is the value obtained by conversion of the number of hydrogen molecules released from the standard sample into density. $S_{H2(s)}$ is an integral value of spectrum of a standard sample which is analyzed by TDS. Here, the reference value of the standard sample is set to $N_{H2(s)}/S_{H2(s)}$. $S_{H2}$ is the integral value of a spectrum when the insulating film is subjected to TDS analysis. $\alpha$ is a coefficient affecting the intensity of the spectrum in the TDS analysis. Japanese Published Patent Application No. H6-275697 can be referred to for details of Equation 1.

Note that in this example, the amount of hydrogen released from each of Samples A1 to A4 was measured with a thermal desorption spectroscopy apparatus produced by ESCO Ltd., EMD-WA1000S/W using a silicon wafer containing hydrogen atoms at $1 \times 10^{16}$ atoms/cm$^2$ as the standard sample.

Figure 22A:
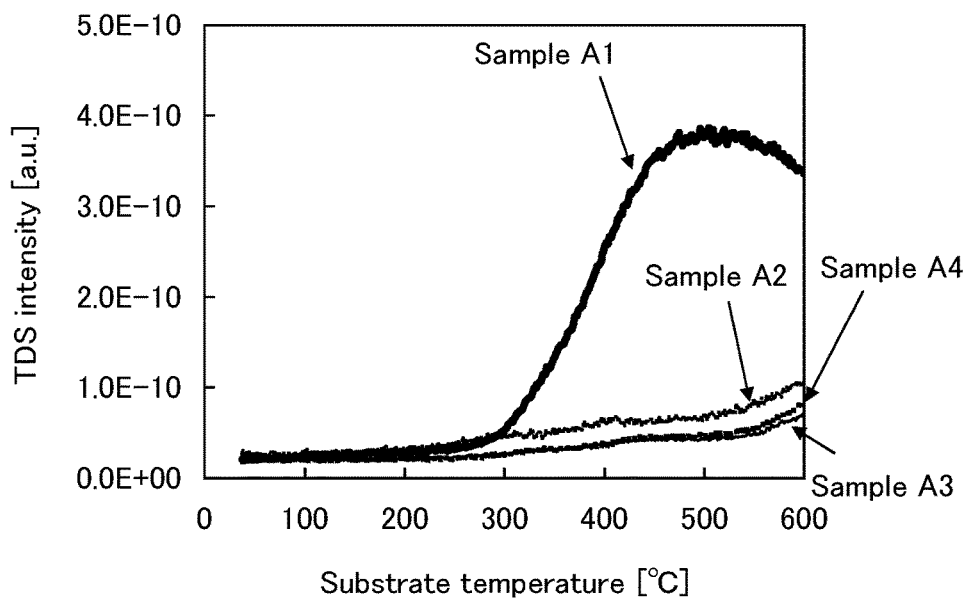
FIGS. 22A and 22B show results of thermal desorption spectroscopy.

TDS analysis results of Samples A1 to A4 having Structure 1 are shown in FIG. 22A. FIG. 22A is a graph in which the horizontal axis represents substrate temperature and the vertical axis represents TDS intensity with respect to the number of released hydrogen molecules. Note that the minimum detection limit of hydrogen molecules in the TDS analysis is $1.0 \times 10^{21}$ molecules/cm$^3$.

In each of Samples A1 to A4, a peak indicating release of hydrogen molecules was observed at a substrate temperature in the range of 300° C. to 600° C.; however, Samples A1 to A4 differed in TDS intensity. That is, Samples A1 to A4 differed in the amount of released hydrogen.

The number of hydrogen molecules released from Samples A1 to A4 was $6.6 \times 10^{23}$ molecules/cm$^3$, $1.1 \times 10^{23}$ molecules/cm$^3$, $7.4 \times 10^{22}$ molecules/cm$^3$, and $8.4 \times 10^{22}$ molecules/cm$^3$, respectively.

FIG. 22A shows that Sample A1 had higher TDS intensity with respect to hydrogen molecules than Samples A2 to A4. That is, it was found that the amount of hydrogen contained in the silicon nitride film 993 of Sample A1 was larger than those in the silicon nitride films 993 of Samples A2 to A4. These results indicate that when the flow rate of nitrogen was larger than that of silane as in Condition 1, which is the condition of Sample A1, it was possible to form a nitride insulating film which contains hydrogen and releases hydrogen by heating.

The above results showed that the silicon nitride film formed under Condition 1 was suitable to the first nitride insulating film included in the semiconductor device that is one embodiment of the present invention.

Example 2

In this example, evaluation results of a nitride insulating film which is applicable to the second nitride insulating film which is included in the semiconductor device that is one embodiment of the present invention and functions as a barrier film against hydrogen are described. Here, a film which is less likely to transmit hydrogen and has a barrier property against hydrogen is described as the nitride insulating film applicable to the second nitride insulating film.

Samples which were formed are described below. A structure of each sample formed in this example is partly different from Structure 1 described in Example 1 and is referred to as Structure 2. A silicon nitride film 995 is provided over the silicon wafer 991 in Structure 2, and the silicon nitride film 993 is provided over the silicon nitride film 995 (see FIG. 21B).

The silicon nitride film 995 was formed by a plasma CVD method under formation conditions which are applicable to the first nitride insulating film. Specifically, the silicon nitride film 995 was formed under Condition 1 described in Example 1. The silicon nitride film 993 was formed by a plasma CVD method under formation conditions which are applicable to the second nitride insulating film.

The silicon nitride film 993 was formed using four conditions, Conditions 5 to 8. Samples formed under Conditions 5 to 8 were Samples B1 to B4, respectively. In each of Samples B1 to B4, the silicon nitride film 993 and the silicon nitride film 995 each have a thickness of 50 nm.

Condition 5 was the same as Condition 2 described in Example 1. The flow rate of nitrogen is 25 times that of silane, Condition 6 was the same as Condition 3 described in Example 1. Note that the flow rate of nitrogen is 25 times that of silane, and the flow rate of ammonia is 0.50 times that of silane.

Condition 7 was the same as Condition 4 described in Example 1. In other words, Condition 7 was the same as Condition 3 except for the flow rate of ammonia. Note that the flow rate of nitrogen is 25 times that of silane, and the flow rate of ammonia is 0.75 times that of silane.

Condition 8 was the same as Condition 4 described in Embodiment 1 except for the flow rate of ammonia. Specifically, in Condition 4, the flow rate of ammonia was set to 20 sccm. Note that the flow rate of nitrogen is 25 times that of silane, and the flow rate of ammonia is 1.0 times that of silane.

Samples B1 to B4 were subjected to TDS analysis in a manner similar to that of Example 1.

In the case of Structure 2, since the silicon nitride film 995 is the silicon nitride film which was formed under Condition 1 and releases hydrogen, whether or not the silicon nitride film 993 functions as a barrier film against hydrogen can be determined by comparing Samples B1 to B4 in terms of TDS intensity with respect to release of hydrogen.

Figure 22B:
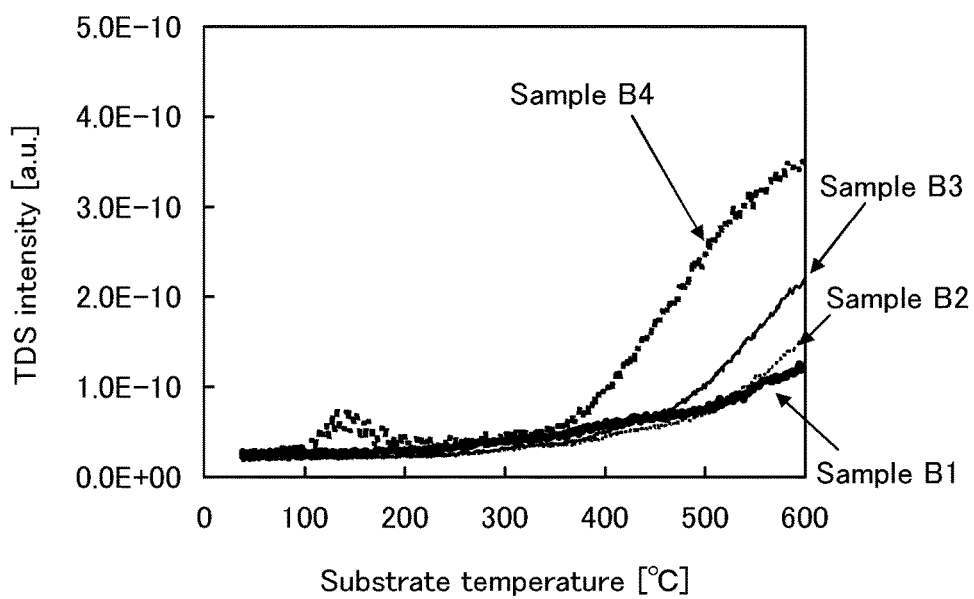

TDS analysis results of Samples B1 to B4 are shown in FIG. 22B.

FIG. 22B shows that Sample B4 had higher TDS intensity than Samples B1 to B3. FIG. 22B also shows that as the flow rate of ammonia used as the source gas of the silicon nitride film 993 was increased, the TDS intensity became higher.

It was found that the TDS intensity in FIG. 22B was substantially the same as the TDS intensity of Samples A2 to A4 described in Example 1 although the silicon nitride film 995 releasing hydrogen was provided in Samples B1 to B3. That is, it was confirmed that the silicon nitride film 993 in each of Samples B1 to B3 was a silicon nitride film which is less likely to transmit hydrogen. Accordingly, it was shown that when a silicon nitride film was formed using nitrogen, silane, and ammonia as source gases under a condition where the flow rate of nitrogen was greater than or equal to 10 times and less than or equal to 100 times (preferably greater than or equal to 15 times and less than or equal to 40 times) that of silane and the flow rate of ammonia was greater than or equal to 0.1 times and less than 1 time (preferably greater than or equal to 0.2 times and less than or equal to 0.75 times) that of silane as described in Embodiment 1, the silicon nitride film was less likely to transmit hydrogen and served as a barrier film against hydrogen.

As described above, the silicon nitride film formed using the formation method of one embodiment of the present invention can be applied to the second nitride insulating film which is included in the semiconductor device that is one embodiment of the present invention and functions as a barrier film against hydrogen.

Example 3

Example 2 shows that the silicon nitride film 993 formed under any of Conditions 5 to 7 was a silicon nitride film which was less likely to transmit hydrogen and had a barrier property against hydrogen. In view of this fact, evaluation results of the refractive index, the film density, the etching rate, and the hydrogen concentration of such a silicon nitride film are described in this example.

Figure 21A:
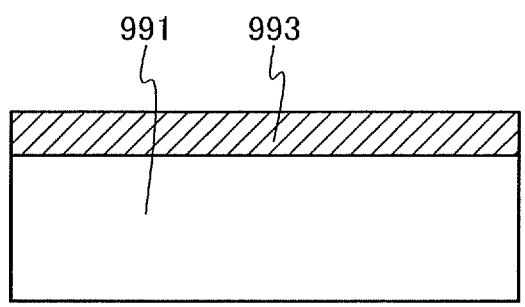
FIGS. 21A and 21B each illustrate a structure of a sample.
Figure 21B:
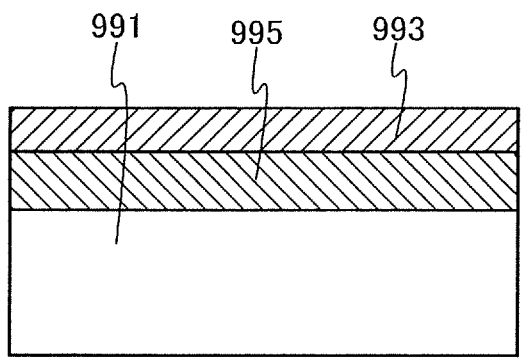

First, the structure of formed samples was Structure 1 described in Example 1 (see FIG. 21A). The silicon nitride film 993 was formed by a plasma CVD method under Conditions 5 to 8 described in Example 2. The samples manufactured in this example are Samples C1 to C4 which correspond to Conditions 5 to 8, respectively. Note that in each of Samples C1 to C4, the silicon nitride film 993 had a thickness of 50 nm.

The refractive index of the silicon nitride film 993 with respect to light having a wavelength of 633 nm in each of Samples C1 to C4 was obtained by spectroscopic ellipsometry. The film density was obtained by X-ray reflectometry. The etching rate was obtained under a condition where etching was performed at a temperature higher than or equal to 20° C. and lower than or equal to 25° C. with the use of 0.5 wt % of hydrofluoric acid.

Figure 23A:
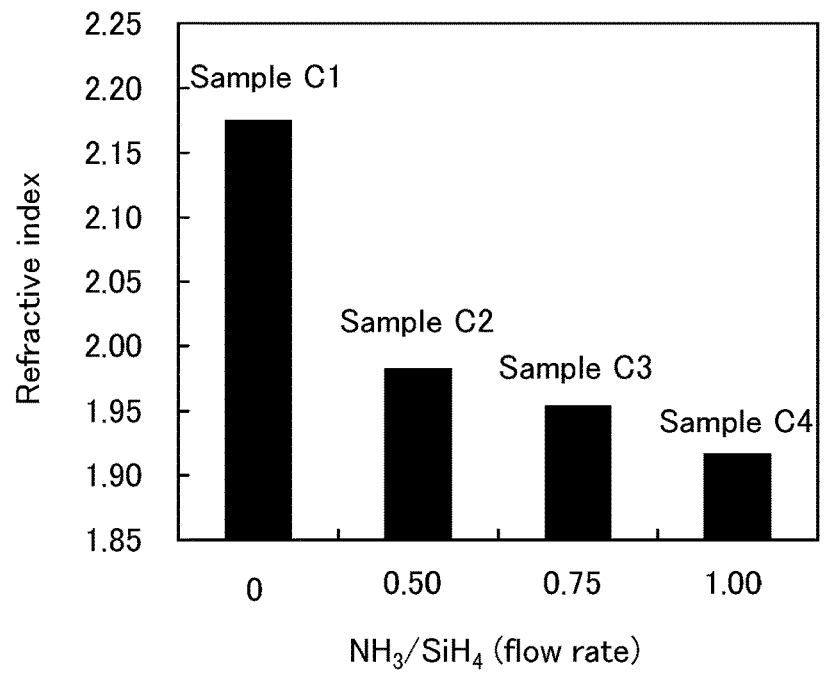
FIGS. 23A and 23B show measurement results of a refractive index and a film density.
Figure 23B:
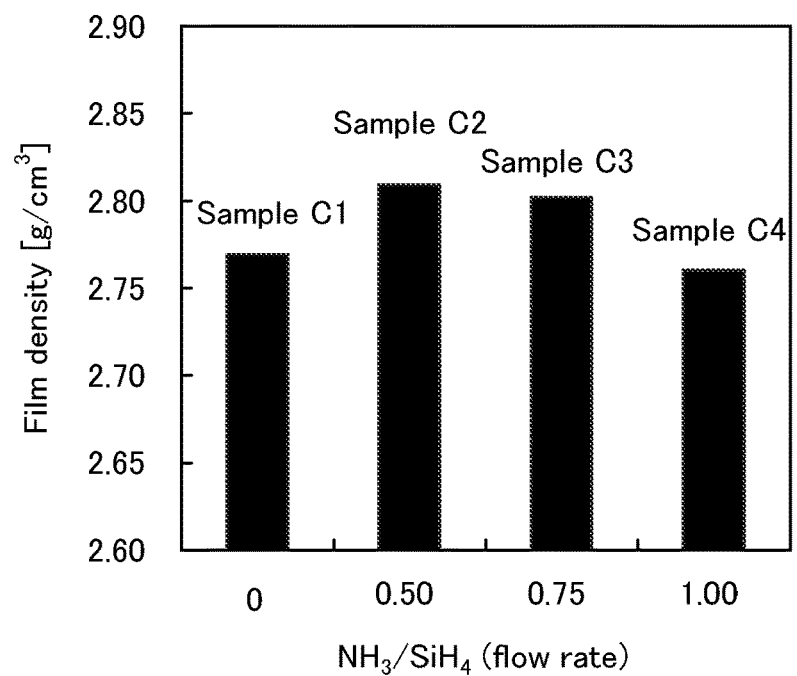

Samples C1 to C4 were subjected to the above variety of measurements. The measured refractive index of the silicon nitride film 993 in each of Samples C1 to C4 is shown in FIG. 23A. The measured film density of the silicon nitride film 993 is shown in FIG. 23B. The measured etching rate of the silicon nitride film 993 is shown in FIG. 24.

FIG. 23A is a graph showing the refractive index of each sample versus the flow ratio of silane and ammonia which were supplied at the time of formation of the silicon nitride film 993. FIG. 23B is a graph showing the film density of each sample versus the flow ratio of silane and ammonia which were supplied at the time of formation of the silicon nitride film 993. FIG. 24 is a graph showing the etching rate of each sample versus the flow ratio of silane and ammonia which were supplied at the time of formation of the silicon nitride film 993. In each of FIGS. 23A and 23B and FIG. 24, ammonia was not supplied in the case of Sample C1.

Figure 24:
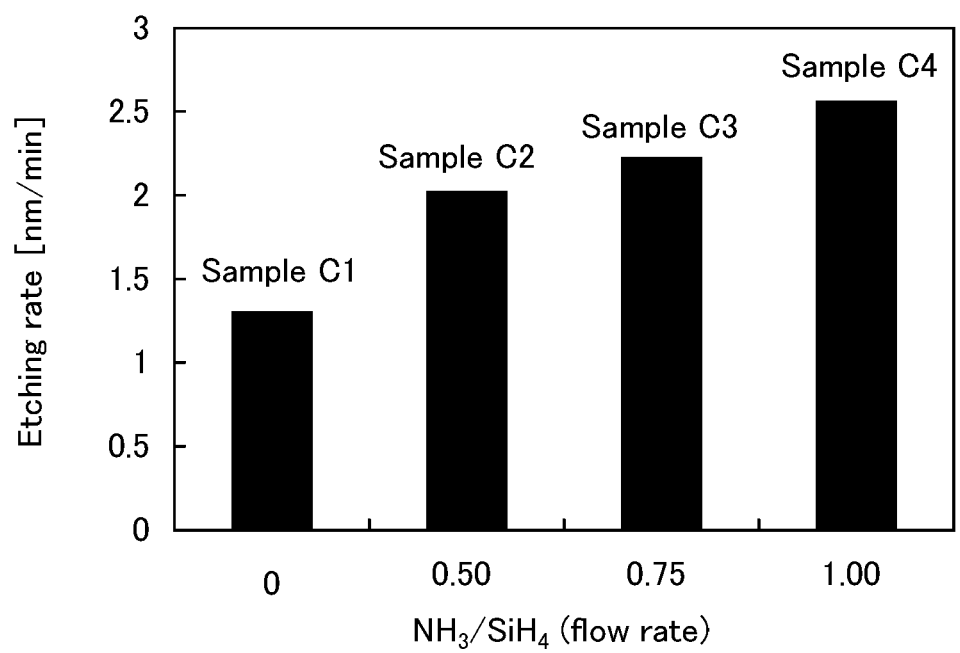
FIG. 24 shows measurement results of an etching rate.

It was found that the silicon nitride films which were less likely to transmit hydrogen (Samples C1 to C3) had a refractive index of 1.95 or more (see FIG. 23A), a film density of 2.75 g/cm$^3$ or more (see FIG. 23B), and an etching rate of less than approximately 2.0 nm/minute (see FIG. 24).

Next, evaluation results of samples having Structure 1 which were obtained by changing the formation conditions of the silicon nitride film 993. Evaluated items are the refractive index, the film density, the etching rate, and the concentration of hydrogen contained in the silicon nitride film 993.

Here, the formation conditions of the silicon nitride film 993 are four conditions, Conditions 9 to 12. Samples formed under Conditions 9 to 12 are Samples D1 to D4, respectively.

Condition 9 was as follows: a temperature at which the silicon wafer 991 was held was 350° C.; silane with a flow rate of 200 sccm and nitrogen with a flow rate of 5000 sccm were used as source gases; a pressure in a treatment chamber was 100 Pa; and a high-frequency power of 2000 W ($3.0 \times 10^{-1}$ W/cm$^2$ as a power density) at 27.12 MHz was supplied to parallel plate electrodes. Note that the flow rate of nitrogen is 25 times that of silane.

Condition 10 was as follows: a temperature at which the silicon wafer 991 was held was 350° C.; silane with a flow rate of 200 sccm, nitrogen with a flow rate of 2000 sccm, and ammonia with a flow rate of 100 sccm were used as source gases; a pressure in a treatment chamber was 100 Pa; and a high-frequency power of 2000 W ($3.0 \times 10^{-1}$ W/cm$^2$ as a power density) at 27.12 MHz was supplied to parallel plate electrodes. The flow rate of nitrogen is 10 times that of silane, and the flow rate of ammonia is 0.5 times that of silane.

Condition 11 is the same as Condition 10 except that the flow rate of ammonia is 500 sccm. Note that the flow rate of nitrogen is 10 times that of silane, and the flow rate of ammonia is 2.5 times that of silane.

Condition 12 is the same as Condition 10 except that the flow rate of ammonia is 2000 sccm. Note that the flow rate of nitrogen is 10 times that of silane, and the flow rate of ammonia is 10 times that of silane.

Samples D1 to D4 were subjected to a variety of measurements. The refractive index of the silicon nitride film 993 with respect to light having a wavelength of 633 nm in each of Samples D1 to D4 was obtained by spectroscopic ellipsometry. The film density was obtained by X-ray reflectometry. The etching rate was obtained under a condition where etching was performed at a temperature higher than or equal to 20° C. and lower than or equal to 25° C. with the use of 0.5 wt % of hydrofluoric acid.

Figure 25A:
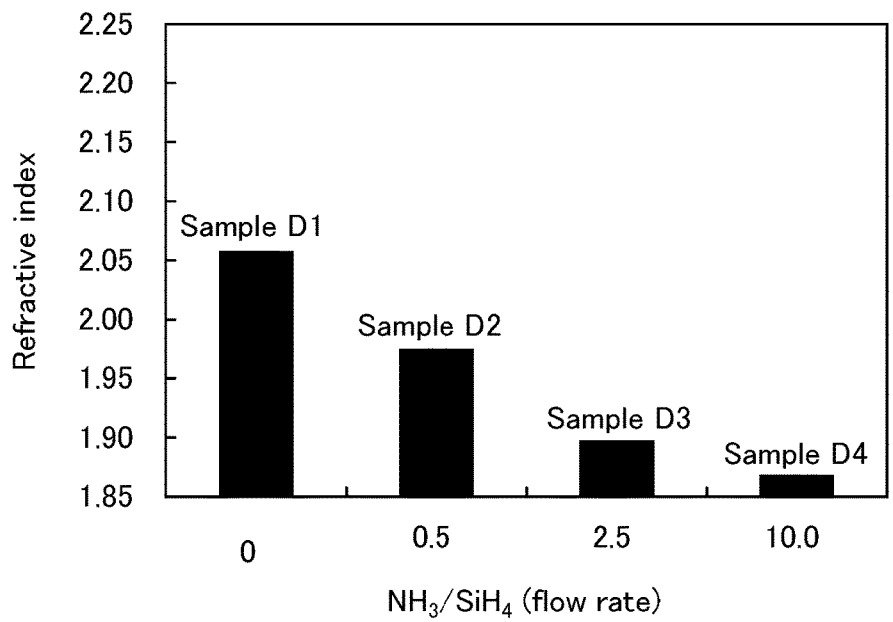
FIGS. 25A and 25B show measurement results of a refractive index and a film density.
Figure 25B:
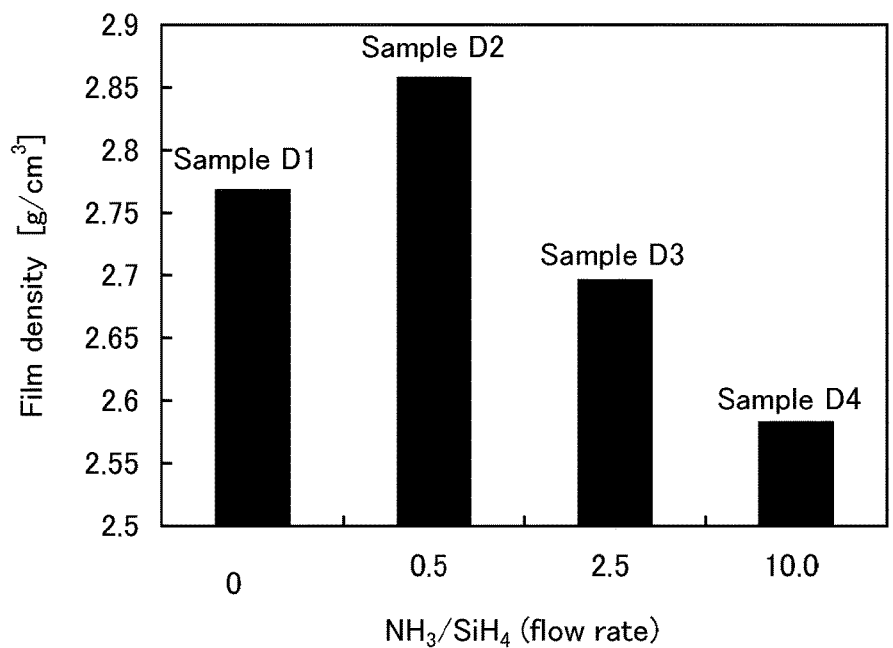

The refractive index of each of Samples D1 to D4 is shown in FIG. 25A. The film density thereof is shown in FIG. 25B. The etching rate thereof is shown in FIG. 26.

Figure 26:
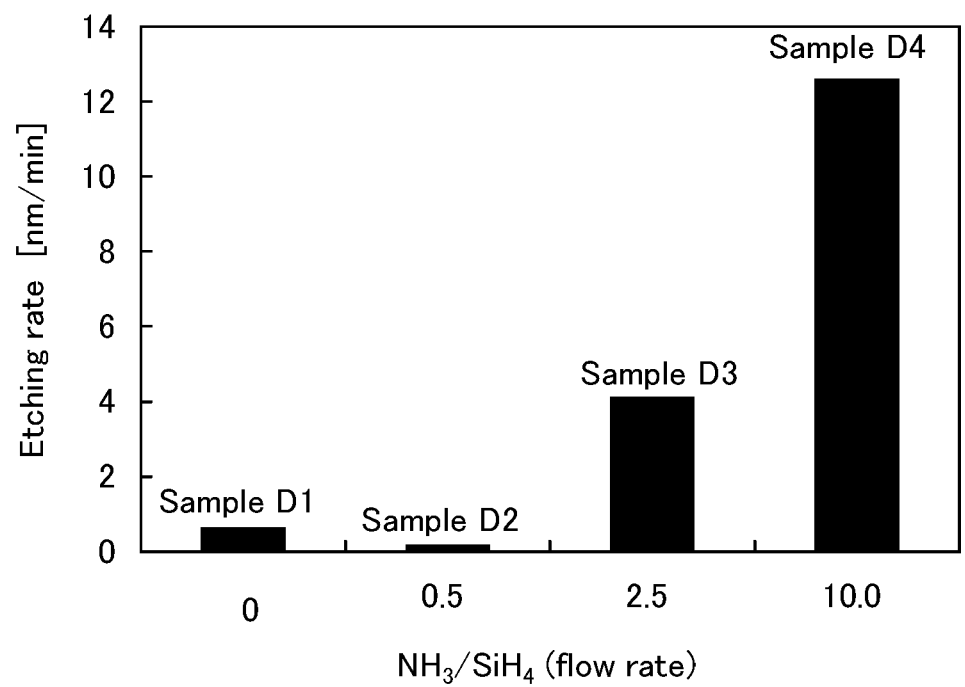
FIG. 26 shows measurement results of an etching rate.

It was found that Sample D1 and Sample D2 had a refractive index of 1.95 or more (see FIG. 25A), a film density of 2.75 g/cm$^3$ or more (see FIG. 25B), and an etching rate of less than 2.0 nm/minute (see FIG. 26).

Next, samples which had Structure 1 and in which the thickness of the silicon nitride film 993 was 300 nm were manufactured under Condition 9, Condition 10, and Condition 12. The samples manufactured under Condition 9, Condition 10, and Condition 12 are Sample E1, Sample E2, and Sample E3, respectively.

Samples E1 to E3 were subjected to Rutherford backscattering spectrometry to measure the concentration of hydrogen contained in the silicon nitride film 993 in each of the samples. The results are shown in Table 1.

TABLE 1

|  | Si [atomic %] | N [atomic %] | H [atomic %] | O [atomic %] |
|---|---|---|---|---|
| Sample E1 | 39.5 | 50.6 | 9.9 | Lower detection limit |
| Sample E2 | 36.2 | 50.3 | 13.5 | Lower detection limit |
| Sample E3 | 31.6 | 47.6 | 20.8 | Lower detection limit |

Table 1 shows that the silicon nitride film had a hydrogen concentration of 15 atomic % or less in each of Samples E1 and E2 including the silicon nitride film which was less likely to transmit hydrogen. Further, the flow ratio of ammonia to silane is high (specifically, the flow rate of ammonia is 10 times that of silane) as for the source gas; therefore, it was found that the silicon nitride film had a concentration of hydrogen of 20 atomic % or more in Sample E3 including the silicon nitride film releasing hydrogen.

According to the above results, it was found that the hydrogen concentration of the silicon nitride film suitable to the first nitride insulating film included in the semiconductor device that is one embodiment of the present invention, which was measured by Rutherford backscattering spectrometry, was greater than or equal to 10 atomic % and less than or equal to 15 atomic %. Further, it was shown that the hydrogen concentration of the silicon nitride film suitable to the second nitride insulating film which is included in the semiconductor device that is one embodiment of the present invention and functions as a barrier film against hydrogen, which was measured by Rutherford backscattering spectrometry, was higher than or equal to 20 atomic % and lower than or equal to 25 atomic %.

This application is based on Japanese Patent Application serial no. 2012-167614 filed with Japan Patent Office on Jul. 27, 2012, and Japanese Patent Application serial no. 2012-167615 filed with Japan Patent Office on Jul. 27, 2012, the entire contents of which are hereby incorporated by reference.

What is claimed is:

1. A semiconductor device comprising:
   a first transistor comprising a silicon semiconductor layer including a first channel formation region;
   an insulating layer comprising a first nitride insulating layer and a second nitride insulating layer over the first transistor;
   a second transistor comprising an oxide semiconductor layer including a second channel formation region over the insulating layer; and
   a third nitride insulating layer over the second transistor,
   wherein the second nitride insulating layer is between the first nitride insulating layer and the oxide semiconductor layer,
   wherein a density of the second nitride insulating layer is higher than or equal to 2.75 g/cm$^3$, and
   wherein a density of the third nitride insulating layer is higher than or equal to 2.75 g/cm$^3$.

2. The semiconductor device according to claim 1,
   wherein a refractive index of the second nitride insulating layer is higher than or equal to 1.95, and
   wherein a refractive index of the third nitride insulating layer is higher than or equal to 1.95.

3. The semiconductor device according to claim 1, wherein a hydrogen concentration of the first nitride insulating layer is higher than or equal to 20 atomic % and lower than or equal to 25 atomic %.

4. The semiconductor device according to claim 1, wherein a hydrogen concentration of the second nitride insulating layer is higher than or equal to 10 atomic % and lower than or equal to 15 atomic %.

5. The semiconductor device according to claim 1, wherein the second nitride insulating layer is in direct contact with the first nitride insulating layer.

6. The semiconductor device according to claim 1, wherein the first transistor and the second transistor each have a top-gate structure.

7. The semiconductor device according to claim 1, wherein the insulating layer further comprises an oxide insulating layer between and in contact with the first nitride insulating layer and the second nitride insulating layer.

8. The semiconductor device according to claim 1, wherein the oxide semiconductor layer comprises indium, gallium, and zinc.

9. The semiconductor device according to claim 1, wherein a hydrogen concentration of the third nitride insulating layer is higher than or equal to 10 atomic % and lower than or equal to 15 atomic %.

10. The semiconductor device according to claim 1, wherein an etching rate of the third nitride insulating layer is less than or equal to 2.0 nm/minute under a condition where etching is performed at a temperature higher than or equal to 20° C. and lower than or equal to 25° C. with the use of 0.5 wt % of hydrofluoric acid.

11. A semiconductor device comprising:
    a first transistor comprising a silicon semiconductor layer including a first channel formation region;
    an insulating layer over the first transistor, the insulating layer comprising a first nitride insulating layer, and a second nitride insulating layer over the first nitride insulating layer;
    a second transistor over the insulating layer, the second transistor comprising a first electrode, a second electrode, and an oxide semiconductor layer including a second channel formation region; and
    a third nitride insulating layer over the second transistor,
    wherein each of the first electrode and the second electrode overlaps with the second channel formation region,
    wherein the first electrode is in contact with the second nitride insulating layer,
    wherein a density of the second nitride insulating layer is higher than or equal to 2.75 g/cm$^3$, and wherein a density of the third nitride insulating layer is higher than or equal to 2.75 g/cm$^3$.

12. The semiconductor device according to claim 11, wherein a refractive index of the second nitride insulating layer is higher than or equal to 1.95, and
wherein a refractive index of the third nitride insulating layer is higher than or equal to 1.95.

13. The semiconductor device according to claim 11, wherein the oxide semiconductor layer comprises indium, gallium, and zinc.

14. The semiconductor device according to claim 11, wherein a hydrogen concentration of the second nitride insulating layer is higher than or equal to 10 atomic % and lower than or equal to 15 atomic %.

15. The semiconductor device according to claim 11, wherein an etching rate of the third nitride insulating layer is less than or equal to 2.0 nm/minute under a condition where etching is performed at a temperature higher than or equal to 20° C. and lower than or equal to 25° C. with the use of 0.5 wt % of hydrofluoric acid.

16. A semiconductor device comprising:
a first transistor comprising a silicon semiconductor layer including a first channel formation region;
an insulating layer over the first transistor, the insulating layer comprising a first nitride insulating layer, and a second nitride insulating layer over and in contact with the first nitride insulating layer;
a second transistor over the insulating layer, the second transistor comprising a first electrode, a second electrode, and an oxide semiconductor layer including a second channel formation region; and
a third nitride insulating layer over the second transistor,
wherein each of the first electrode and the second electrode overlaps with the second channel formation region,
wherein the first electrode is in contact with the first nitride insulating layer,
wherein a density of the second nitride insulating layer is higher than or equal to 2.75 g/cm$^3$, and
wherein a density of the third nitride insulating layer is higher than or equal to 2.75 g/cm$^3$.

17. The semiconductor device according to claim 16, wherein a refractive index of the second nitride insulating layer is higher than or equal to 1.95, and
wherein a refractive index of the third nitride insulating layer is higher than or equal to 1.95.

18. The semiconductor device according to claim 16, wherein a hydrogen concentration of the second nitride insulating layer is higher than or equal to 10 atomic % and lower than or equal to 15 atomic %.

19. The semiconductor device according to claim 16, wherein an etching rate of the third nitride insulating layer is less than or equal to 2.0 nm/minute under a condition where etching is performed at a temperature higher than or equal to 20° C. and lower than or equal to 25° C. with the use of 0.5 wt % of hydrofluoric acid.

* * * * *